(12) United States Patent
Morisaki

(10) Patent No.: US 9,177,800 B2
(45) Date of Patent: Nov. 3, 2015

(54) METHOD FOR MANUFACTURING SEMICONDUCTOR DEVICE AND SEMICONDUCTOR DEVICE

(71) Applicant: FUJITSU SEMICONDUCTOR LIMITED, Yokohama-shi, Kanagawa (JP)

(72) Inventor: Yusuke Morisaki, Kokubunji (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/282,513

(22) Filed: May 20, 2014

(65) Prior Publication Data

US 2014/0367754 A1 Dec. 18, 2014

(30) Foreign Application Priority Data

Jun. 12, 2013 (JP) ................................. 2013-124095

(51) Int. Cl.
| | | |
|---|---|---|
| H01L 21/84 | (2006.01) | |
| H01L 21/265 | (2006.01) | |
| H01L 29/78 | (2006.01) | |
| H01L 21/283 | (2006.01) | |

(52) U.S. Cl.
CPC ............ *H01L 21/265* (2013.01); *H01L 21/283* (2013.01); *H01L 29/78* (2013.01)

(58) Field of Classification Search
CPC ..... H01L 21/265; H01L 21/283; H01L 29/78; H01L 27/088; H01L 29/4232; H01L 29/775
USPC ........... 257/288, 368, 369; 438/151, 197, 199
See application file for complete search history.

(56) References Cited

U.S. PATENT DOCUMENTS

| | | | |
|---|---|---|---|
| 6,649,472 B1 * | 11/2003 | Hsieh ............................ | 438/257 |
| 2005/0282342 A1 | 12/2005 | Adan | |
| 2007/0093015 A1 | 4/2007 | Kudo et al. | |
| 2009/0152618 A1 * | 6/2009 | Matsuo et al. ................ | 257/324 |
| 2009/0173980 A1 * | 7/2009 | Cheng et al. .................. | 257/301 |
| 2009/0181517 A1 * | 7/2009 | Kim et al. ..................... | 438/430 |
| 2013/0087855 A1 * | 4/2013 | Makiyama et al. ........... | 257/350 |
| 2014/0252428 A1 * | 9/2014 | Chang et al. .................. | 257/288 |

FOREIGN PATENT DOCUMENTS

| | | |
|---|---|---|
| JP | 2006-12924 A | 1/2006 |
| JP | 2007-123431 A | 5/2007 |

* cited by examiner

*Primary Examiner* — Jarrett Stark
*Assistant Examiner* — Shahed Ahmed
(74) *Attorney, Agent, or Firm* — Westerman, Hattori, Daniels & Adrian, LLP

(57) ABSTRACT

A method for manufacturing a semiconductor device includes, forming, on a substrate, an element isolation insulating film which includes a protruding portion protruding above a level of a surface of the substrate, forming a first film on the substrate and on the element isolation insulating film, polishing the first film to expose the protruding portion, forming a first resist pattern which straddles the first film and the protruding portion after polishing the first film, patterning the first film using the first resist pattern as a mask to form a first pattern, and forming a sidewall film at side surfaces of the first pattern.

6 Claims, 84 Drawing Sheets

METHOD FOR MANUFACTURING SEMICONDUCTOR DEVICE AND SEMICONDUCTOR DEVICE

CROSS-REFERENCE TO RELATED APPLICATIONS

This application is based upon and claims the benefit of prior Japanese Patent Application No. 2013-124095 filed on Jun. 12, 2013, the entire contents of which are incorporated herein by reference.

FIELD

Embodiments herein relate to a method for manufacturing a semiconductor device and a semiconductor device.

BACKGROUND

Semiconductor devices, such as LSIs (Large Scale Integration), have recently been requested to have a higher speed and a higher degree of integration. To respond to the request, gate electrodes to be formed on a substrate have been miniaturized. There is known a technique related to a Fin type transistor which is a type of fine transistor.

[Patent document 1] Japanese Laid-open Patent Publication No. 2006-12924

[Patent document 2] Japanese Laid-open Patent Publication No. 2007-123431

SUMMARY

According to an aspect of the embodiments, a method for manufacturing a semiconductor device includes, forming, on a substrate, an element isolation insulating film which includes a protruding portion protruding above a level of a surface of the substrate, forming a first film on the substrate and on the element isolation insulating film, polishing the first film to expose the protruding portion, forming a first resist pattern which straddles the first film and the protruding portion after polishing the first film, patterning the first film using the first resist pattern as a mask to form a first pattern, and forming a sidewall film at side surfaces of the first pattern.

The object and advantages of the embodiments will be realized and attained by means of the elements and combinations particularly pointed out in the claims. It is to be understood that both the foregoing general description and the following detailed description are exemplary and explanatory and are not restrictive of the embodiments, as claimed.

BRIEF DESCRIPTION OF THE DRAWINGS

FIG. 39B is a cross-sectional view illustrating the method for manufacturing the semiconductor device according to the second embodiment and illustrates a cross-section taken along alternate long and short dash line A-B in FIG. 39A;

FIG. 39C is a cross-sectional view illustrating the method for manufacturing the semiconductor device according to the second embodiment and illustrates a cross-section taken along alternate long and short dash line E-F in FIG. 39A;

FIG. 40A is a plan view illustrating the method for manufacturing the semiconductor device according to the second embodiment;

FIG. 40B is a cross-sectional view illustrating the method for manufacturing the semiconductor device according to the second embodiment and illustrates a cross-section taken along alternate long and short dash line A-B in FIG. 40A;

FIG. 40C is a cross-sectional view illustrating the method for manufacturing the semiconductor device according to the second embodiment and illustrates a cross-section taken along alternate long and short dash line G-H in FIG. 40A;

FIG. 41A is a plan view illustrating the method for manufacturing the semiconductor device according to the second embodiment;

FIG. 41B is a cross-sectional view illustrating the method for manufacturing the semiconductor device according to the second embodiment and illustrates a cross-section taken along alternate long and short dash line A-B in FIG. 41A;

FIG. 41C is a cross-sectional view illustrating the method for manufacturing the semiconductor device according to the second embodiment and illustrates a cross-section taken along alternate long and short dash line E-F in FIG. 41A;

FIG. 42A is a plan view illustrating the method for manufacturing the semiconductor device according to the second embodiment;

FIG. 42B is a cross-sectional view illustrating the method for manufacturing the semiconductor device according to the second embodiment and illustrates a cross-section taken along alternate long and short dash line A-B in FIG. 42A;

FIG. 42C is a cross-sectional view illustrating the method for manufacturing the semiconductor device according to the second embodiment and illustrates a cross-section taken along alternate long and short dash line E-F in FIG. 42A;

FIG. 43A is a plan view illustrating the method for manufacturing the semiconductor device according to the second embodiment;

Figure 43A:
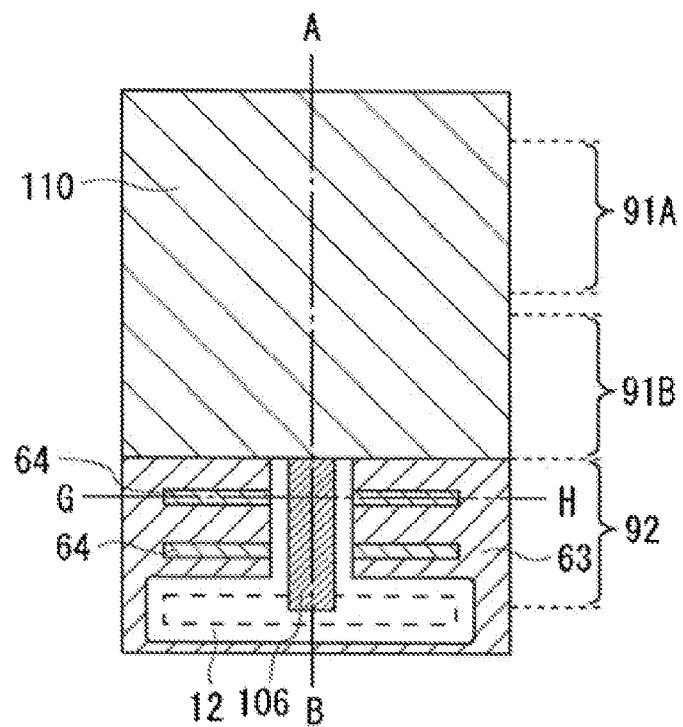
Figure 43B:
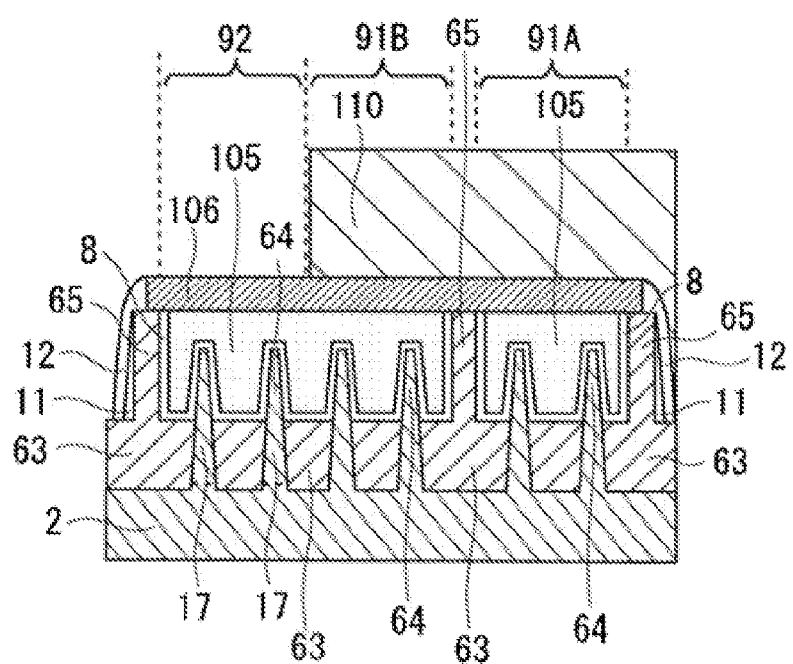
Figure 43C:
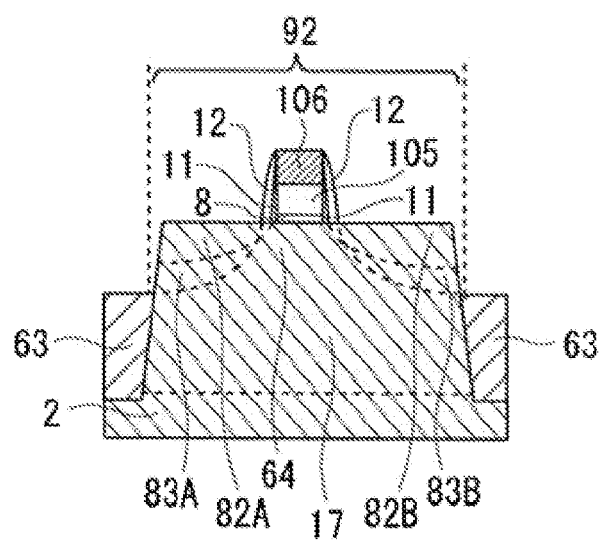
Figure 44A:
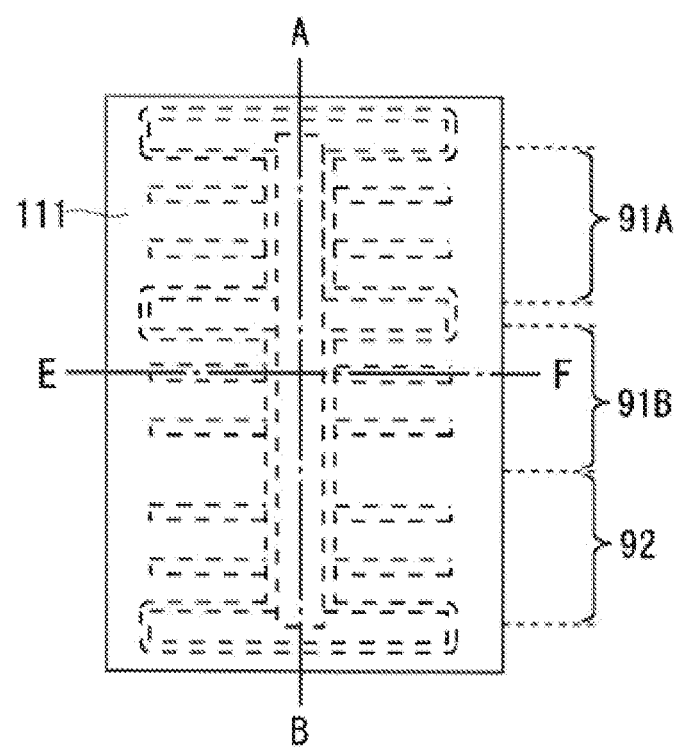
Figure 44B:
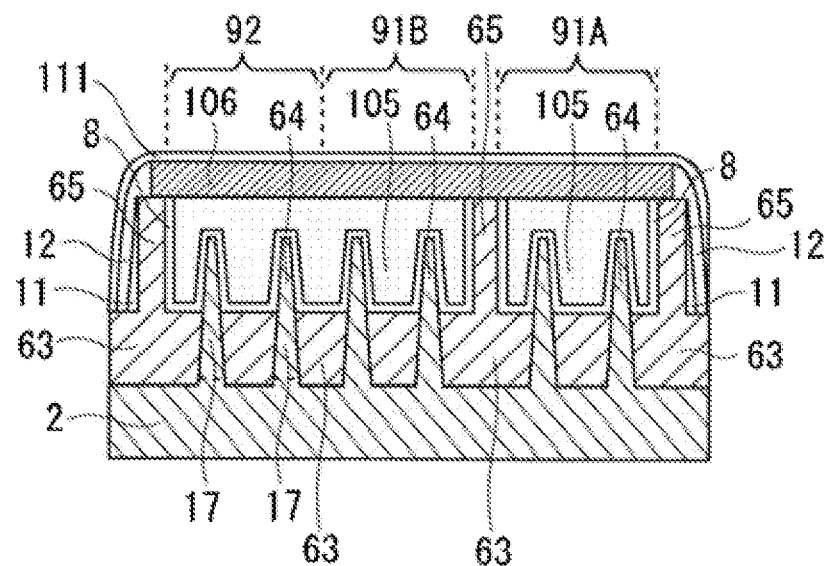
Figure 44C:
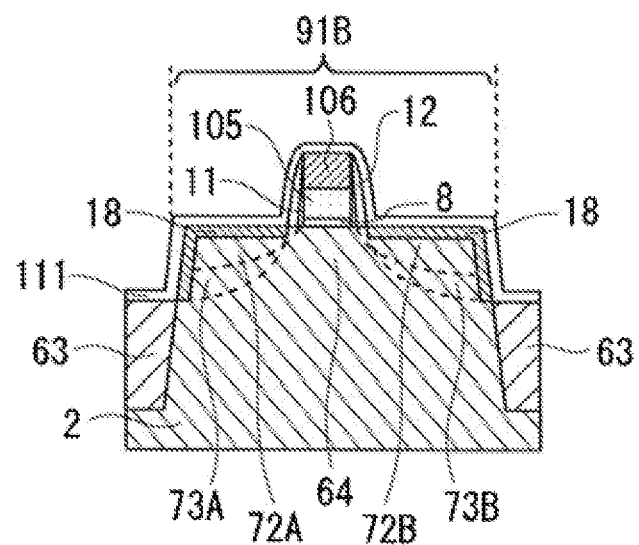
Figure 45A:
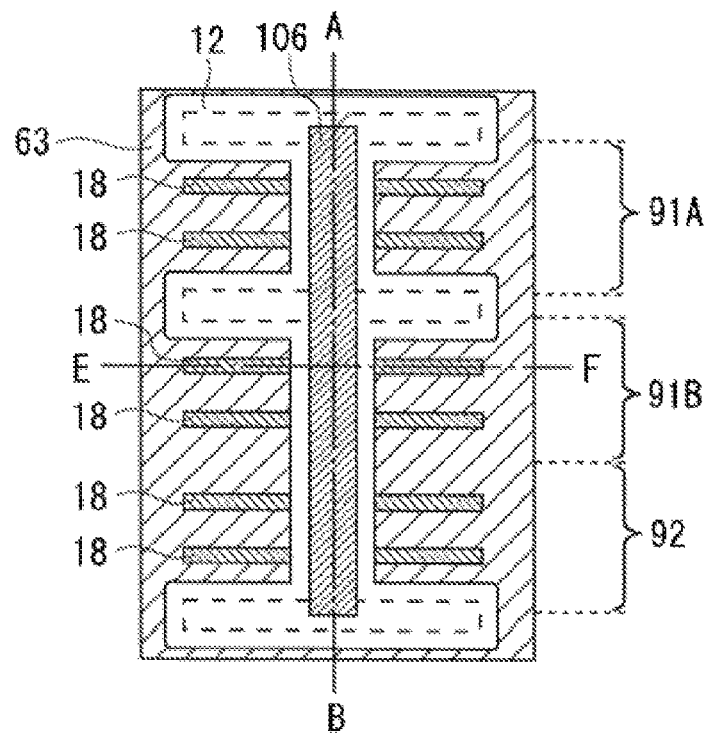
Figure 45B:
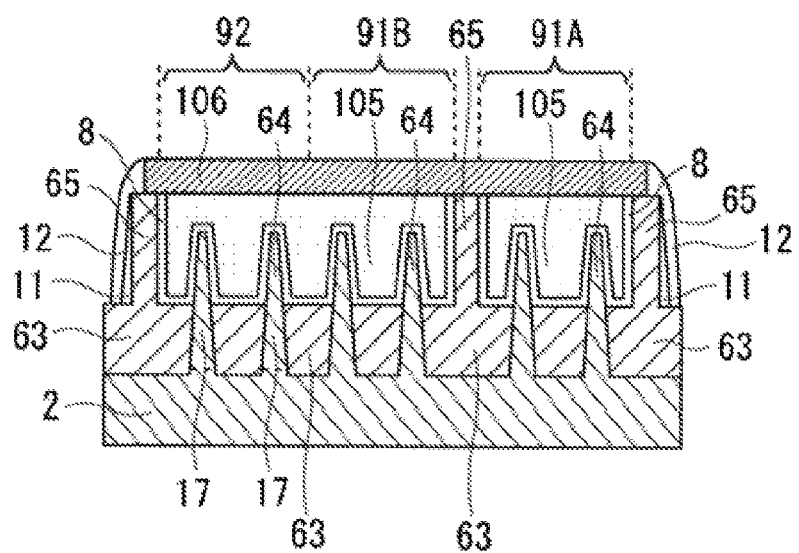
Figure 45C:
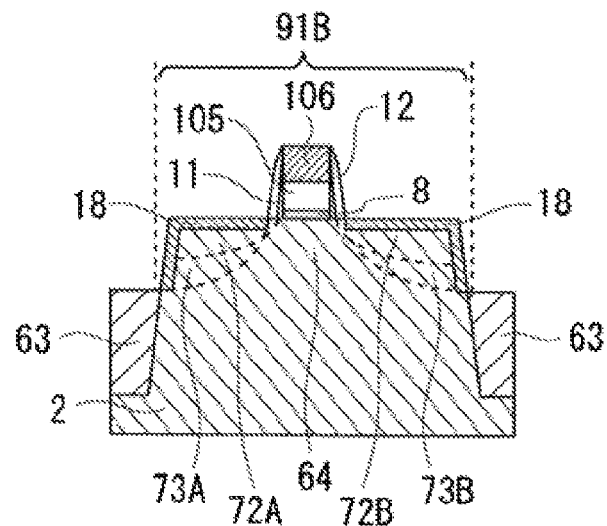
Figure 46A:
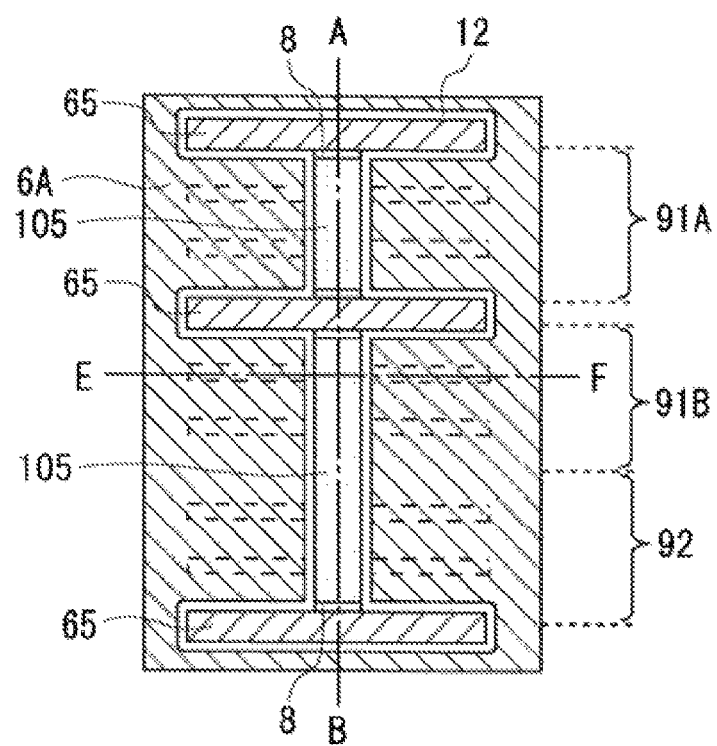
Figure 46B:
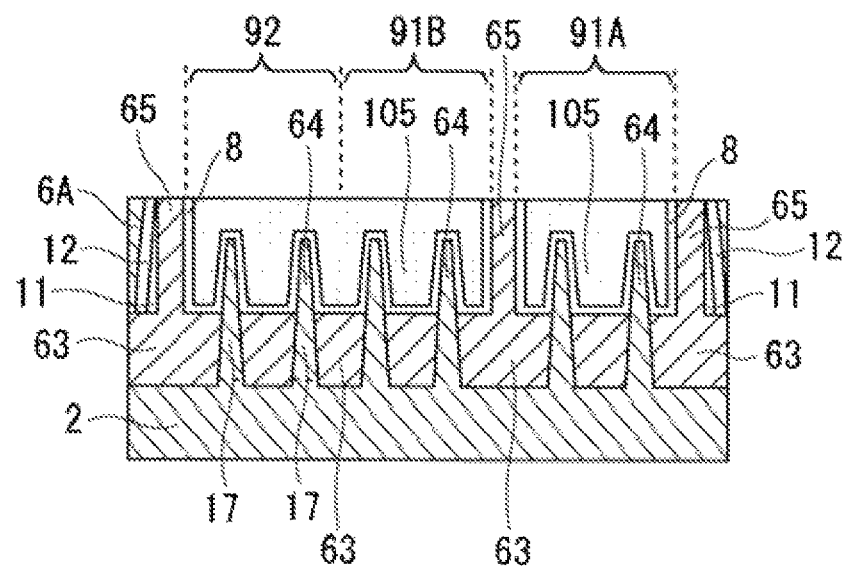
Figure 46C:
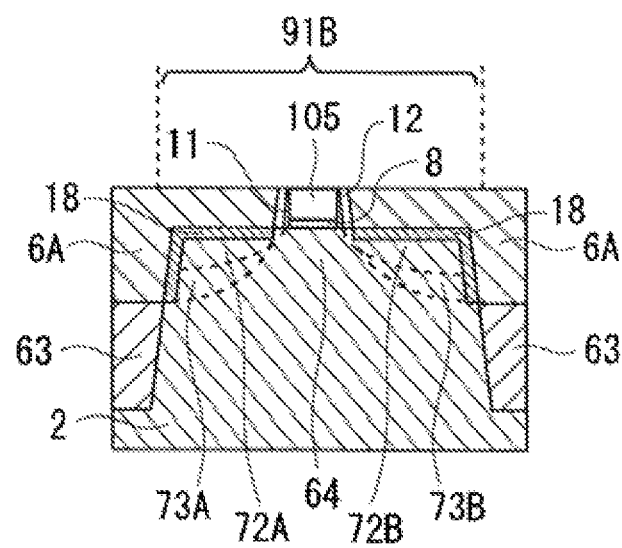
Figure 47A:
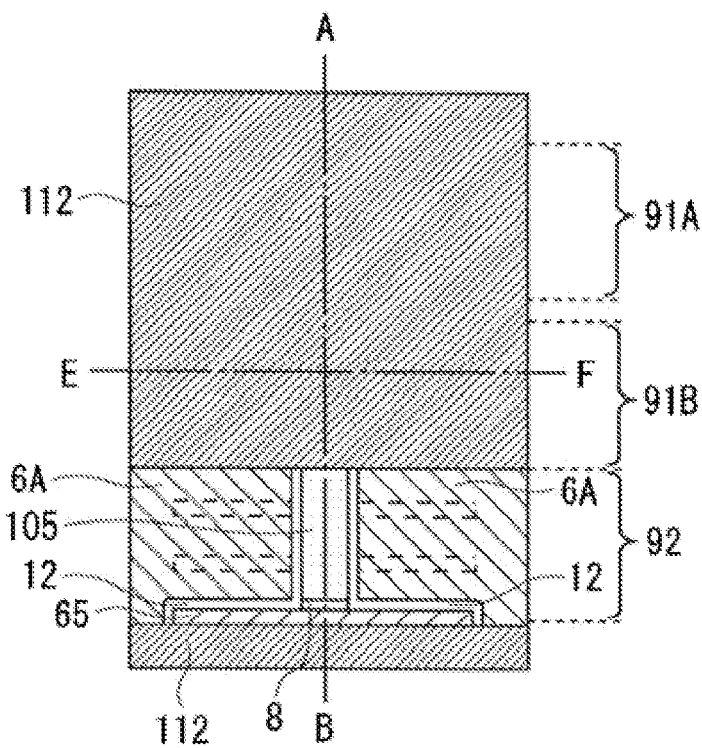
Figure 47B:
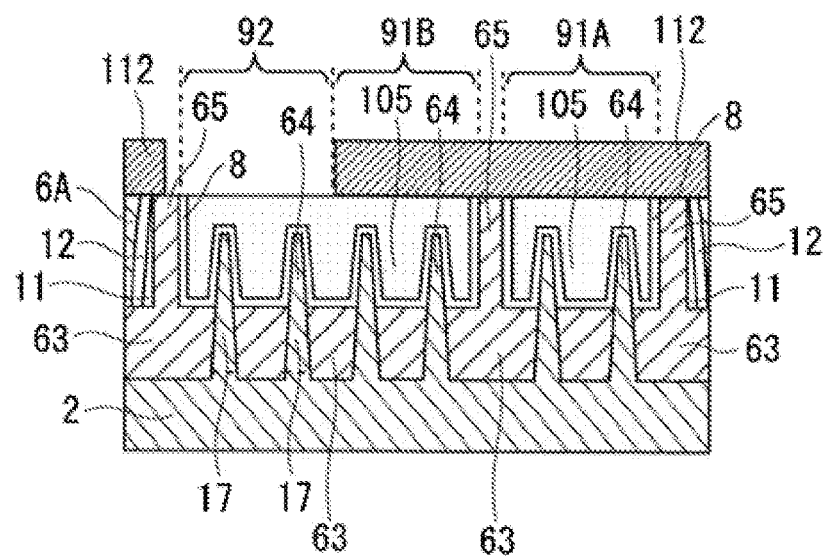
Figure 47C:
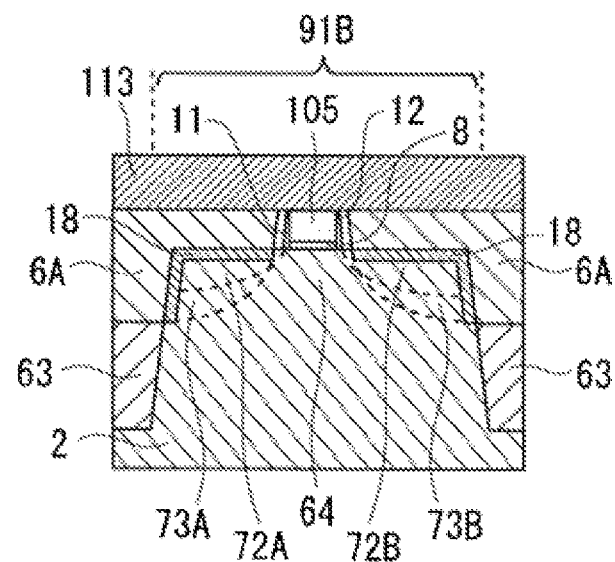
Figure 48A:
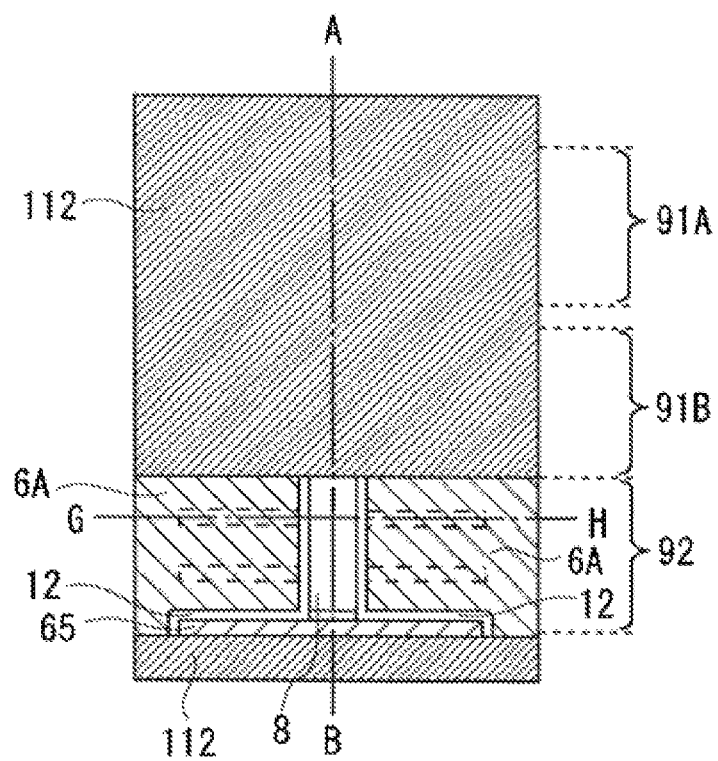
Figure 48B:
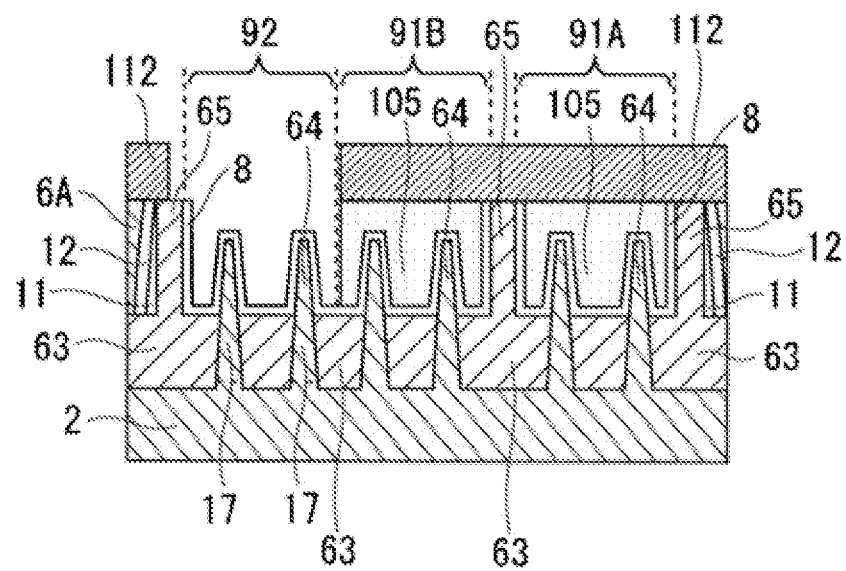
Figure 48C:
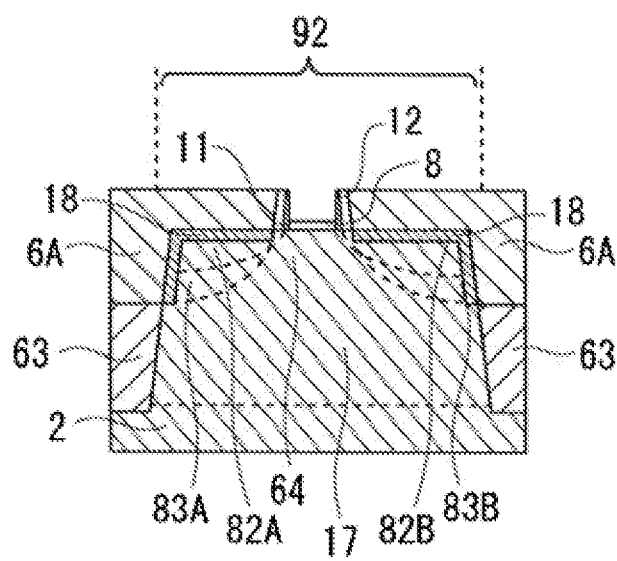
Figure 49A:
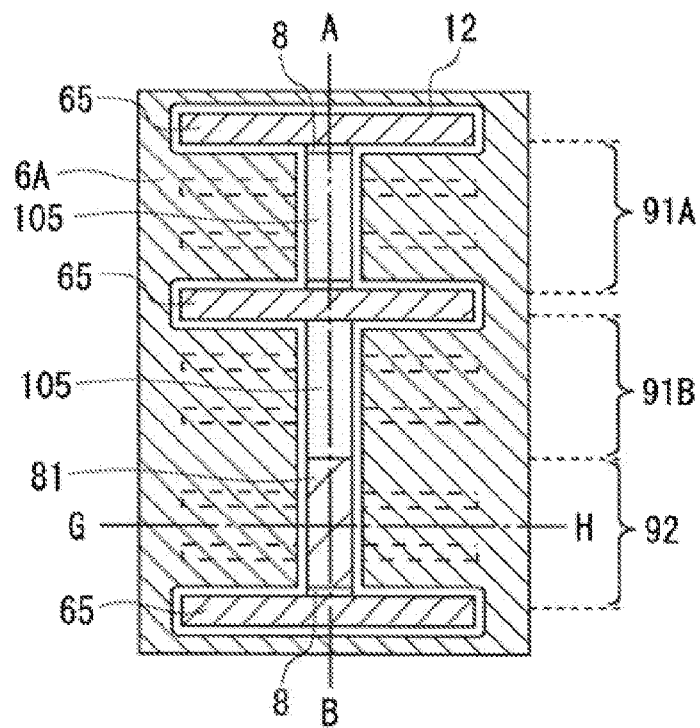
Figure 49B:
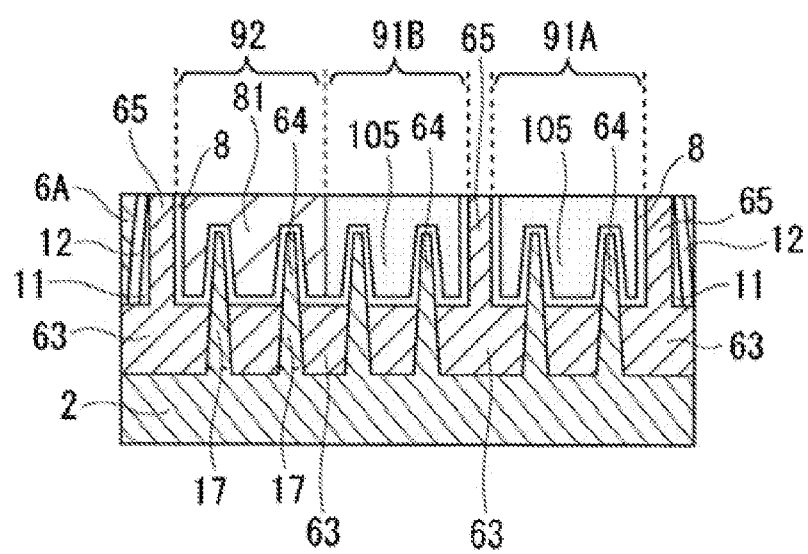
Figure 49C:
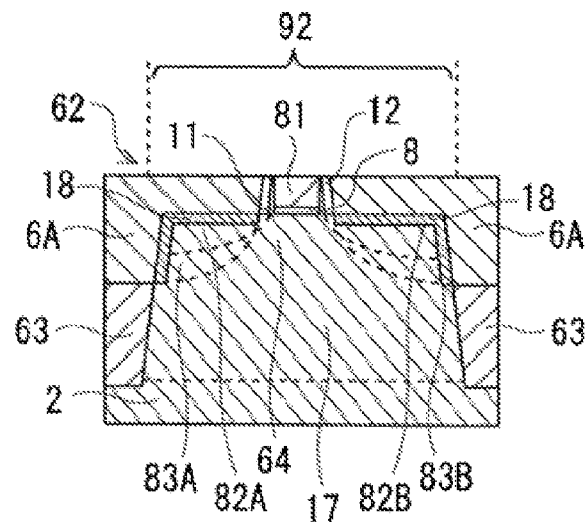
Figure 50A:
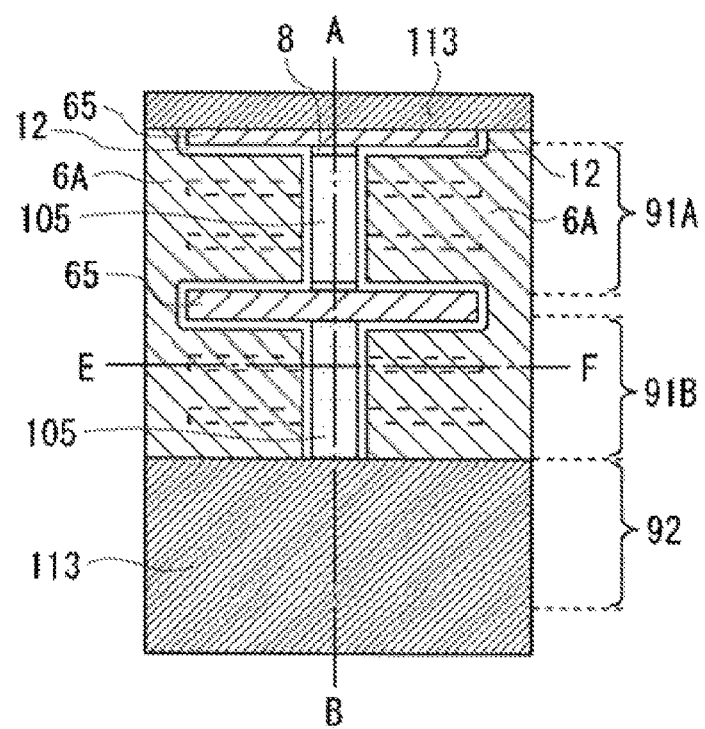
Figure 50B:
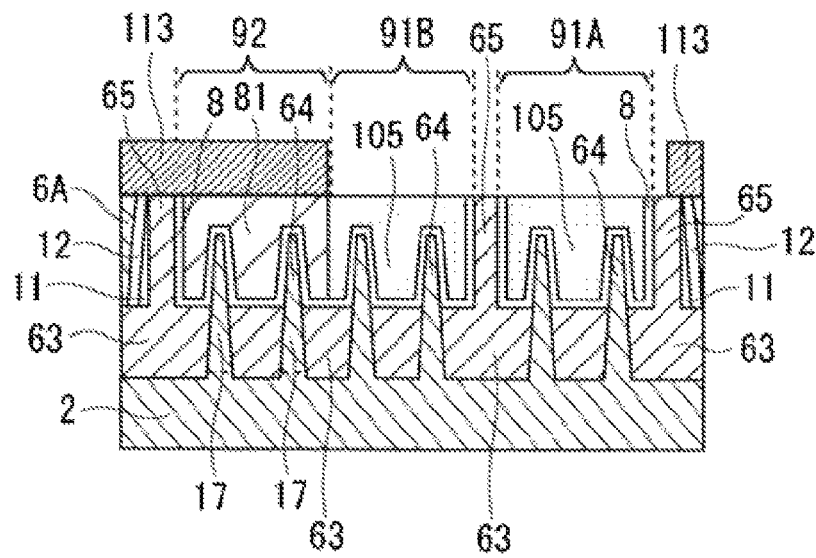
Figure 50C:
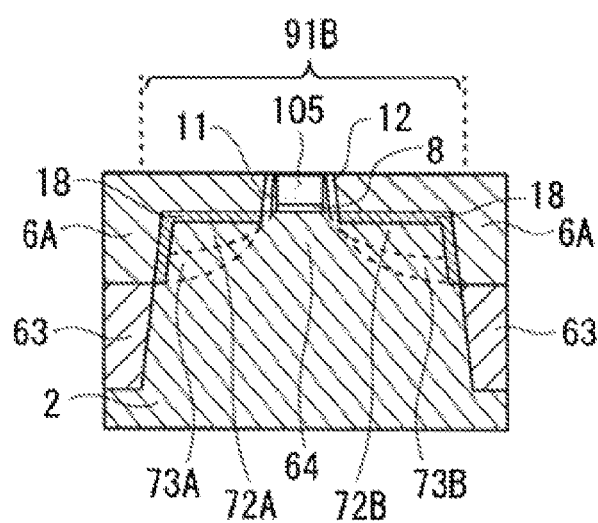
Figure 51A:
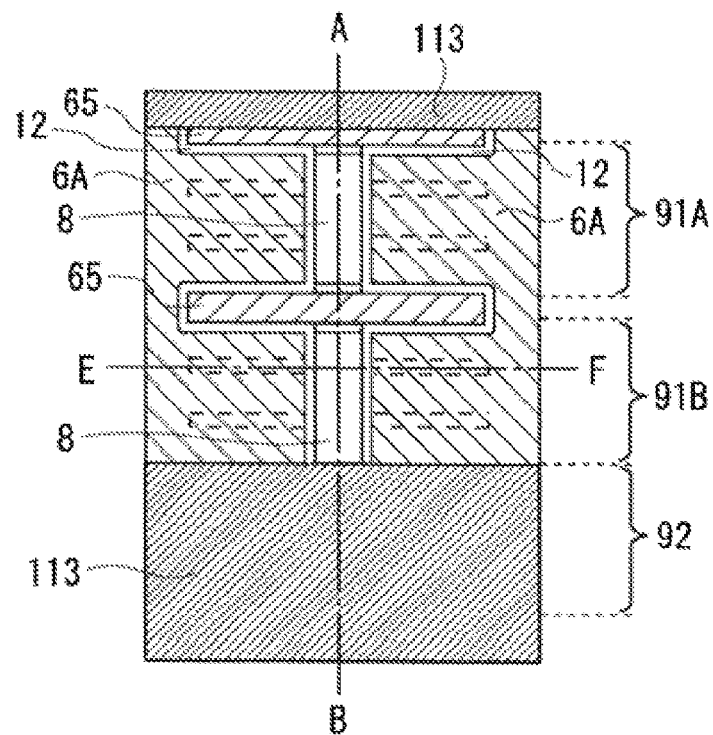
Figure 51B:
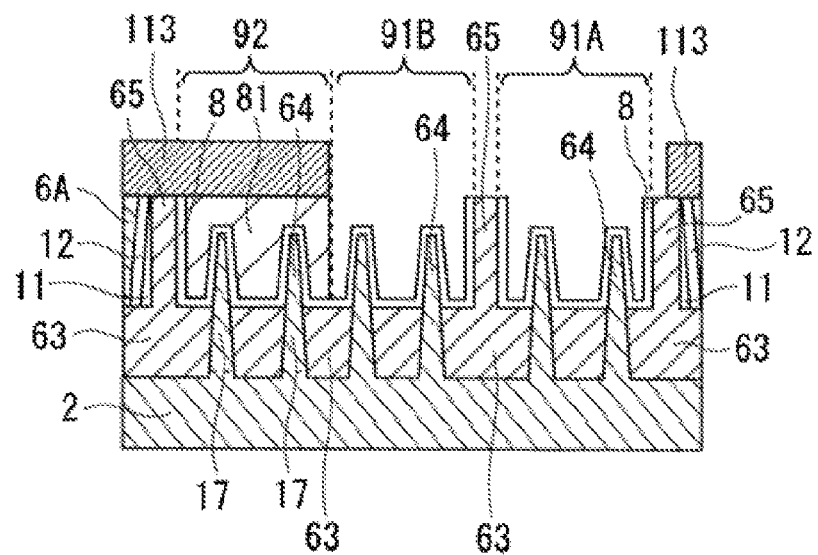
Figure 51C:
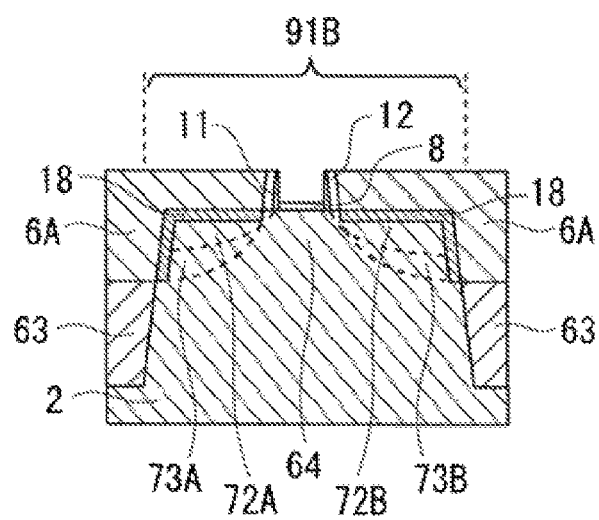
Figure 52A:
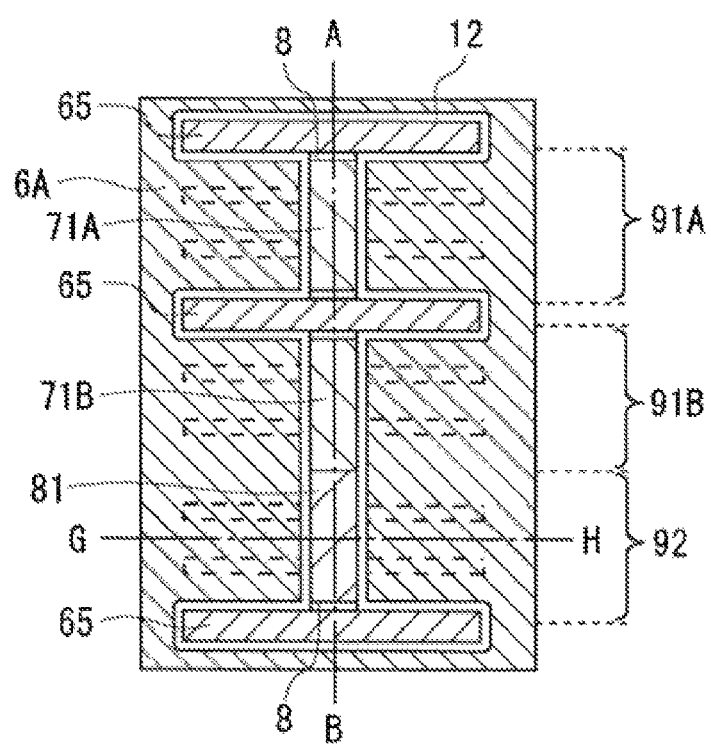
Figure 52B:
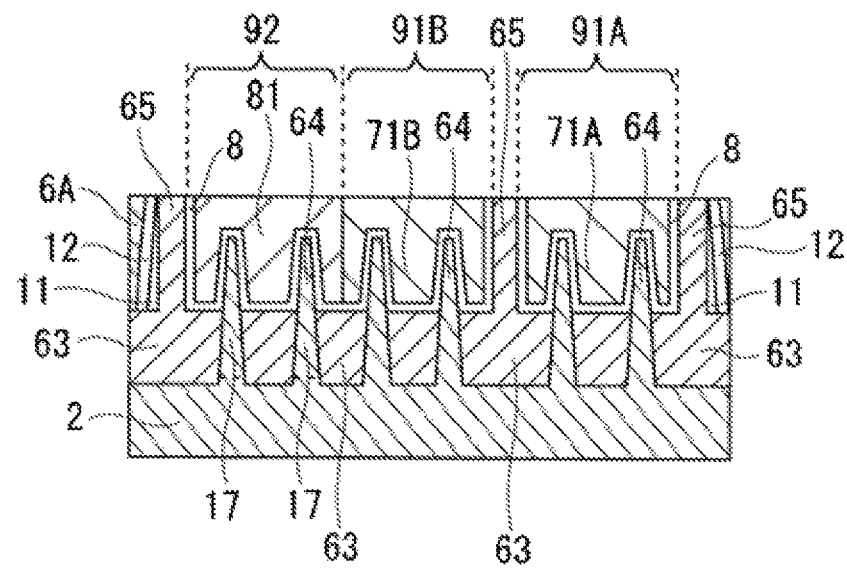
Figure 52C:
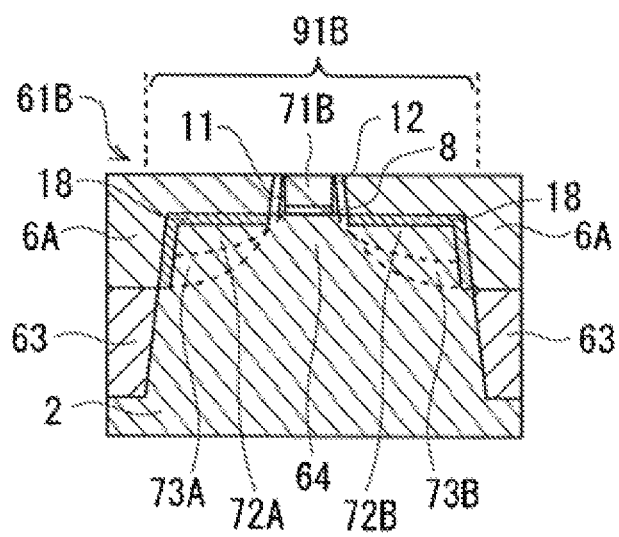
Figure 53A:
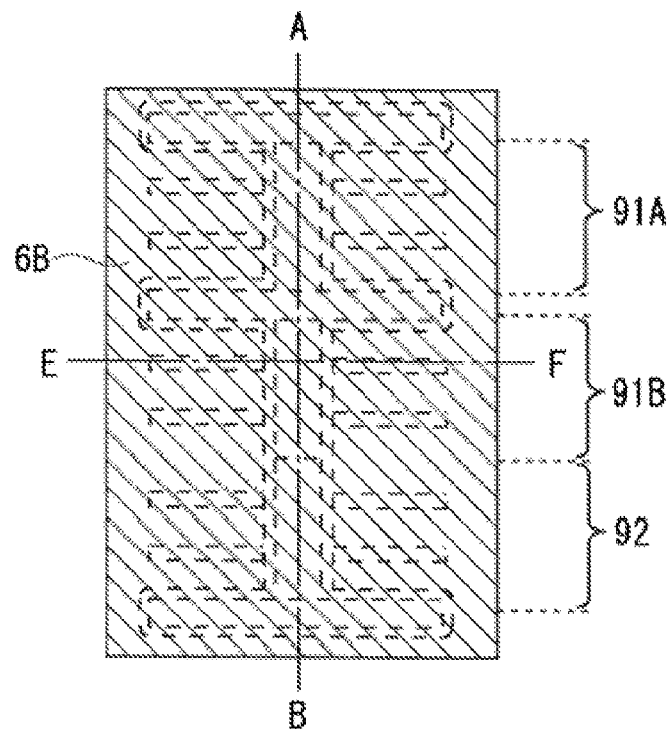
Figure 53B:
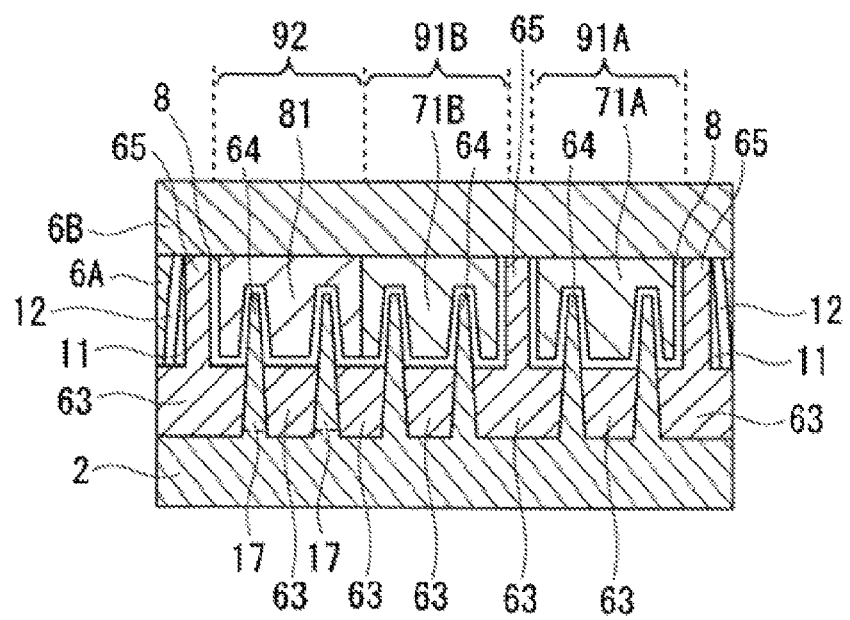
Figure 53C:
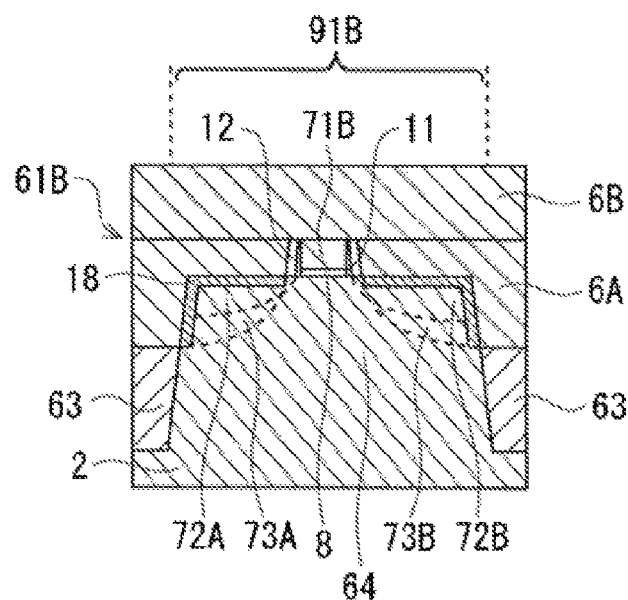
Figure 54A:
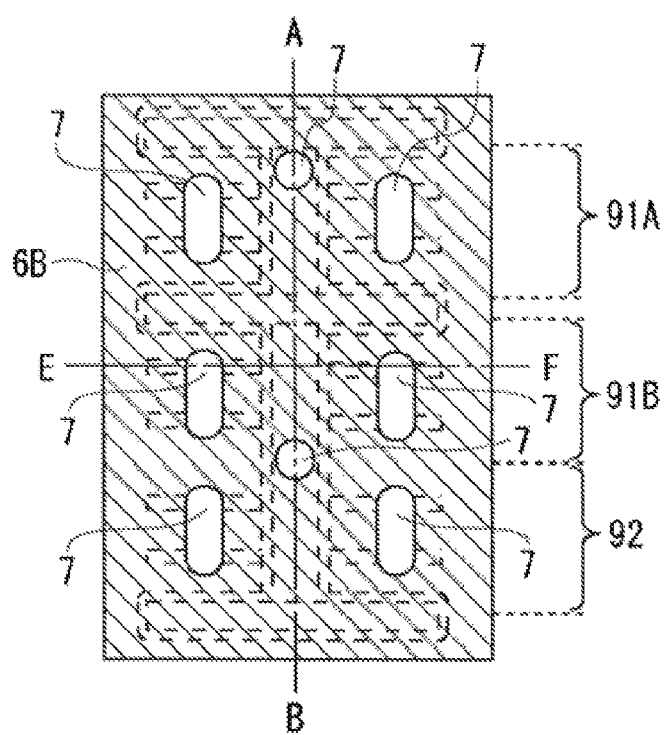
Figure 54B:
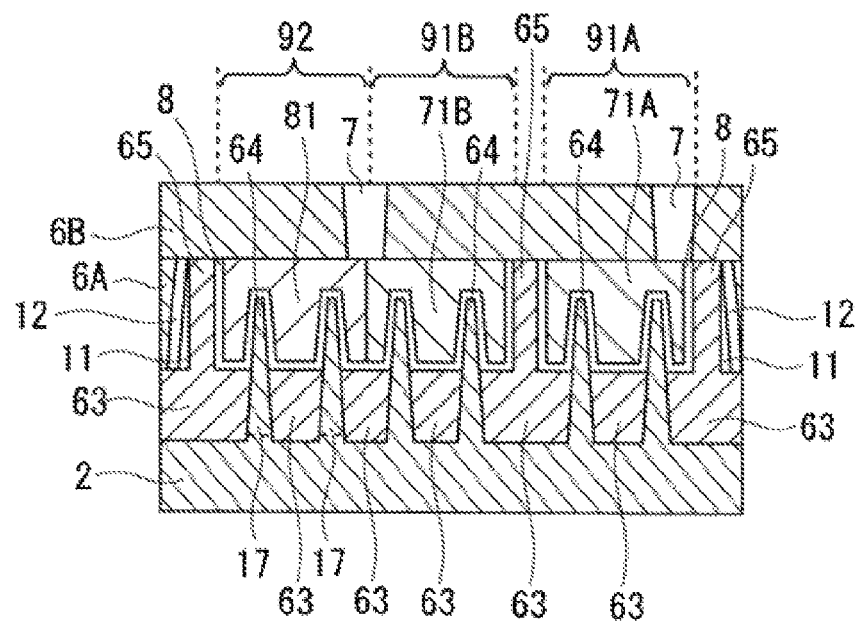
Figure 54C:
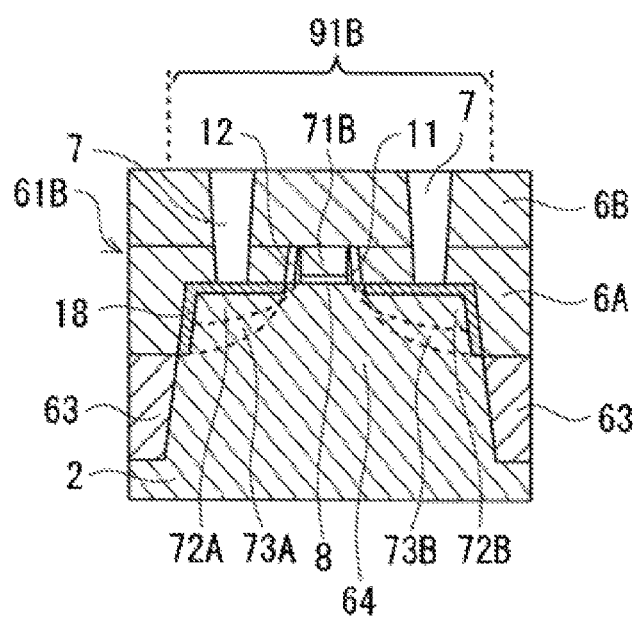
Figure 55:
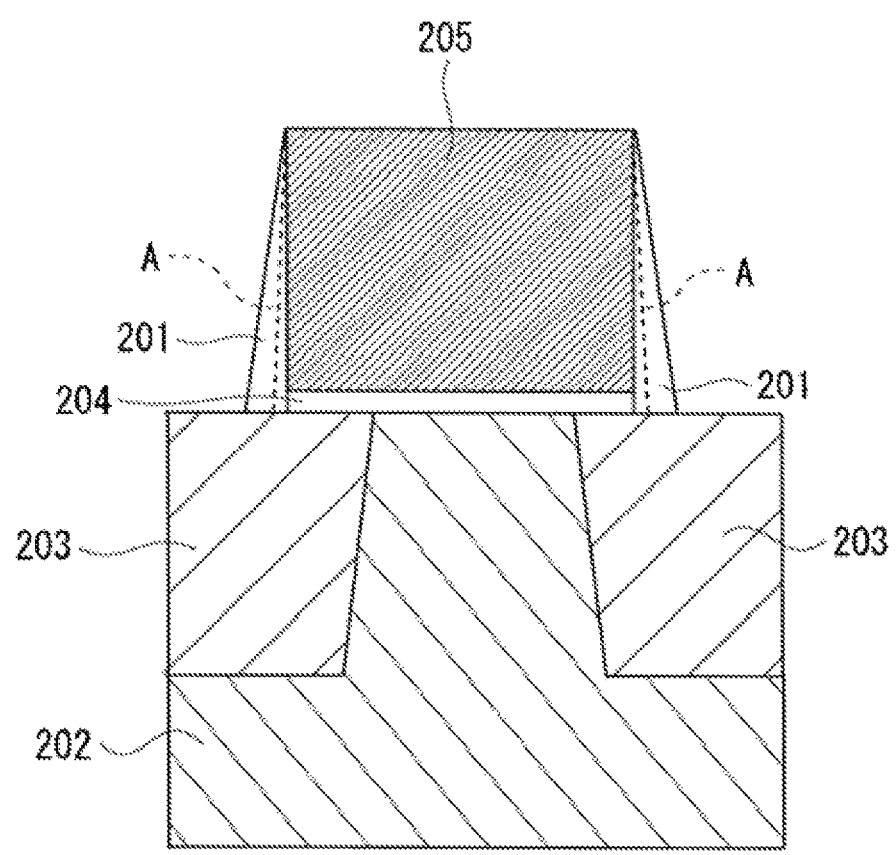

FIG. 43B is a cross-sectional view illustrating the method for manufacturing the semiconductor device according to the second embodiment and illustrates a cross-section taken along alternate long and short dash line A-B in FIG. 43A;

FIG. 43C is a cross-sectional view illustrating the method for manufacturing the semiconductor device according to the second embodiment and illustrates a cross-section taken along alternate long and short dash line G-H in FIG. 43A;

FIG. 44A is a plan view illustrating the method for manufacturing the semiconductor device according to the second embodiment;

FIG. 44B is a cross-sectional view illustrating the method for manufacturing the semiconductor device according to the second embodiment and illustrates a cross-section taken along alternate long and short dash line A-B in FIG. 44A;

FIG. 44C is a cross-sectional view illustrating the method for manufacturing the semiconductor device according to the second embodiment and illustrates a cross-section taken along alternate long and short dash line E-F in FIG. 44A;

FIG. 45A is a plan view illustrating the method for manufacturing the semiconductor device according to the second embodiment;

FIG. 45B is a cross-sectional view illustrating the method for manufacturing the semiconductor device according to the second embodiment and illustrates a cross-section taken along alternate long and short dash line A-B in FIG. 45A;

FIG. 45C is a cross-sectional view illustrating the method for manufacturing the semiconductor device according to the second embodiment and illustrates a cross-section taken along alternate long and short dash line E-F in FIG. 45A;

FIG. 46A is a plan view illustrating the method for manufacturing the semiconductor device according to the second embodiment;

FIG. 46B is a cross-sectional view illustrating the method for manufacturing the semiconductor device according to the second embodiment and illustrates a cross-section taken along alternate long and short dash line A-B in FIG. 46A;

FIG. 46C is a cross-sectional view illustrating the method for manufacturing the semiconductor device according to the second embodiment and illustrates a cross-section taken along alternate long and short dash line E-F in FIG. 46A;

FIG. 47A is a plan view illustrating the method for manufacturing the semiconductor device according to the second embodiment;

FIG. 47B is a cross-sectional view illustrating the method for manufacturing the semiconductor device according to the second embodiment and illustrates a cross-section taken along alternate long and short dash line A-B in FIG. 47A;

FIG. 47C is a cross-sectional view illustrating the method for manufacturing the semiconductor device according to the second embodiment and illustrates a cross-section taken along alternate long and short dash line E-F in FIG. 47A;

FIG. 48A is a plan view illustrating the method for manufacturing the semiconductor device according to the second embodiment;

FIG. 48B is a cross-sectional view illustrating the method for manufacturing the semiconductor device according to the second embodiment and illustrates a cross-section taken along alternate long and short dash line A-B in FIG. 48A;

FIG. 48C is a cross-sectional view illustrating the method for manufacturing the semiconductor device according to the second embodiment and illustrates a cross-section taken along alternate long and short dash line G-H in FIG. 48A;

FIG. 49A is a plan view illustrating the method for manufacturing the semiconductor device according to the second embodiment;

FIG. 49B is a cross-sectional view illustrating the method for manufacturing the semiconductor device according to the second embodiment and illustrates a cross-section taken along alternate long and short dash line A-B in FIG. 49A;

FIG. 49C is a cross-sectional view illustrating the method for manufacturing the semiconductor device according to the second embodiment and illustrates a cross-section taken along alternate long and short dash line G-H in FIG. 49A;

FIG. 50A is a plan view illustrating the method for manufacturing the semiconductor device according to the second embodiment;

FIG. 50B is a cross-sectional view illustrating the method for manufacturing the semiconductor device according to the second embodiment and illustrates a cross-section taken along alternate long and short dash line A-B in FIG. 50A;

FIG. 50C is a cross-sectional view illustrating the method for manufacturing the semiconductor device according to the second embodiment and illustrates a cross-section taken along alternate long and short dash line E-F in FIG. 50A;

FIG. 51A is a plan view illustrating the method for manufacturing the semiconductor device according to the second embodiment;

FIG. 51B is a cross-sectional view illustrating the method for manufacturing the semiconductor device according to the second embodiment and illustrates a cross-section taken along alternate long and short dash line A-B in FIG. 51A;

FIG. 51C is a cross-sectional view illustrating the method for manufacturing the semiconductor device according to the second embodiment and illustrates a cross-section taken along alternate long and short dash line E-F in FIG. 51A;

FIG. 52A is a plan view illustrating the method for manufacturing the semiconductor device according to the second embodiment;

FIG. 52B is a cross-sectional view illustrating the method for manufacturing the semiconductor device according to the second embodiment and illustrates a cross-section taken along alternate long and short dash line A-B in FIG. 52A;

FIG. 52C is a cross-sectional view illustrating the method for manufacturing the semiconductor device according to the second embodiment and illustrates a cross-section taken along alternate long and short dash line G-H in FIG. 52A;

FIG. 53A is a plan view illustrating the method for manufacturing the semiconductor device according to the second embodiment;

FIG. 53B is a cross-sectional view illustrating the method for manufacturing the semiconductor device according to the second embodiment and illustrates a cross-section taken along alternate long and short dash line A-B in FIG. 53A;

FIG. 53C is a cross-sectional view illustrating the method for manufacturing the semiconductor device according to the second embodiment and illustrates a cross-section taken along alternate long and short dash line E-F in FIG. 53A;

FIG. 54A is a plan view illustrating the method for manufacturing the semiconductor device according to the second embodiment;

FIG. 54B is a cross-sectional view illustrating the method for manufacturing the semiconductor device according to the second embodiment and illustrates a cross-section taken along alternate long and short dash line A-B in FIG. 54A;

FIG. 54C is a cross-sectional view illustrating the method for manufacturing the semiconductor device according to the second embodiment and illustrates a cross-section taken along alternate long and short dash line E-F in FIG. 54A; and FIG. 55 is a cross-sectional view of a semiconductor device.

DESCRIPTION OF EMBODIMENTS

As gate electrodes become finer, a corner at an end of a gate electrode may be rounded due to etching at the time of gate electrode formation. When a corner at an end of a gate electrode is rounded, a sidewall film formed at a side surface of the end of the gate electrode is likely to be thinned. For example, when a sidewall film 201 is thinned to a level indicated by a dotted line A, as illustrated in FIG. 55, a defect, such as disappearance of a portion of the sidewall film 201 or perforation of the sidewall film 201, may occur in the sidewall film 201. Referring to FIG. 55, reference numeral 202 denotes a substrate; 203, an element isolation film; 204, a gate insulating film; and 205, a gate electrode. Due to, e.g., chemical solution treatment at the time of resist exfoliation or chemical solution treatment at the time of substrate cleaning, a chemical solution infiltrates from the defect in the sidewall film into below the gate electrode, and the gate insulating film formed between the substrate and the gate electrode is exposed to the chemical solution. The exposure of the gate insulating film to the chemical solution degrades the gate insulating film.

Methods for manufacturing a semiconductor device and semiconductor devices according to the embodiments will be described below with reference to the drawings. The configurations below of a first embodiment and a second embodiment are merely illustrative, and methods for manufacturing a semiconductor device and semiconductor devices according to the embodiments are not limited to the configurations of the first embodiment and the second embodiment.

First Embodiment

A method for manufacturing a semiconductor device 1 and the semiconductor device 1 according to a first embodiment will be described with reference to FIGS. 1A to 27C. The first embodiment will be described in the context of the semiconductor device 1 including a MOS (Metal Oxide Semiconductor) transistor which is an example of a semiconductor element.

Figure 1A:
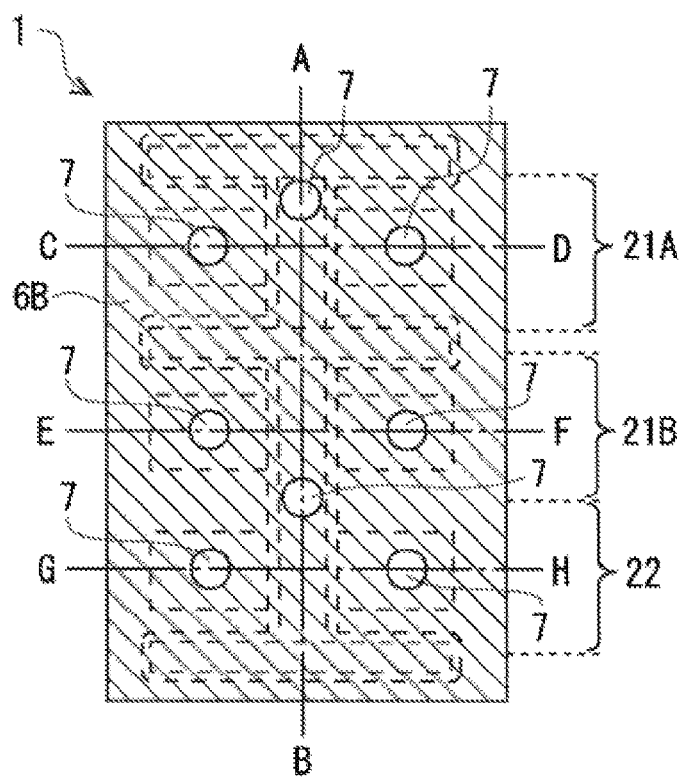
FIG. 1A is a plan view illustrating a semiconductor device according to a first embodiment.
Figure 1B:
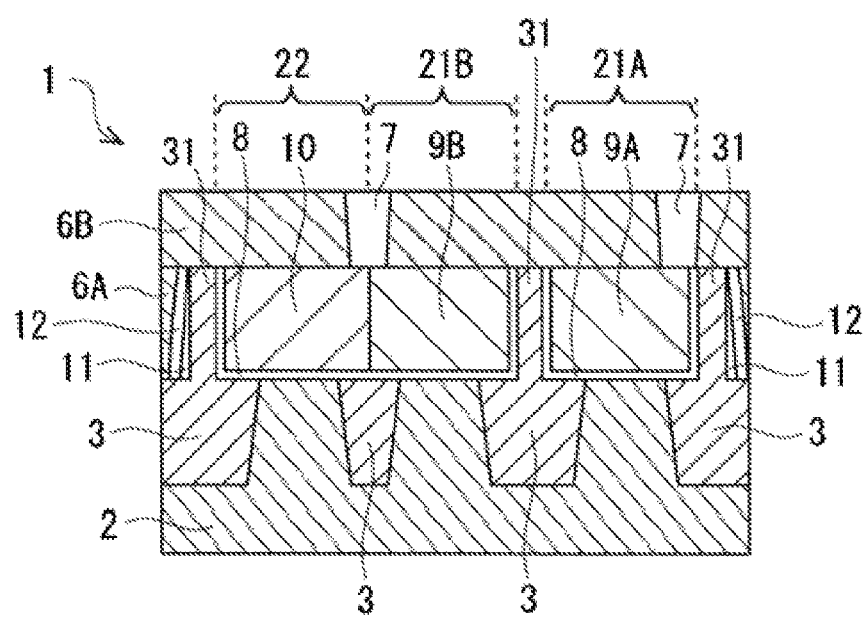
FIG. 1B is a cross-sectional view of the semiconductor device according to the first embodiment and illustrates a cross-section taken along alternate long and short dash line A-B in FIG. 1A.
Figure 1C:
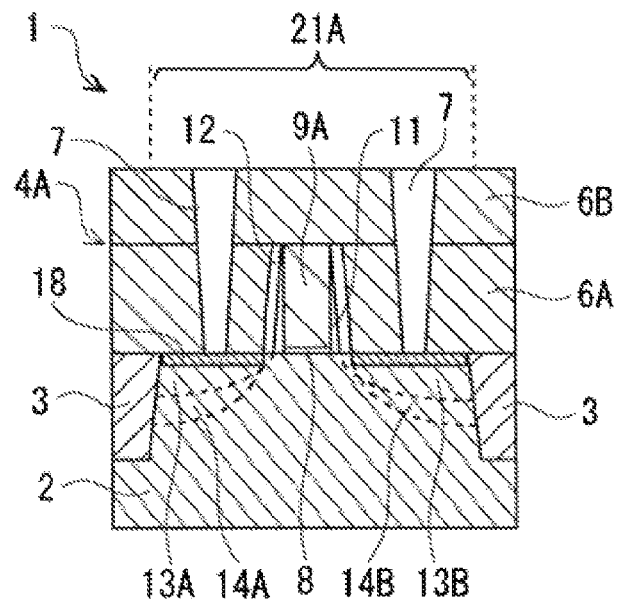
FIG. 1C is a cross-sectional view of the semiconductor device according to the first embodiment and illustrates a cross-section taken along alternate long and short dash line C-D in FIG. 1A.
Figure 1D:
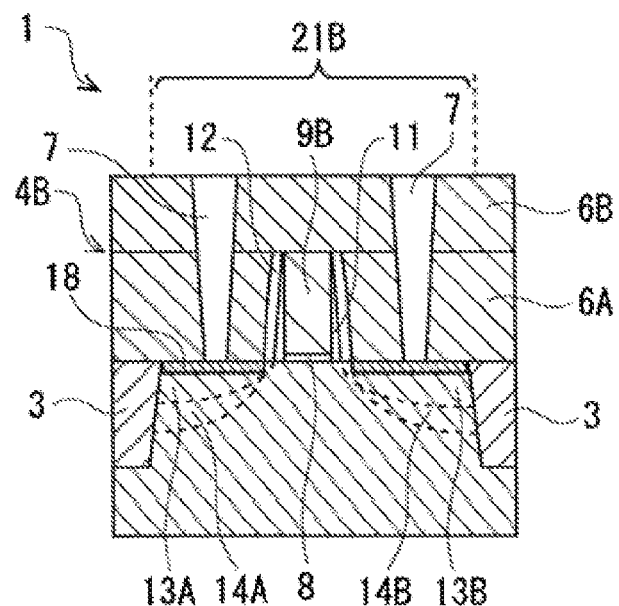
FIG. 1D is a cross-sectional view of the semiconductor device according to the first embodiment and illustrates a cross-section taken along alternate long and short dash line E-F in FIG. 1A.
Figure 1E:
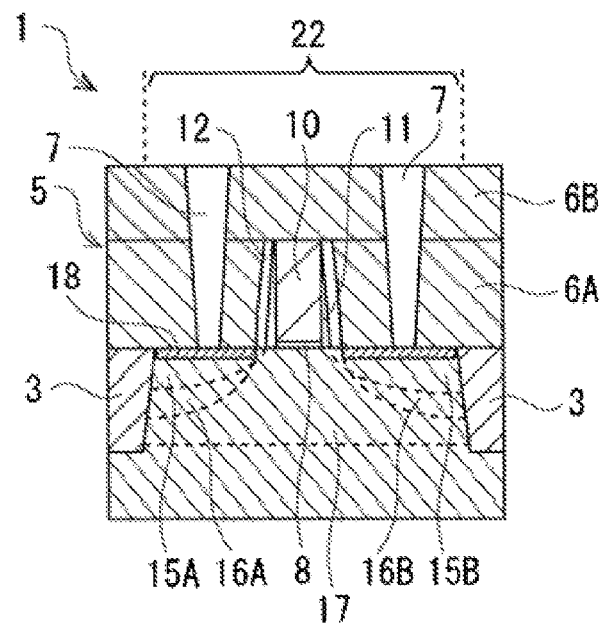
FIG. 1E is a cross-sectional view of the semiconductor device according to the first embodiment and illustrates a cross-section taken along alternate long and short dash line G-H in FIG. 1A.

FIG. 1A is a plan view illustrating the semiconductor device 1 according to the first embodiment. FIG. 1B is a cross-sectional view of the semiconductor device 1 according to the first embodiment and illustrates a cross-section taken along alternate long and short dash line A-B in FIG. 1A. FIG. 1C is a cross-sectional view of the semiconductor device 1 according to the first embodiment and illustrates a cross-section taken along alternate long and short dash line C-D in FIG. 1A. FIG. 1D is a cross-sectional view of the semiconductor device 1 according to the first embodiment and illustrates a cross-section taken along alternate long and short dash line E-F in FIG. 1A. FIG. 1E is a cross-sectional view of the semiconductor device 1 according to the first embodiment and illustrates a cross-section taken along alternate long and short dash line G-H in FIG. 1A.

The semiconductor device 1 includes a semiconductor substrate 2, an element isolation insulating film 3, n-type MOS transistors 4A and 4B, a p-type MOS transistor 5, interlayer insulating films 6A and 6B, and contact plugs 7. The interlayer insulating film 6A is formed on the semiconductor substrate 2 and element isolation insulating film 3. The semiconductor substrate 2 is an example of a substrate. The interlayer insulating film 6B is formed on the interlayer insulating film 6A. The contact plugs 7 are formed in the interlayer insulating films 6A and 6B. The semiconductor substrate 2 is, for example, a silicon (Si) substrate.

The n-type MOS transistor 4A is provided in an n-type MOS transistor formation region 21A which is demarcated by the element isolation insulating film 3. The n-type MOS transistor 4A includes a gate insulating film 8, a gate electrode 9A, a first sidewall insulating film 11, a second sidewall insulating film 12, LDD (Lightly Doped Drain) regions 13A and 13B, and source-drain regions 14A and 14B. The gate insulating film 8 is formed on the semiconductor substrate 2. The gate electrode 9A is formed on the gate insulating film 8. The LDD regions 13A and 13B and the source-drain regions 14A and 14B are formed in an active region of the semiconductor substrate 2 in the n-type MOS transistor formation region 21A. The first sidewall insulating film 11 and the second sidewall insulating film 12 are formed at side surfaces of the gate electrode 9A in a gate length direction of the gate electrode 9A. The first sidewall insulating film 11 and the second sidewall insulating film 12 are examples of a sidewall film. The gate length direction of the gate electrode 9A refers to a direction from the source-drain region 14A toward the source-drain region 14B and a direction from the source-drain region 14B toward the source-drain region 14A. In FIG. 1B, the LDD regions 13A and 13B and the source-drain regions 14A and 14B are not illustrated.

The n-type MOS transistor 4B is provided in an n-type MOS transistor formation region 21B which is demarcated by the element isolation insulating film 3. The n-type MOS transistor 4B includes the gate insulating film 8, a gate electrode 9B, the first sidewall insulating film 11, the second sidewall insulating film 12, the LDD regions 13A and 13B, and the source-drain regions 14A and 14B. The gate electrode 9B is formed on the gate insulating film 8. The LDD regions 13A and 13B and the source-drain regions 14A and 14B are formed in an active region of the semiconductor substrate 2 in the n-type MOS transistor formation region 21B. The first sidewall insulating film 11 and the second sidewall insulating film 12 are formed at side surfaces of the gate electrode 9B in a gate length direction of the gate electrode 9B. The gate length direction of the gate electrode 9B refers to a direction from the source-drain region 14A toward the source-drain region 14B and a direction from the source-drain region 14B toward the source-drain region 14A. In FIG. 1B, the LDD regions 13A and 13B and the source-drain regions 14A and 14B are not illustrated.

The p-type MOS transistor 5 is provided in a p-type MOS transistor formation region 22 which is demarcated by the element isolation insulating film 3. The p-type MOS transistor 5 includes the gate insulating film 8, a gate electrode 10, the first sidewall insulating film 11, the second sidewall insulating film 12, LDD regions 15A and 15B, and source-drain regions 16A and 16B. A well region 17 is formed in the semiconductor substrate 2 in the p-type MOS transistor formation region 22. The gate electrode 10 is formed on the gate insulating film 8. The LDD regions 15A and 15B and the source-drain regions 16A and 16B are formed in an active region of the semiconductor substrate 2 in the p-type MOS transistor formation region 22. The first sidewall insulating film 11 and the second sidewall insulating film 12 are formed at side surfaces of the gate electrode 10 in a gate length direction of the gate electrode 10. The gate length direction of the gate electrode 10 refers to a direction from the source-drain region 16A toward the source-drain region 16B and a direction from the source-drain region 16B toward the source-drain region 16A. In FIG. 1B, the LDD regions 15A and 15B and the source-drain regions 16A and 16B are not illustrated.

Silicides 18 are formed at a surface of the semiconductor substrate 2 in the n-type MOS transistor formation regions 21A and 21B and the p-type MOS transistor formation region 22. The contact plugs 7 are formed on the gate electrodes 9A, 9B, and 10 and on the silicides 18. The element isolation insulating film 3 includes protruding portions 31 which protrude above the level of the surface of the semiconductor substrate 2. The level of each protruding portion 31 of the element isolation insulating film 3 is higher than the level of the surface of the semiconductor substrate 2. The protruding portion 31 of the element isolation insulating film 3 is thinner than a portion below the protruding portion 31 of the element isolation insulating film 3. Thus, the gate electrodes 9A, 9B, and 10 are formed above the active regions of the semiconductor substrate 2 and above the element isolation insulating film 3.

The gate electrode 9A formed above the active region of the semiconductor substrate 2 extends in a gate width direction of the gate electrode 9A, and ends of the gate electrode 9A are located above the element isolation insulating film 3. The gate width direction of the gate electrode 9A is a direction crossing the gate length direction of the gate electrode 9A. Since the ends of the gate electrode 9A are located above the element isolation insulating film 3, a gate width of the gate electrode 9A increases. The protruding portions 31 are provided at the element isolation insulating film 3 so as to cover side surfaces of the gate electrode 9A in the gate width direction of the gate electrode 9A.

The gate electrode 9B formed above the active region of the semiconductor substrate 2 extends in a gate width direction of the gate electrode 9B, and ends of the gate electrode 9B are located above the element isolation insulating film 3. The gate width direction of the gate electrode 9B is a direction crossing the gate length direction of the gate electrode 9B. Since the ends of the gate electrode 9B are located above the element isolation insulating film 3, a gate width of the gate electrode 9B increases. The protruding portion 31 is provided at the element isolation insulating film 3 so as to cover a first side surface of the gate electrode 9B in the gate width direction of the gate electrode 9B. The gate width direction of the gate electrode 9B is a direction crossing the gate length direction of the gate electrode 9B.

The gate electrode 10 formed above the active region of the semiconductor substrate 2 extends in a gate width direction of the gate electrode 10, and ends of the gate electrode 10 are located above the element isolation insulating film 3. The gate width direction of the gate electrode 10 is a direction crossing the gate length direction of the gate electrode 10. Since the ends of the gate electrode 10 are located above the element isolation insulating film 3, a gate width of the gate electrode 10 increases. The protruding portion 31 is provided at the element isolation insulating film 3 so as to cover a first side surface of the gate electrode 10 in the gate width direction of the gate electrode 10.

A second side surface of the gate electrode 9B in the gate width direction of the gate electrode 9B and a second side surface of the gate electrode 10 in the gate width direction of the gate electrode 10 are connected. That is, the gate electrode 9B and the gate electrode 10 are integrally formed. Since the gate electrode 9B and the gate electrode 10 are integrally formed, the common contact plug 7 is connected to the gate electrode 9B and the gate electrode 10. Note that the gate electrode 9B and the gate electrode 10 may be separated. When the gate electrode 9B and the gate electrode 10 are separated, the protruding portion 31 is provided at the element isolation insulating film 3 between the gate electrode 9B and the gate electrode 10.

Figure 2A:
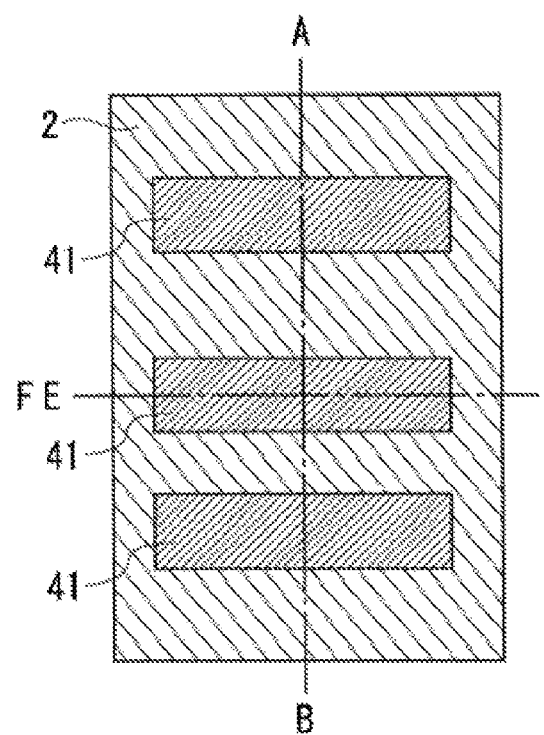
FIG. 2A is a plan view illustrating a method for manufacturing the semiconductor device according to the first embodiment.
Figure 2B:
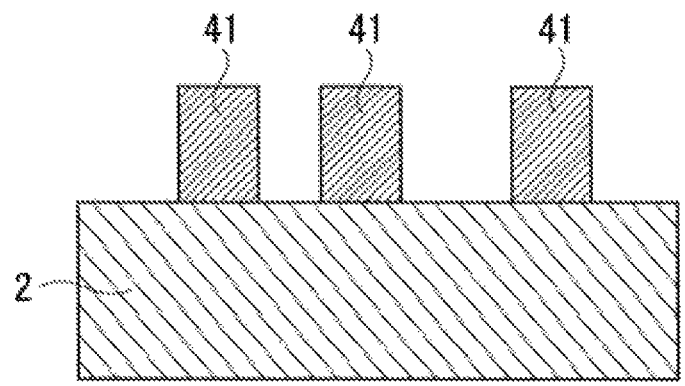
FIG. 2B is a cross-sectional view illustrating the method for manufacturing the semiconductor device according to the first embodiment and illustrates a cross-section taken along alternate long and short dash line A-B in FIG. 2A.
Figure 2C:
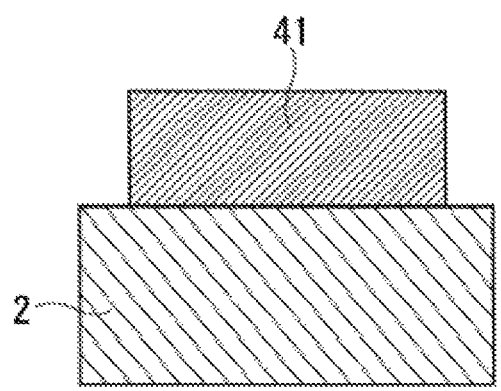
FIG. 2C is a cross-sectional view illustrating the method for manufacturing the semiconductor device according to the first embodiment and illustrates a cross-section taken along alternate long and short dash line E-F in FIG. 2A.

The method for manufacturing the semiconductor device 1 according to the first embodiment will be described. FIG. 2A is a plan view illustrating the method for manufacturing the semiconductor device 1 according to the first embodiment. FIG. 2B is a cross-sectional view illustrating the method for manufacturing the semiconductor device 1 according to the first embodiment and illustrates a cross-section taken along alternate long and short dash line A-B in FIG. 2A. FIG. 2C is a cross-sectional view illustrating the method for manufacturing the semiconductor device 1 according to the first embodiment and illustrates a cross-section taken along alternate long and short dash line E-F in FIG. 2A.

In a step illustrated in FIGS. 2A to 2C, a hard mask 41 is formed on the semiconductor substrate 2 by, for example, CVD (Chemical Vapor Deposition) method. The hard mask 41 is, for example, a SiN film (silicon nitride film). The thickness (height) of the hard mask 41 is, for example, not less than 70 nm and not more than 150 nm. A resist pattern is then formed on the hard mask 41 by photolithography. After that, the hard mask 41 is patterned by performing anisotropic dry etching, such as RIE (Reactive Ion Etching), using the resist pattern on the hard mask 41 as a mask. Moreover, the resist pattern on the hard mask 41 is removed by wet treatment using, e.g., a SPM (Sulfuric Acid Hydrogen Peroxide Mixture) solution or ashing. The SPM solution is a liquid mixture of sulfuric acid and aqueous hydrogen peroxide.

Figure 3A:
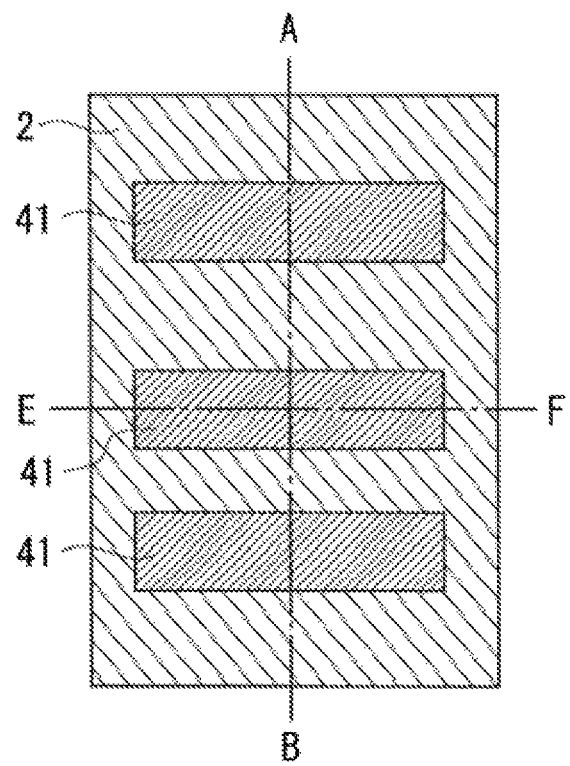
FIG. 3A is a plan view illustrating the method for manufacturing the semiconductor device according to the first embodiment.
Figure 3B:
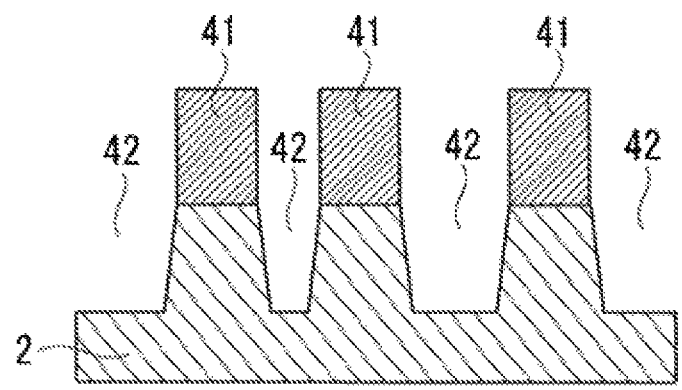
FIG. 3B is a cross-sectional view illustrating the method for manufacturing the semiconductor device according to the first embodiment and illustrates a cross-section taken along alternate long and short dash line A-B in FIG. 3A.
Figure 3C:
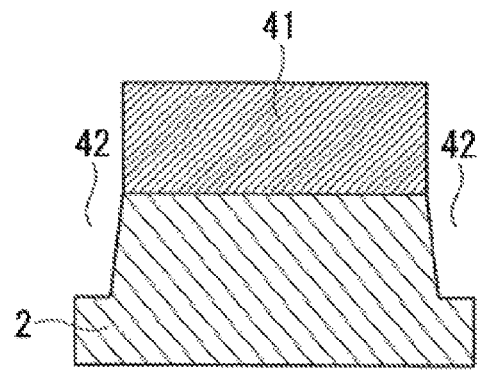
FIG. 3C is a cross-sectional view illustrating the method for manufacturing the semiconductor device according to the first embodiment and illustrates a cross-section taken along alternate long and short dash line E-F in FIG. 3A.

FIG. 3A is a plan view illustrating the method for manufacturing the semiconductor device 1 according to the first embodiment. FIG. 3B is a cross-sectional view illustrating the method for manufacturing the semiconductor device 1 according to the first embodiment and illustrates a cross-section taken along alternate long and short dash line A-B in FIG. 3A. FIG. 3C is a cross-sectional view illustrating the method for manufacturing the semiconductor device 1 according to the first embodiment and illustrates a cross-section taken along alternate long and short dash line E-F in FIG. 3A. In a step illustrated in FIGS. 3A to 3C, trenches 42 are formed in the semiconductor substrate 2 by performing anisotropic dry etching, such as RIE, using the hard masks 41 formed on the semiconductor substrate 2 as a mask.

Figure 4A:
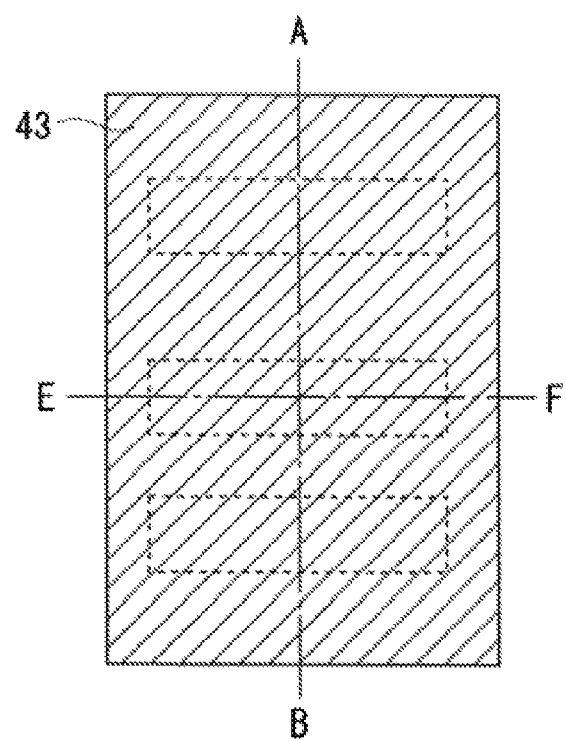
FIG. 4A is a plan view illustrating the method for manufacturing the semiconductor device according to the first embodiment.
Figure 4B:
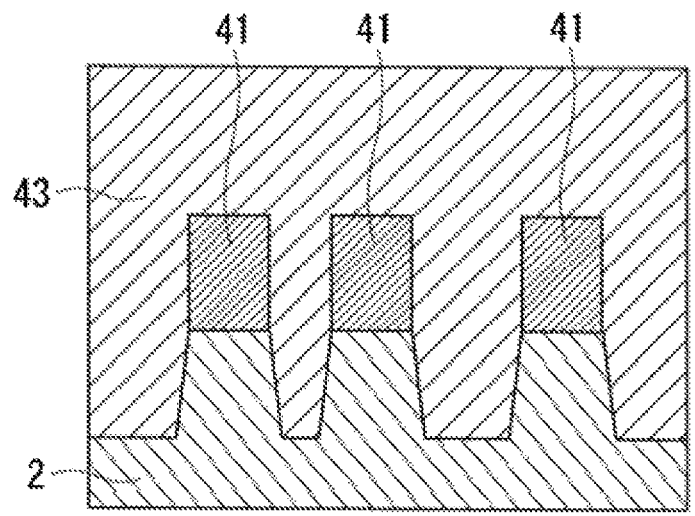
FIG. 4B is a cross-sectional view illustrating the method for manufacturing the semiconductor device according to the first embodiment and illustrates a cross-section taken along alternate long and short dash line A-B in FIG. 4A.
Figure 4C:
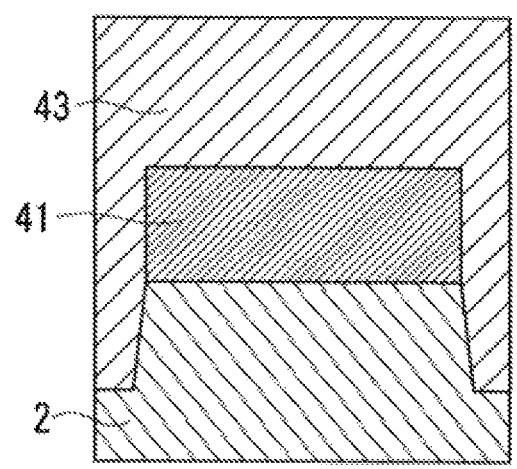
FIG. 4C is a cross-sectional view illustrating the method for manufacturing the semiconductor device according to the first embodiment and illustrates a cross-section taken along alternate long and short dash line E-F in FIG. 4A.

FIG. 4A is a plan view illustrating the method for manufacturing the semiconductor device 1 according to the first embodiment. FIG. 4B is a cross-sectional view illustrating the method for manufacturing the semiconductor device 1 according to the first embodiment and illustrates a cross-section taken along alternate long and short dash line A-B in FIG. 4A. FIG. 4C is a cross-sectional view illustrating the method for manufacturing the semiconductor device 1 according to the first embodiment and illustrates a cross-section taken along alternate long and short dash line E-F in FIG. 4A. In a step illustrated in FIGS. 4A to 4C, an oxide film ($SiO_2$) 43 is formed over the entire surface of the semiconductor substrate 2 by, for example, CVD method. Since the oxide film 43 is formed over the entire surface of the semiconductor substrate 2, the trenches 42 in the semiconductor substrate 2 are filled up with the oxide film 43.

Figure 5A:
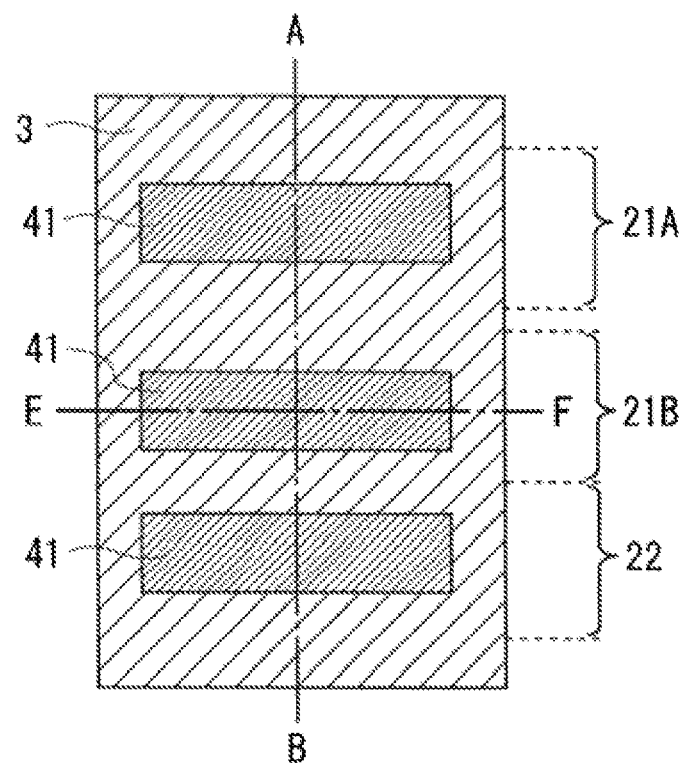
FIG. 5A is a plan view illustrating the method for manufacturing the semiconductor device according to the first embodiment.
Figure 5B:
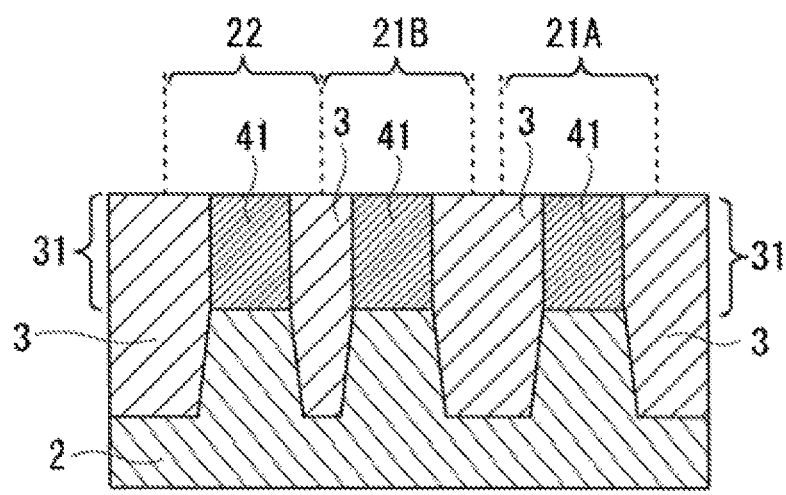
FIG. 5B is a cross-sectional view illustrating the method for manufacturing the semiconductor device according to the first embodiment and illustrates a cross-section taken along alternate long and short dash line A-B in FIG. 5A.
Figure 5C:
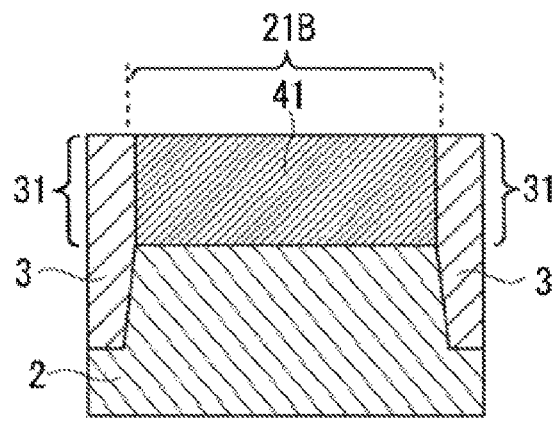
FIG. 5C is a cross-sectional view illustrating the method for manufacturing the semiconductor device according to the first embodiment and illustrates a cross-section taken along alternate long and short dash line E-F in FIG. 5A.

FIG. 5A is a plan view illustrating the method for manufacturing the semiconductor device 1 according to the first embodiment. FIG. 5B is a cross-sectional view illustrating the method for manufacturing the semiconductor device 1 according to the first embodiment and illustrates a cross-ssection taken along alternate long and short dash line A-B in FIG. 5A. FIG. 5C is a cross-sectional view illustrating the method for manufacturing the semiconductor device 1 according to the first embodiment and illustrates a cross-section taken along alternate long and short dash line E-F in FIG. 5A. In a step illustrated in FIGS. 5A to 5C, an upper portion of the oxide film 43 is removed by CMP (Chemical Mechanical Polishing), thereby forming, on the semiconductor substrate 2, the element isolation insulating film 3 that includes the protruding portions 31 protruding above the level of the surface of the semiconductor substrate 2. The formation of the element isolation insulating film 3 on the semiconductor substrate 2 demarcates the n-type MOS transistor formation regions 21A and 21B and the p-type MOS transistor formation region 22 in the semiconductor substrate 2.

Figure 6A:
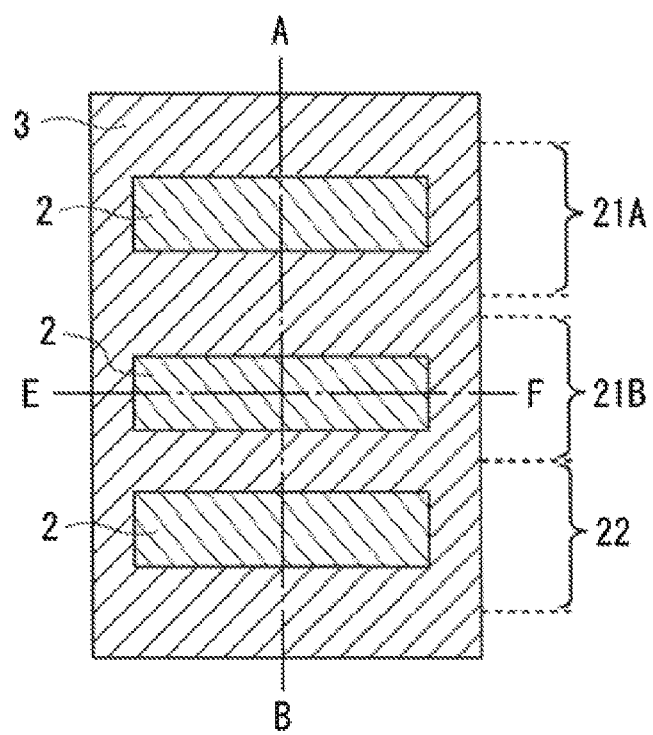
FIG. 6A is a plan view illustrating the method for manufacturing the semiconductor device according to the first embodiment.
Figure 6B:
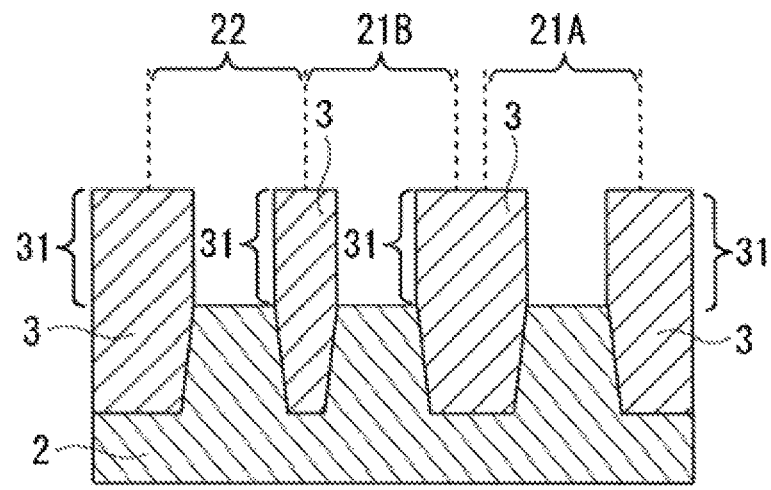
FIG. 6B is a cross-sectional view illustrating the method for manufacturing the semiconductor device according to the first embodiment and illustrates a cross-section taken along alternate long and short dash line A-B in FIG. 6A.
Figure 6C:
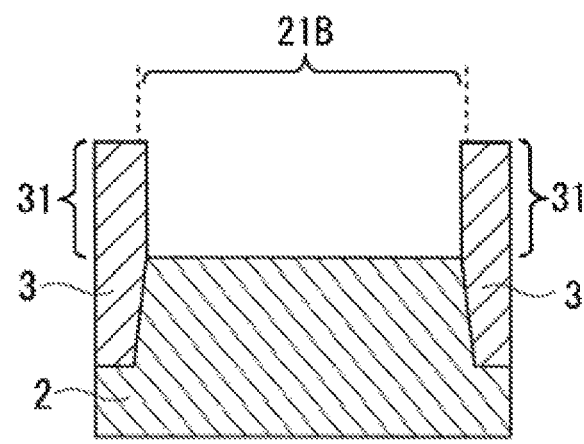
FIG. 6C is a cross-sectional view illustrating the method for manufacturing the semiconductor device according to the first embodiment and illustrates a cross-section taken along alternate long and short dash line E-F in FIG. 6A.

FIG. 6A is a plan view illustrating the method for manufacturing the semiconductor device 1 according to the first embodiment. FIG. 6B is a cross-sectional view illustrating the method for manufacturing the semiconductor device 1 according to the first embodiment and illustrates a cross-section taken along alternate long and short dash line A-B in FIG. 6A. FIG. 6C is a cross-sectional view illustrating the method for manufacturing the semiconductor device 1 according to the first embodiment and illustrates a cross-section taken along alternate long and short dash line E-F in FIG. 6A. In a step illustrated in FIGS. 6A to 6C, the hard masks 41 that are exposed from the element isolation insulating film 3 are removed by, for example, wet treatment using hot phosphoric acid.

Figure 7A:
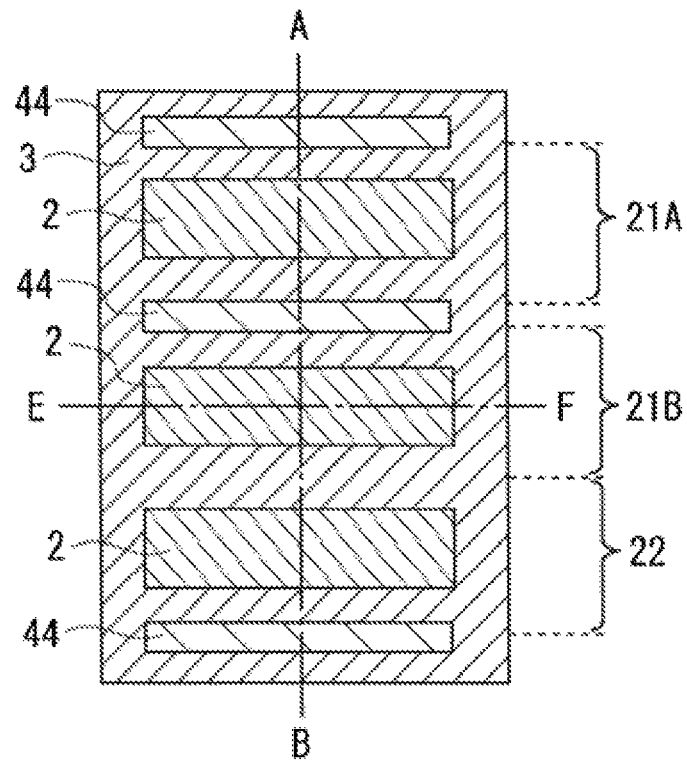
FIG. 7A is a plan view illustrating the method for manufacturing the semiconductor device according to the first embodiment.
Figure 7B:
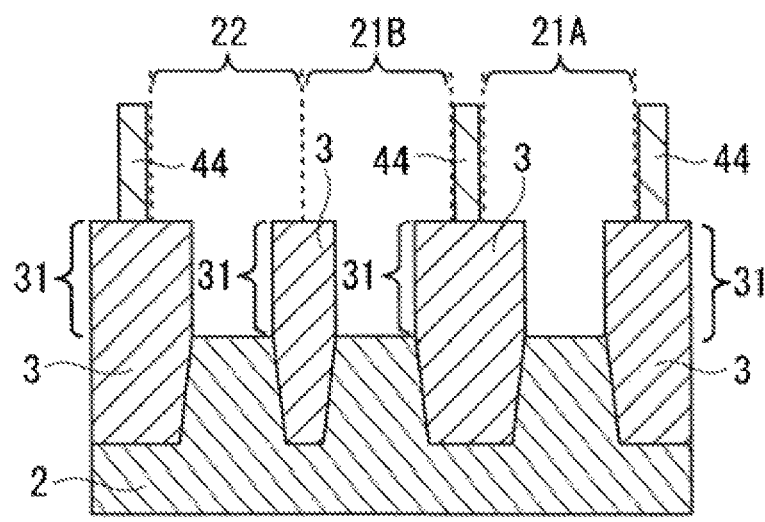
FIG. 7B is a cross-sectional view illustrating the method for manufacturing the semiconductor device according to the first embodiment and illustrates a cross-section taken along alternate long and short dash line A-B in FIG. 7A.
Figure 7C:
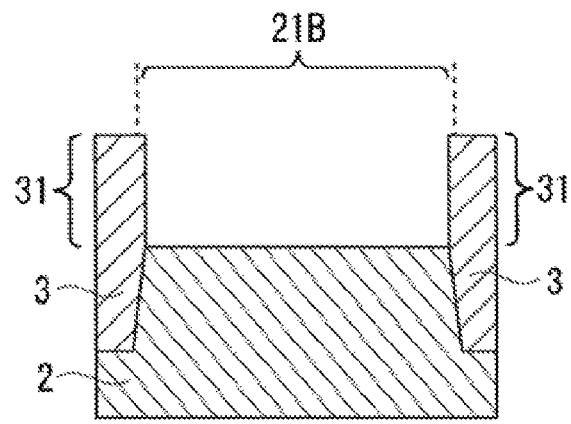
FIG. 7C is a cross-sectional view illustrating the method for manufacturing the semiconductor device according to the first embodiment and illustrates a cross-section taken along alternate long and short dash line E-F in FIG. 7A.

FIG. 7A is a plan view illustrating the method for manufacturing the semiconductor device 1 according to the first embodiment. FIG. 7B is a cross-sectional view illustrating the method for manufacturing the semiconductor device 1 according to the first embodiment and illustrates a cross-section taken along alternate long and short dash line A-B in FIG. 7A. FIG. 7C is a cross-sectional view illustrating the method for manufacturing the semiconductor device 1 according to the first embodiment and illustrates a cross-section taken along alternate long and short dash line E-F in FIG. 7A. In a step illustrated in FIGS. 7A to 7C, resist patterns 44 are formed at predetermined sites on the protruding portions 31 of the element isolation insulating film 3 by photolithography.

Figure 8A:
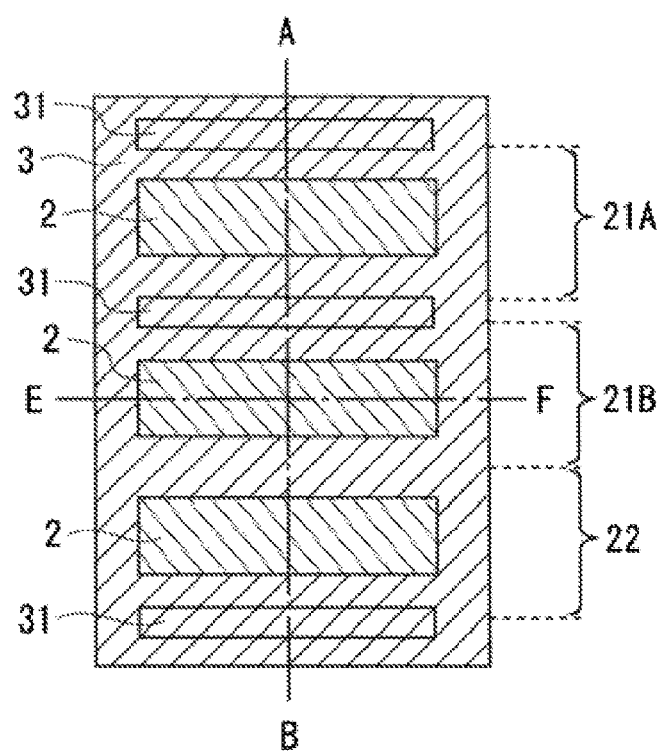
FIG. 8A is a plan view illustrating the method for manufacturing the semiconductor device according to the first embodiment.
Figure 8B:
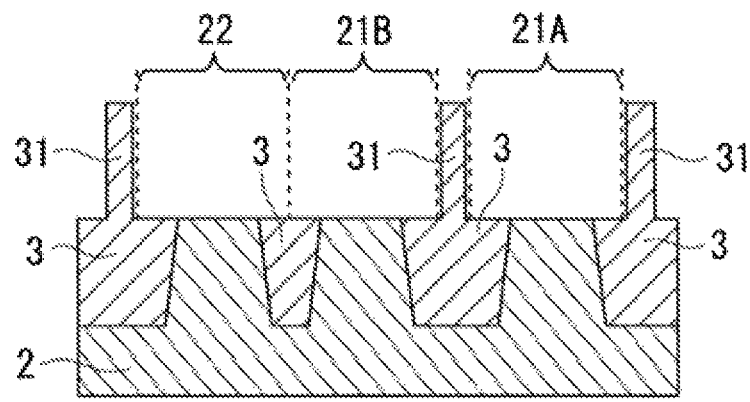
FIG. 8B is a cross-sectional view illustrating the method for manufacturing the semiconductor device according to the first embodiment and illustrates a cross-section taken along alternate long and short dash line A-B in FIG. 8A.
Figure 8C:
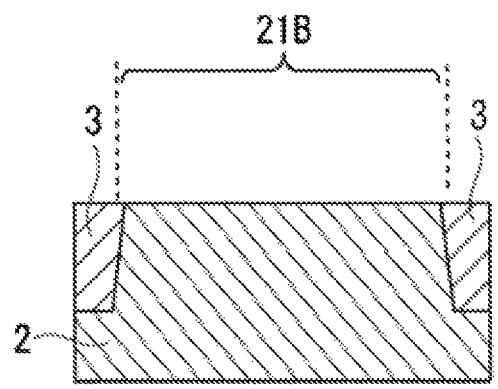
FIG. 8C is a cross-sectional view illustrating the method for manufacturing the semiconductor device according to the first embodiment and illustrates a cross-section taken along alternate long and short dash line E-F in FIG. 8A.

FIG. 8A is a plan view illustrating the method for manufacturing the semiconductor device 1 according to the first embodiment. FIG. 8B is a cross-sectional view illustrating the method for manufacturing the semiconductor device 1 according to the first embodiment and illustrates a cross-section taken along alternate long and short dash line A-B in FIG. 8A. FIG. 8C is a cross-sectional view illustrating the method for manufacturing the semiconductor device 1 according to the first embodiment and illustrates a cross-section taken along alternate long and short dash line E-F in FIG. 8A. In a step illustrated in FIGS. 8A to 8C, the protruding portions 31 of the element isolation insulating film 3 are partially shaved off by performing anisotropic dry etching, such as RIE, using the resist patterns 44 as a mask. The resist patterns 44 are then removed by wet treatment using a chemical solution, such as a SPM solution, or ashing.

The resist pattern 44 is not formed on the protruding portion 31 of the element isolation insulating film 3 between the n-type MOS transistor formation region 21B and the p-type MOS transistor formation region 22. For this reason, the protruding portion 31 of the element isolation insulating film 3 between the n-type MOS transistor formation region 21B and the p-type MOS transistor formation region 22 is removed. The protruding portions 31 of the element isolation insulating film 3 are partially shaved off to obtain the protruding portions 31 that are thinner than portions below the protruding portions 31 of the element isolation insulating film 3. Although an example where the protruding portions 31 of the element isolation insulating film 3 are partially shaved off has been illustrated, the first embodiment is not limited to the example. The step of partially shaving off the protruding portions 31 of the element isolation insulating film 3 may be omitted. In this case, each protruding portion 31 of the element isolation insulating film 3 and a portion below the protruding portion 31 of the element isolation insulating film 3 are the same in thickness.

Figure 9A:
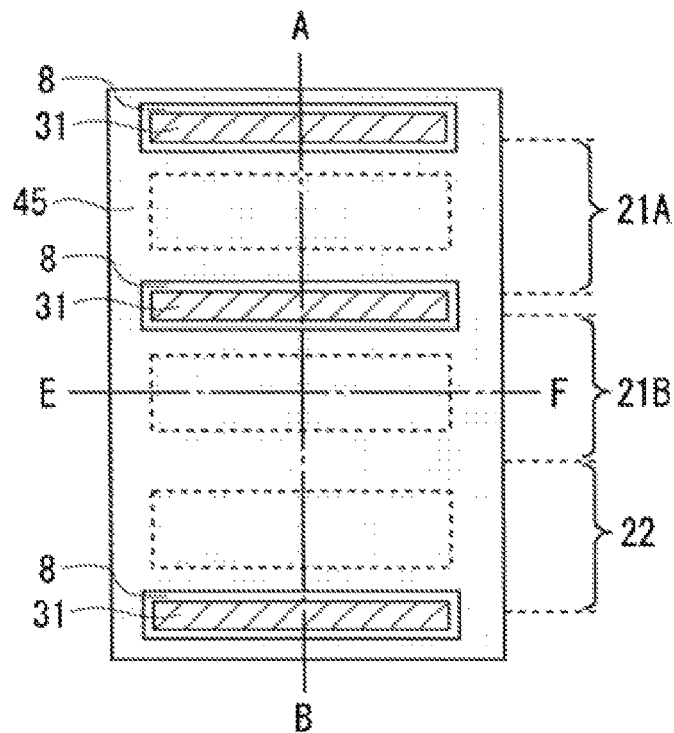
FIG. 9A is a plan view illustrating the method for manufacturing the semiconductor device according to the first embodiment.
Figure 9B:
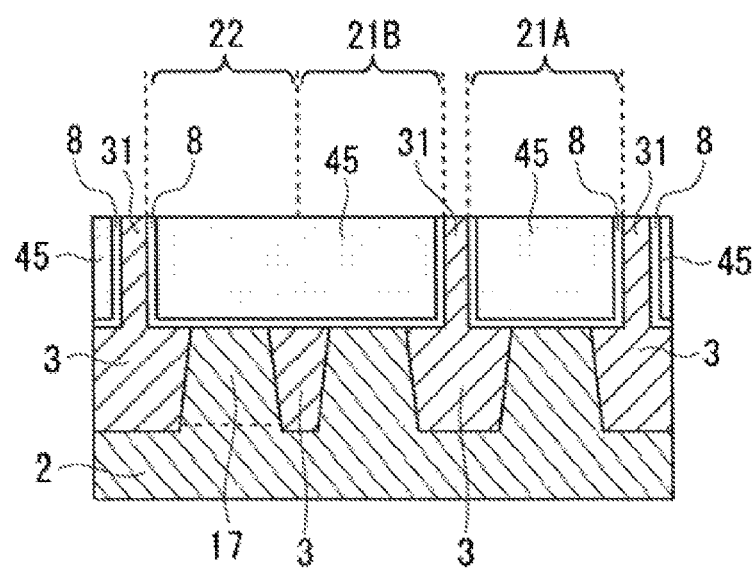
FIG. 9B is a cross-sectional view illustrating the method for manufacturing the semiconductor device according to the first embodiment and illustrates a cross-section taken along alternate long and short dash line A-B in FIG. 9A.
Figure 9C:
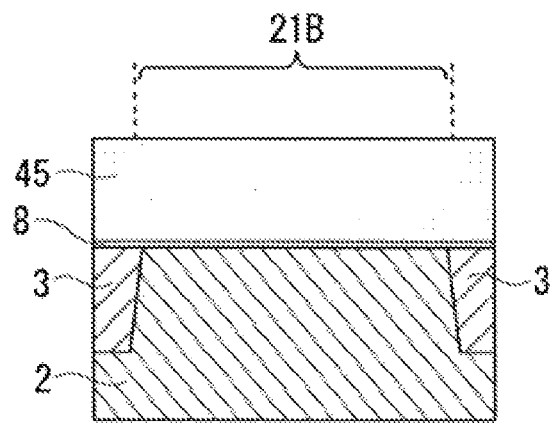
FIG. 9C is a cross-sectional view illustrating the method for manufacturing the semiconductor device according to the first embodiment and illustrates a cross-section taken along alternate long and short dash line E-F in FIG. 9A.

FIG. 9A is a plan view illustrating the method for manufacturing the semiconductor device 1 according to the first embodiment. FIG. 9B is a cross-sectional view illustrating the method for manufacturing the semiconductor device 1 according to the first embodiment and illustrates a cross-section taken along alternate long and short dash line A-B in FIG. 9A. FIG. 9C is a cross-sectional view illustrating the method for manufacturing the semiconductor device 1 according to the first embodiment and illustrates a cross-section taken along alternate long and short dash line E-F in FIG. 9A. In a step illustrated in FIGS. 9A to 9C, impurities are ion-implanted, thereby forming the well region 17 and channel regions (not illustrated) in the semiconductor substrate 2. For example, when the conductivity type of the semiconductor substrate 2 is the p-type, n-type impurities are ion-implanted, thereby forming the n-type well region 17 in the semiconductor substrate 2 in the p-type MOS transistor formation region 22. The impurities implanted in the semiconductor substrate 2 are then activated by heat treatment (annealing treatment). After that, the gate insulating film 8 is formed on the semiconductor substrate 2 and the element isolation insulating film 3 by, for example, CVD method. The gate insulating film 8 is, for example, a high dielectric insulating film (high-k film) of, e.g., $HfO_2$, HfSiO, HfAlON, $Y_2O_3$, ZrO, TiO, or TaO. The gate insulating film 8 may be a $SiO_2$ film (silicon oxide film), a SiON film (silicon oxynitride film), a SiN film (silicon nitride film), or the like. Moreover, a dummy gate electrode 45 is formed on the gate insulating film 8 by, for example, CVD method. The dummy gate electrode 45 is made of, for example, polysilicon. The dummy gate electrode 45 is an example of a first film. Furthermore, the gate insulating film 8 and the dummy gate electrode 45 are polished by CMP, thereby exposing the protruding portions 31 of the element isolation insulating film 3 from the gate insulating film 8 and the dummy gate electrode 45.

Since the protruding portions 31 of the element isolation insulating film 3 and the dummy gate electrodes 45 are planarized by CMP, the height of each protruding portion 31 of the element isolation insulating film 3 is nearly equal to the thickness (height) of each dummy gate electrode 45. The thickness (height) of the dummy gate electrode 45 after the CMP is, for example, about not less than 50 nm and not more than 100 nm. Note that the thickness (height) of the dummy gate electrode 45 after the CMP is set to be smaller than the thickness (height) of the hard mask 41.

Figure 10A:
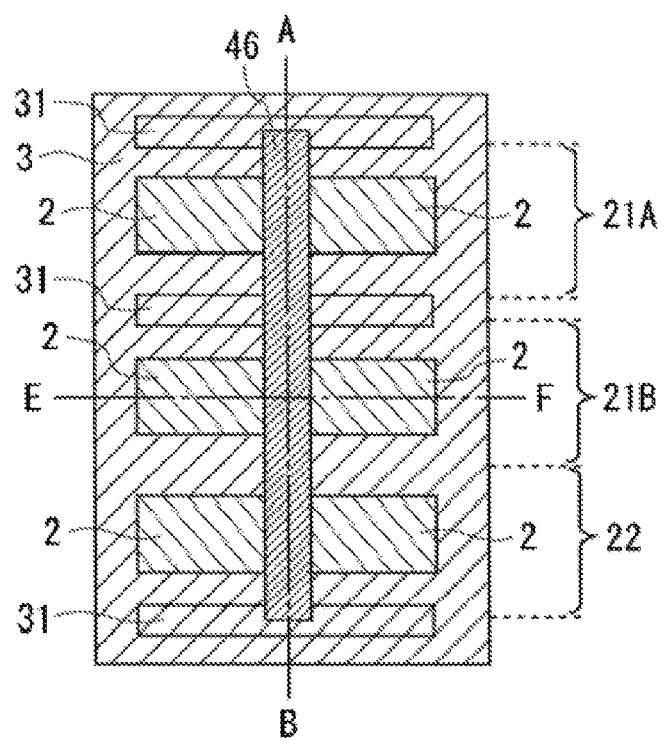
FIG. 10A is a plan view illustrating the method for manufacturing the semiconductor device according to the first embodiment.
Figure 10B:
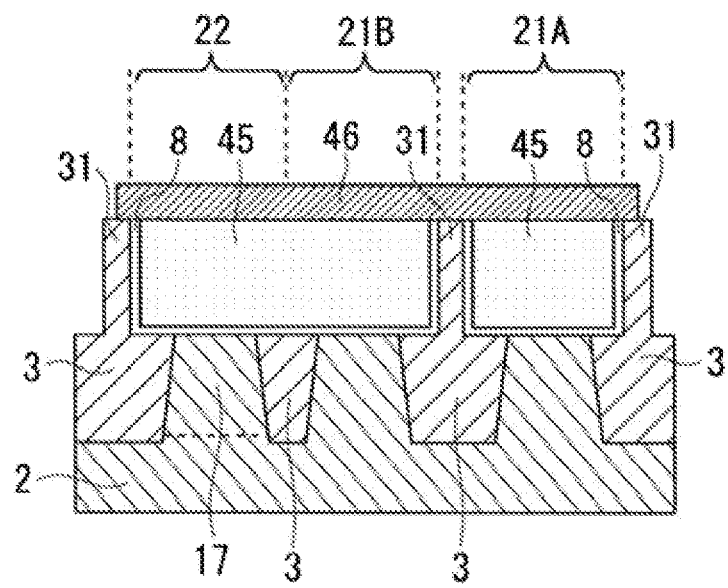
FIG. 10B is a cross-sectional view illustrating the method for manufacturing the semiconductor device according to the first embodiment and illustrates a cross-section taken along alternate long and short dash line A-B in FIG. 10A.
Figure 10C:
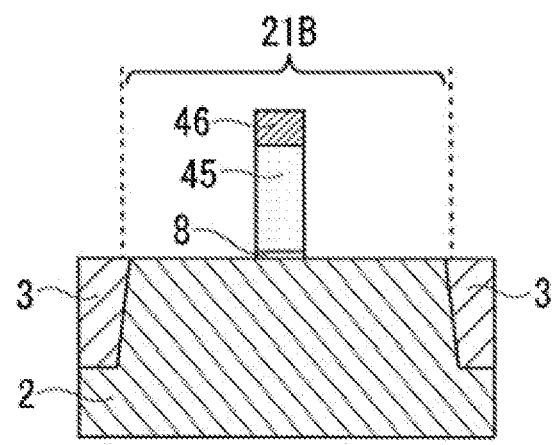
FIG. 10C is a cross-sectional view illustrating the method for manufacturing the semiconductor device according to the first embodiment and illustrates a cross-section taken along alternate long and short dash line E-F in FIG. 10A.

FIG. 10A is a plan view illustrating the method for manufacturing the semiconductor device 1 according to the first embodiment. FIG. 10B is a cross-sectional view illustrating the method for manufacturing the semiconductor device 1 according to the first embodiment and illustrates a cross-section taken along alternate long and short dash line A-B in FIG. 10A. FIG. 10C is a cross-sectional view illustrating the method for manufacturing the semiconductor device 1 according to the first embodiment and illustrates a cross-section taken along alternate long and short dash line E-F in FIG. 10A. In a step illustrated in FIGS. 10A to 10C, a hard mask 46 is formed on the dummy gate electrodes 45 by, for example, CVD method. The hard mask 46 is, for example, a SiN film or a laminated film of a SiN film and a $SiO_2$ film. A resist pattern is then formed on the hard mask 46 by photolithography. The resist pattern is formed on the hard mask 46 so as to straddle the protruding portions 31 of the element isolation insulating film 3 and the dummy gate electrodes 45. After that, the hard mask 46 is patterned by performing anisotropic dry etching, such as RIE, using the resist pattern on the hard mask 46 as a mask. With the patterning, the hard mask 46 straddling the protruding portions 31 of the element isolation insulating film 3 and the dummy gate electrodes 45 is formed. Moreover, the resist pattern on the hard mask 46 is removed by wet treatment using a chemical solution, such as a SPM solution, or ashing. Furthermore, the gate insulating films 8 and the dummy gate electrodes 45 are patterned by performing anisotropic dry etching, such as RIE, using the hard mask 46 as a mask. The dummy gate electrodes 45 obtained after the patterning are an example of a first pattern.

Figure 11A:
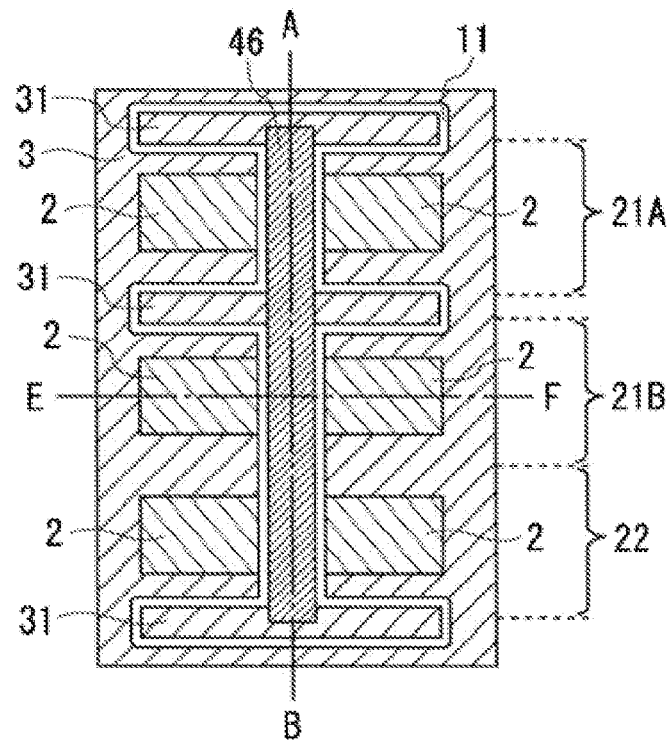
FIG. 11A is a plan view illustrating the method for manufacturing the semiconductor device according to the first embodiment.
Figure 11B:
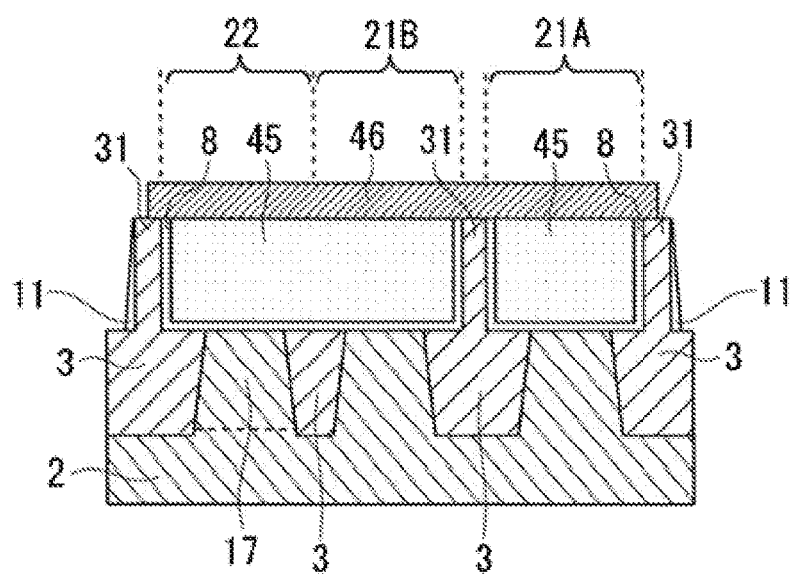
FIG. 11B is a cross-sectional view illustrating the method for manufacturing the semiconductor device according to the first embodiment and illustrates a cross-section taken along alternate long and short dash line A-B in FIG. 11A.
Figure 11C:
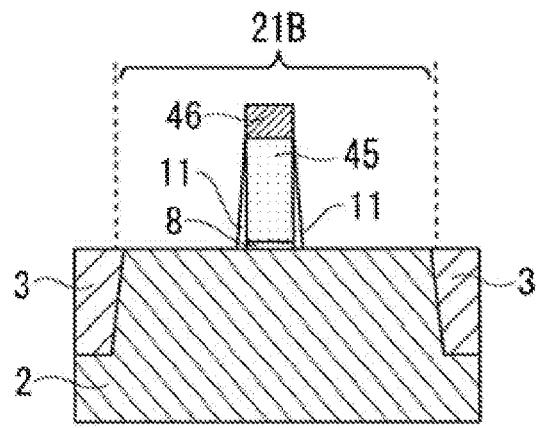
FIG. 11C is a cross-sectional view illustrating the method for manufacturing the semiconductor device according to the first embodiment and illustrates a cross-section taken along alternate long and short dash line E-F in FIG. 11A.

FIG. 11A is a plan view illustrating the method for manufacturing the semiconductor device 1 according to the first embodiment. FIG. 11B is a cross-sectional view illustrating the method for manufacturing the semiconductor device 1 according to the first embodiment and illustrates a cross-section taken along alternate long and short dash line A-B in FIG. 11A. FIG. 11C is a cross-sectional view illustrating the method for manufacturing the semiconductor device 1 according to the first embodiment and illustrates a cross-section taken along alternate long and short dash line E-F in FIG. 11A. In a step illustrated in FIGS. 11A to 11C, a $SiO_2$ film is formed on the semiconductor substrate 2 by, for example, CVD method. A SiN film may be formed instead of the $SiO_2$ film. Etchback is then performed by anisotropic dry etching, such as RIE, and the first sidewall insulating film 11 is formed at side surfaces of the dummy gate electrodes 45 in a lateral direction of the dummy gate electrode 45. The protruding portions 31 are provided at the element isolation insulating film 3 so as to cover side surfaces of the dummy gate electrodes 45 in a longitudinal direction of the dummy gate electrode 45. For this reason, the first sidewall insulating film 11 is not formed at the side surfaces of the dummy gate electrodes 45 in the longitudinal direction of the dummy gate electrode 45. The first sidewall insulating film 11 is formed at side surfaces of the protruding portions 31 of the element isolation insulating film 3.

Figure 12A:
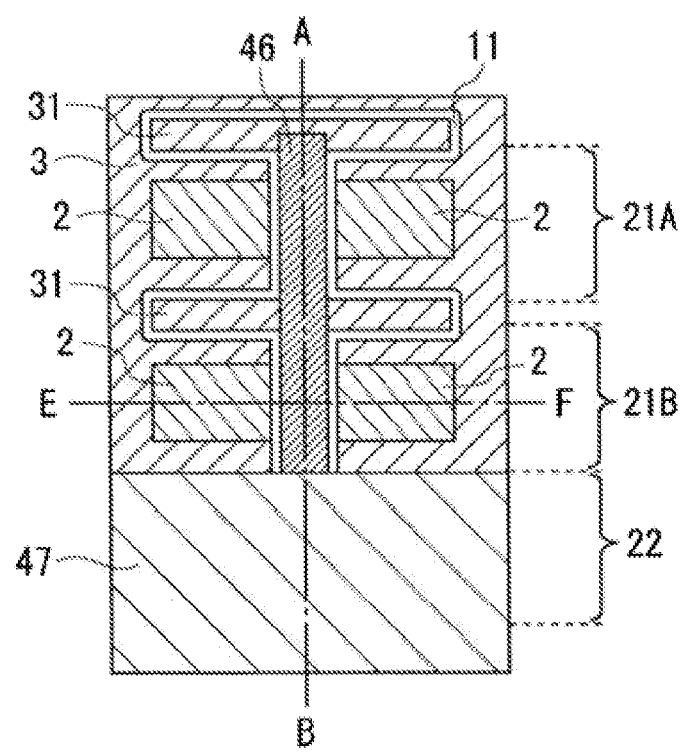
FIG. 12A is a plan view illustrating the method for manufacturing the semiconductor device according to the first embodiment.
Figure 12B:
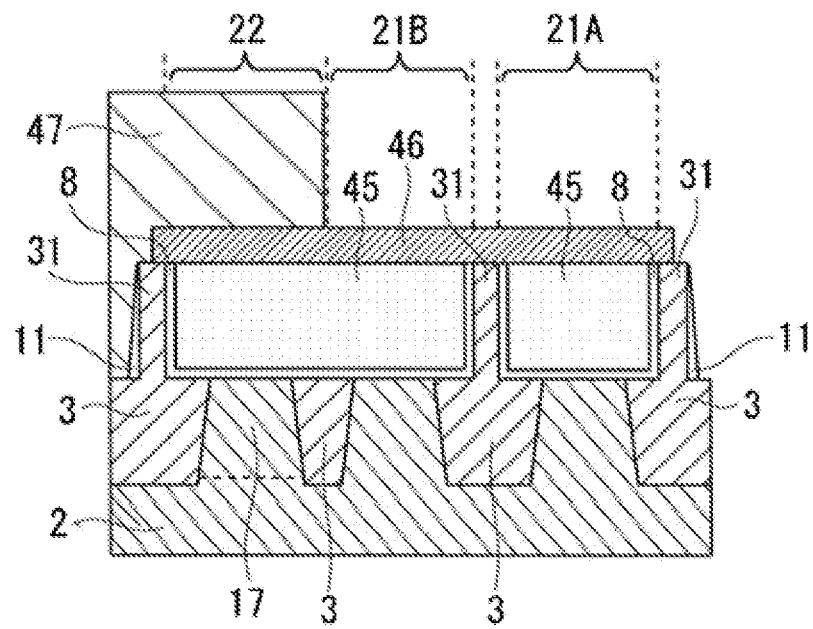
FIG. 12B is a cross-sectional view illustrating the method for manufacturing the semiconductor device according to the first embodiment and illustrates a cross-section taken along alternate long and short dash line A-B in FIG. 12A.
Figure 12C:
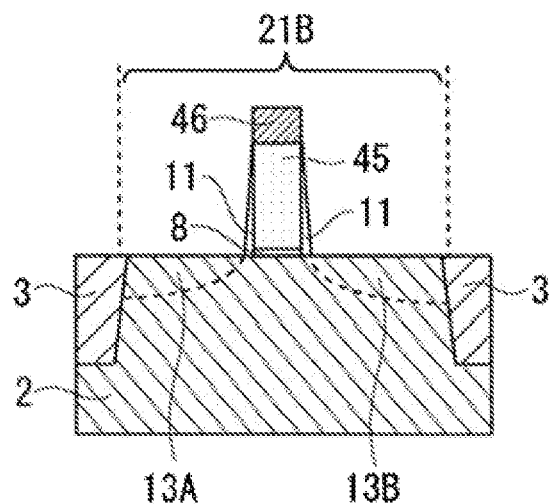
FIG. 12C is a cross-sectional view illustrating the method for manufacturing the semiconductor device according to the first embodiment and illustrates a cross-section taken along alternate long and short dash line E-F in FIG. 12A.

FIG. 12A is a plan view illustrating the method for manufacturing the semiconductor device 1 according to the first embodiment. FIG. 12B is a cross-sectional view illustrating the method for manufacturing the semiconductor device 1 according to the first embodiment and illustrates a cross-section taken along alternate long and short dash line A-B in FIG. 12A. FIG. 12C is a cross-sectional view illustrating the method for manufacturing the semiconductor device 1 according to the first embodiment and illustrates a cross-section taken along alternate long and short dash line E-F in FIG. 12A. In a step illustrated in FIGS. 12A to 12C, a resist pattern 47 which is open in the n-type MOS transistor formation regions 21A and 21B is formed on the semiconductor substrate 2 by photolithography. Impurities are then ion-implanted using the first sidewall insulating film 11 and the resist pattern 47 as a mask, thereby forming the LDD regions 13A and 13B in the semiconductor substrate 2 in the n-type MOS transistor formation regions 21A and 21B. In this case, for example, n-type impurities, such as phosphorus (P), are ion-implanted. Since the hard mask 46 is formed on the dummy gate electrodes 45, the impurities are not implanted into the dummy gate electrodes 45. The LDD regions 13A and 13B are not illustrated in FIGS. 12A and 12B. After that, the resist pattern 47 is removed by wet treatment using a chemical solution, such as a SPM solution, or ashing.

When the protruding portions 31 are not provided at the element isolation insulating film 3, side surfaces of the dummy gate electrodes 45 in a gate width direction of the dummy gate electrode 45 and the first sidewall insulating film 11 are in contact. The gate width direction of the dummy gate electrode 45 refers to a direction crossing a gate length direction of the dummy gate electrode 45. The gate length direction of the dummy gate electrode 45 refers to a direction from the LDD region 13A toward the LDD region 13B and a direction from the LDD region 13B toward the LDD region 13A. The gate width direction of the dummy gate electrode 45 coincides with the longitudinal direction of the dummy gate electrode 45, and the gate length direction of the dummy gate electrode 45 coincides with the lateral direction of the dummy gate electrode 45. Corners at ends of the dummy gate electrodes 45 in the gate width direction of the dummy gate electrode 45 are rounded by the anisotropic dry etching of the dummy gate electrode 45. When the first sidewall insulating film 11 is in contact with the side surfaces of the dummy gate electrodes 45 in the gate width direction of the dummy gate electrode 45, the thickness of the first sidewall insulating film 11 in the gate width direction of the dummy gate electrode 45 is reduced. In this case, a defect, such as disappearance of a portion of the first sidewall insulating film 11 or perforation of the first sidewall insulating film 11, occurs in the first sidewall insulating film 11.

When the resist pattern 47 is removed by the wet treatment using the chemical solution, the first sidewall insulating film 11 is exposed to the chemical solution. When the protruding portions 31 of the element isolation insulating film 3 are not provided in the gate width direction of the dummy gate electrode 45, the chemical solution infiltrates from a defect in the first sidewall insulating film 11 into below the dummy gate electrode 45, and the gate insulating film 8 is exposed to the chemical solution. The exposure of the gate insulating film 8 to the chemical solution causes the gate insulating film 8 to dissolve in the chemical solution, thus leading to disappearance of a portion of the gate insulating film 8. The disappearance of the portion of the gate insulating film 8 degrades the gate insulating film 8. Thus, when the protruding portions 31 of the element isolation insulating film 3 are not provided in the gate width direction of the dummy gate electrode 45, the wet treatment using the chemical solution degrades the gate insulating films 8. The degradation of the gate insulating films 8 causes degradation in characteristics of the n-type MOS transistors 4A and 4B and the p-type MOS transistor 5.

As illustrated in FIGS. 12A to 12C, the protruding portions 31 are provided at the element isolation insulating film 3 so as to cover the side surfaces of the dummy gate electrodes 45 in the gate width direction of the dummy gate electrode 45. For this reason, the side surfaces of the dummy gate electrodes 45 in the gate width direction of the dummy gate electrode 45 and the first sidewall insulating film 11 are not in contact. This configuration inhibits a chemical solution from infiltrating in the gate width direction of the dummy gate electrode 45 into between the element isolation insulating film 3 and the dummy gate electrode 45 and between the semiconductor substrate 2 and the dummy gate electrode 45. The gate insulating films 8 are thus inhibited from degrading due to the wet treatment using the chemical solution at the time of the removal of the resist pattern 47. Note that the thickness, in the gate length direction of the dummy gate electrode 45, of the first sidewall insulating film 11 formed at side surfaces of the dummy gate electrodes 45 is not reduced. Thus, a chemical solution does not infiltrate in the gate length direction of the dummy gate electrode 45 into between the element isolation insulating film 3 and the dummy gate electrode 45 and between the semiconductor substrate 2 and the dummy gate electrode 45.

Figure 13A:
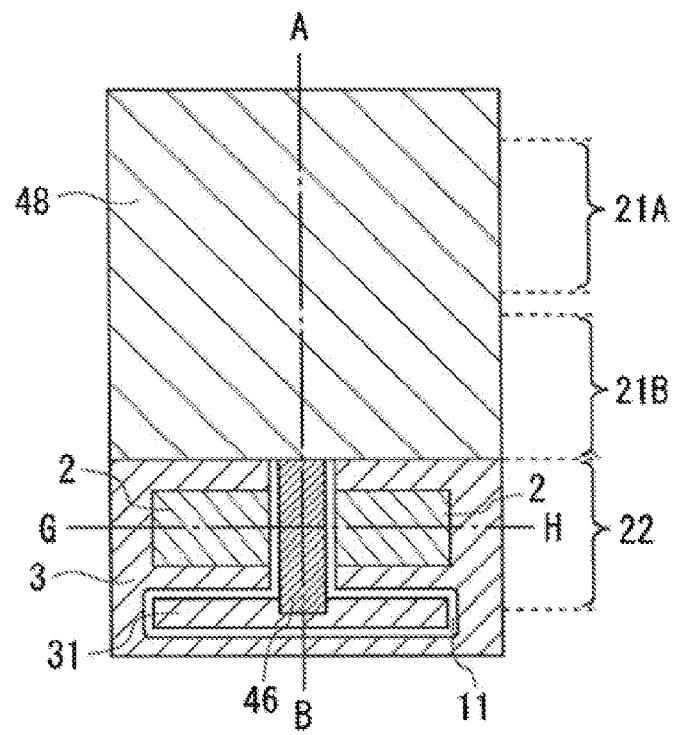
FIG. 13A is a plan view illustrating the method for manufacturing the semiconductor device according to the first embodiment.
Figure 13B:
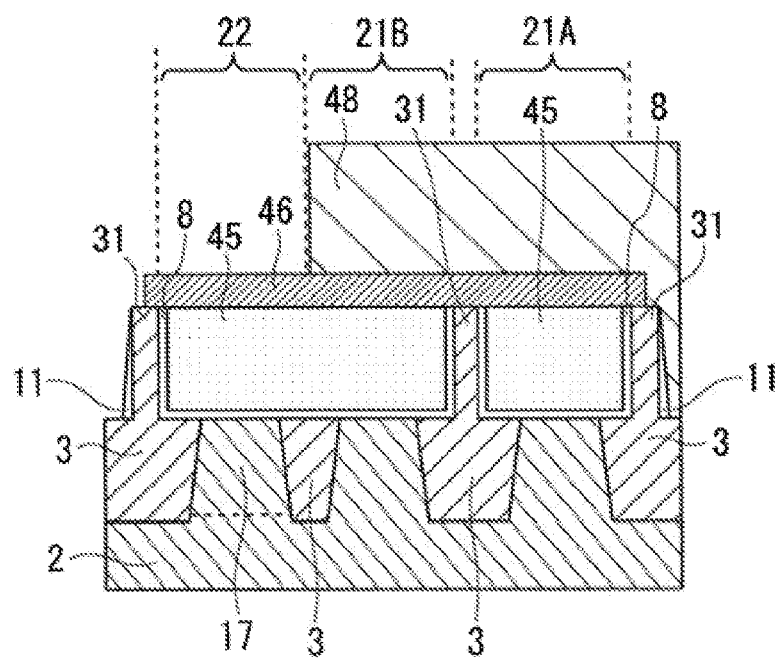
FIG. 13B is a cross-sectional view illustrating the method for manufacturing the semiconductor device according to the first embodiment and illustrates a cross-section taken along alternate long and short dash line A-B in FIG. 13A.
Figure 13C:
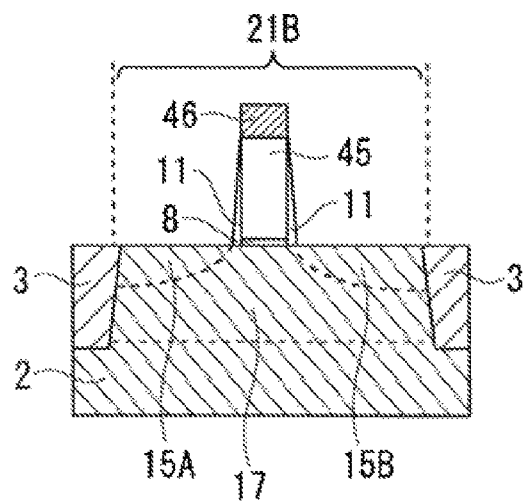
FIG. 13C is a cross-sectional view illustrating the method for manufacturing the semiconductor device according to the first embodiment and illustrates a cross-section taken along alternate long and short dash line G-H in FIG. 13A.

FIG. 13A is a plan view illustrating the method for manufacturing the semiconductor device 1 according to the first embodiment. FIG. 13B is a cross-sectional view illustrating the method for manufacturing the semiconductor device 1 according to the first embodiment and illustrates a cross-section taken along alternate long and short dash line A-B in FIG. 13A. FIG. 13C is a cross-sectional view illustrating the method for manufacturing the semiconductor device 1 according to the first embodiment and illustrates a cross-section taken along alternate long and short dash line G-H in FIG. 13A. In a step illustrated in FIGS. 13A to 13C, a resist pattern 48 which is open in the p-type MOS transistor formation region 22 is formed on the semiconductor substrate 2 by photolithography. Impurities are then ion-implanted using the first sidewall insulating film 11 and the resist pattern 48 as a mask, thereby forming the LDD regions 15A and 15B in the semiconductor substrate 2 in the p-type MOS transistor formation region 22. In this case, for example, p-type impurities, such as boron (B), are ion-implanted. Since the hard mask 46 is formed on the dummy gate electrodes 45, the impurities are not implanted into the dummy gate electrodes 45. The LDD regions 15A and 15B are not illustrated in FIGS. 13A and 13B. After that, the resist pattern 48 is removed by wet treatment using a chemical solution, such as a SPM solution, or ashing.

When the resist pattern 48 is removed by the wet treatment using the chemical solution, the first sidewall insulating film 11 is exposed to the chemical solution. As illustrated in FIGS. 13A to 13C, the protruding portions 31 are provided at the element isolation insulating film 3 so as to cover the side surfaces of the dummy gate electrodes 45 in the gate width direction of the dummy gate electrode 45. For this reason, the side surfaces of the dummy gate electrodes 45 in the gate width direction of the dummy gate electrode 45 and the first sidewall insulating film 11 are not in contact. This configuration inhibits a chemical solution from infiltrating in the gate width direction of the dummy gate electrode 45 into between the element isolation insulating film 3 and the dummy gate electrode 45 and between the semiconductor substrate 2 and the dummy gate electrode 45. The gate insulating films 8 are thus inhibited from degrading due to the wet treatment using the chemical solution at the time of the removal of the resist pattern 48.

Figure 14A:
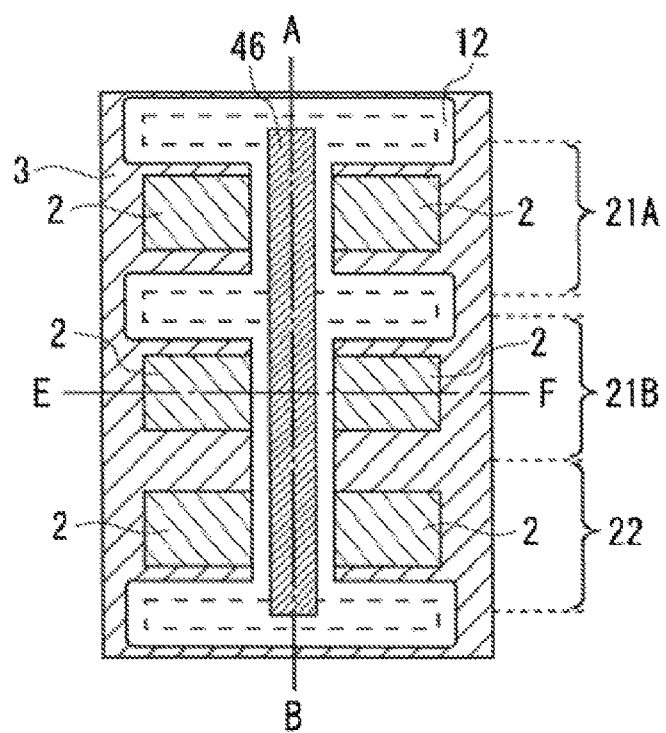
FIG. 14A is a plan view illustrating the method for manufacturing the semiconductor device according to the first embodiment.
Figure 14B:
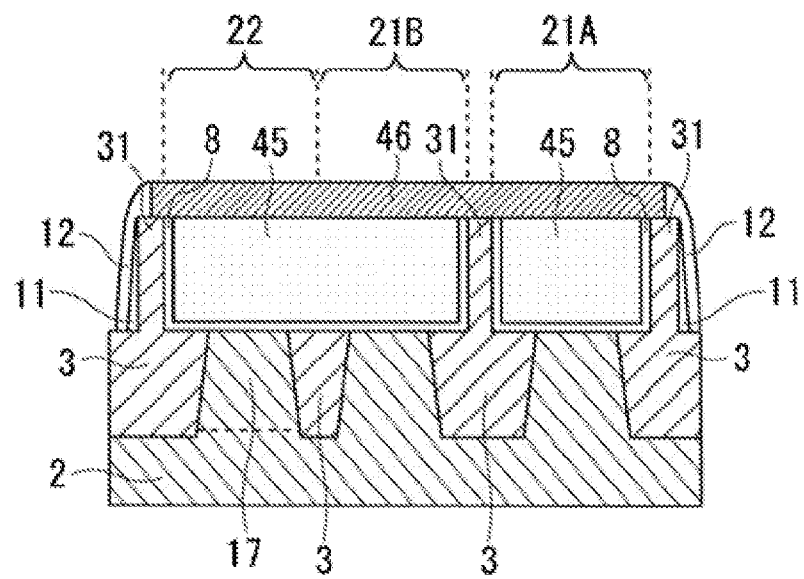
FIG. 14B is a cross-sectional view illustrating the method for manufacturing the semiconductor device according to the first embodiment and illustrates a cross-section taken along alternate long and short dash line A-B in FIG. 14A.
Figure 14C:
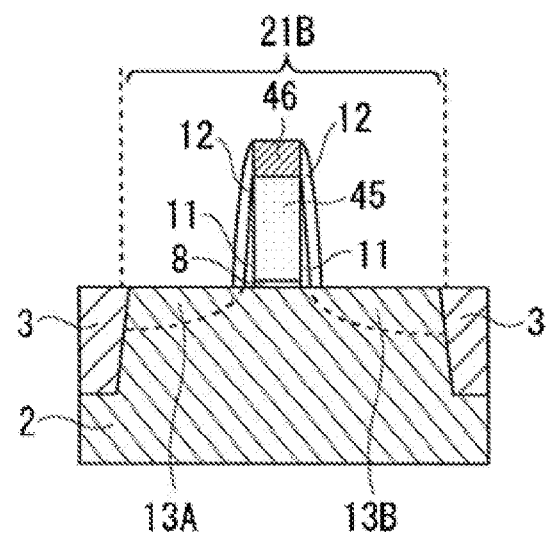
FIG. 14C is a cross-sectional view illustrating the method for manufacturing the semiconductor device according to the first embodiment and illustrates a cross-section taken along alternate long and short dash line E-F in FIG. 14A.

FIG. 14A is a plan view illustrating the method for manufacturing the semiconductor device 1 according to the first embodiment. FIG. 14B is a cross-sectional view illustrating the method for manufacturing the semiconductor device 1 according to the first embodiment and illustrates a cross-section taken along alternate long and short dash line A-B in FIG. 14A. FIG. 14C is a cross-sectional view illustrating the method for manufacturing the semiconductor device 1 according to the first embodiment and illustrates a cross-section taken along alternate long and short dash line E-F in FIG. 14A. In a step illustrated in FIGS. 14A to 14C, a $SiO_2$ film is formed on the semiconductor substrate 2 by, for example, CVD method. A SiN film may be formed instead of the $SiO_2$ film. Etchback is then performed by anisotropic dry etching, such as RIE, thereby forming the second sidewall insulating film 12 at the side surfaces of the dummy gate electrodes 45 in the gate length direction of the dummy gate electrode 45. The second sidewall insulating film 12 is formed at the side surfaces of the dummy gate electrodes 45 in the gate length direction of the dummy gate electrode 45 so as to cover the first sidewall insulating film 11. The second sidewall insulating film 12 is formed at side surfaces of the protruding portions 31 of the element isolation insulating film 3.

Figure 15A:
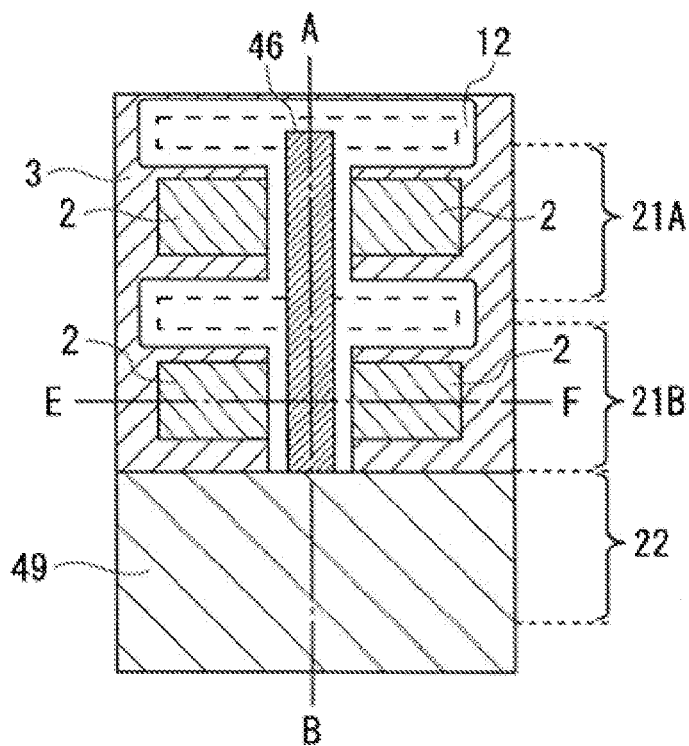
FIG. 15A is a plan view illustrating the method for manufacturing the semiconductor device according to the first embodiment.
Figure 15B:
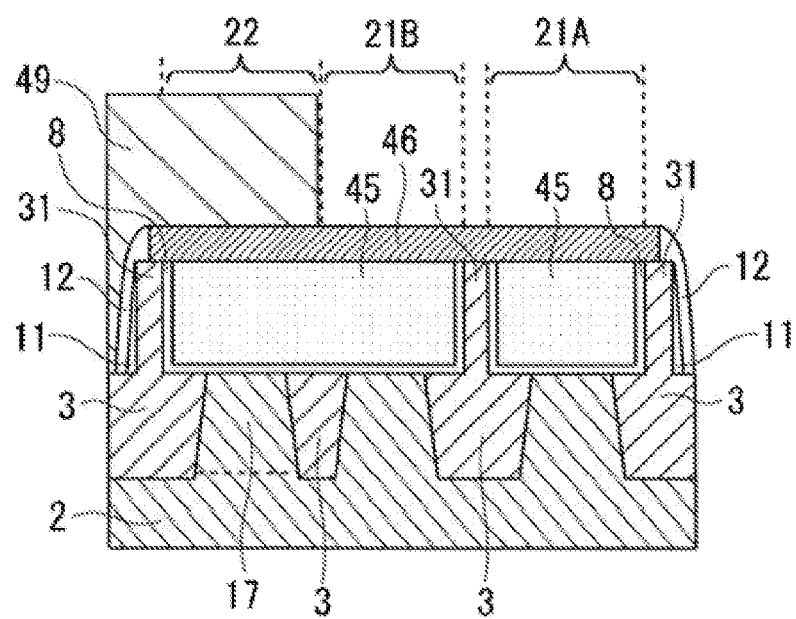
FIG. 15B is a cross-sectional view illustrating the method for manufacturing the semiconductor device according to the first embodiment and illustrates a cross-section taken along alternate long and short dash line A-B in FIG. 15A.
Figure 15C:
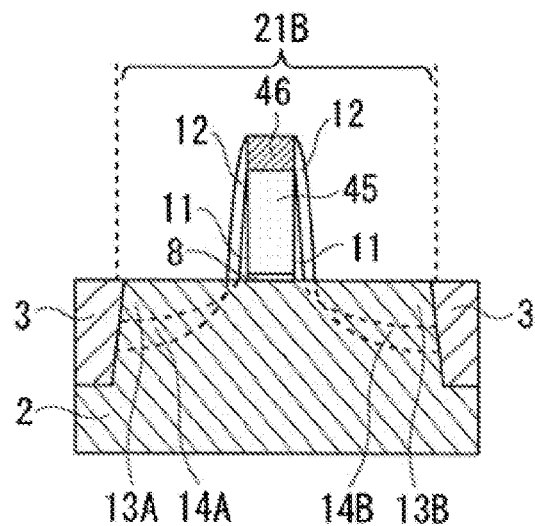
FIG. 15C is a cross-sectional view illustrating the method for manufacturing the semiconductor device according to the first embodiment and illustrates a cross-section taken along alternate long and short dash line E-F in FIG. 15A.

FIG. 15A is a plan view illustrating the method for manufacturing the semiconductor device 1 according to the first embodiment. FIG. 15B is a cross-sectional view illustrating the method for manufacturing the semiconductor device 1 according to the first embodiment and illustrates a cross-section taken along alternate long and short dash line A-B in FIG. 15A. FIG. 15C is a cross-sectional view illustrating the method for manufacturing the semiconductor device 1 according to the first embodiment and illustrates a cross-section taken along alternate long and short dash line E-F in FIG. 15A. In a step illustrated in FIGS. 15A to 15C, a resist pattern 49 which is open in the n-type MOS transistor formation regions 21A and 21B is formed on the semiconductor substrate 2 by photolithography. Impurities are then ion-implanted using the second sidewall insulating film 12 and the resist pattern 49 as a mask, thereby forming the source-drain regions 14A and 14B in the semiconductor substrate 2 in the n-type MOS transistor formation regions 21A and 21B. In this case, for example, n-type impurities, such as phosphorus (P), are ion-implanted. Since the hard mask 46 is formed on the dummy gate electrodes 45, the impurities are not implanted into the dummy gate electrodes 45. The source-drain regions 14A and 14B are not illustrated in FIGS. 15A and 15B. After that, the resist pattern 49 is removed by wet treatment using a chemical solution, such as a SPM solution, or ashing.

As in the case of the first sidewall insulating film 11, reduction in the thickness of the second sidewall insulating film 12 may cause a defect, such as disappearance of a portion of the second sidewall insulating film 12 or perforation of the second sidewall insulating film 12, in the second sidewall insulating film 12. When the resist pattern 49 is removed by the wet treatment using the chemical solution, the second sidewall insulating film 12 is exposed to the chemical solution. When the protruding portions 31 of the element isolation insulating film 3 are not provided at the element isolation insulating film 3, the chemical solution infiltrates from defects in the first sidewall insulating film 11 and the second sidewall insulating film 12 into below the dummy gate electrode 45, and the gate insulating film 8 is exposed to the chemical solution. The exposure of the gate insulating film 8 to the chemical solution causes the gate insulating film 8 to dissolve in the chemical solution, thus leading to disappearance of a portion of the gate insulating film 8.

As illustrated in FIGS. 15A to 15C, the protruding portions 31 are provided at the element isolation insulating film 3 so as to cover the side surfaces of the dummy gate electrodes 45 in the gate width direction of the dummy gate electrode 45. For this reason, the side surfaces of the dummy gate electrodes 45 in the gate width direction of the dummy gate electrode 45 and the first sidewall insulating film 11 and second sidewall insulating film 12 are not in contact. This configuration inhibits a chemical solution from infiltrating in the gate width direction of the dummy gate electrode 45 into between the element isolation insulating film 3 and the dummy gate electrode 45 and between the semiconductor substrate 2 and the dummy gate electrode 45. The gate insulating films 8 are thus inhibited from degrading due to the wet treatment using the chemical solution at the time of the removal of the resist pattern 49.

Figure 16A:
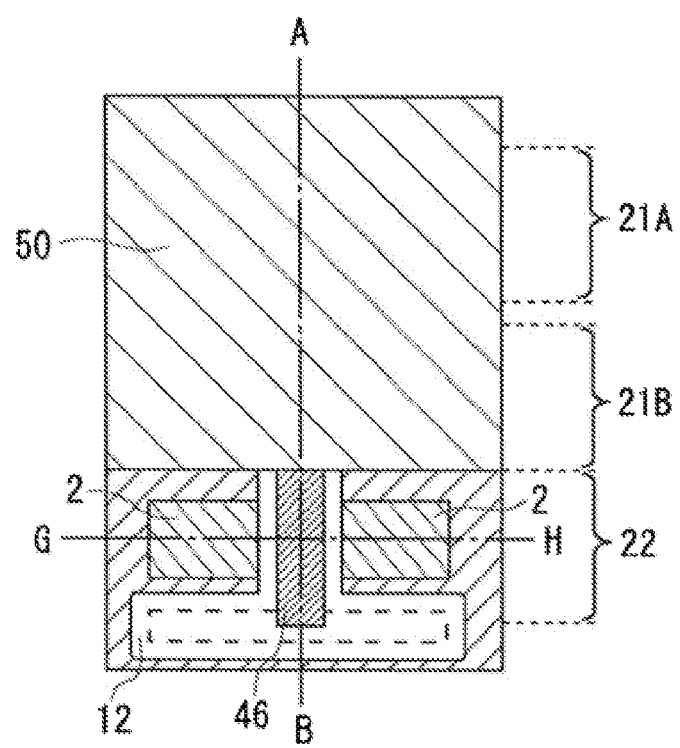
FIG. 16A is a plan view illustrating the method for manufacturing the semiconductor device according to the first embodiment.
Figure 16B:
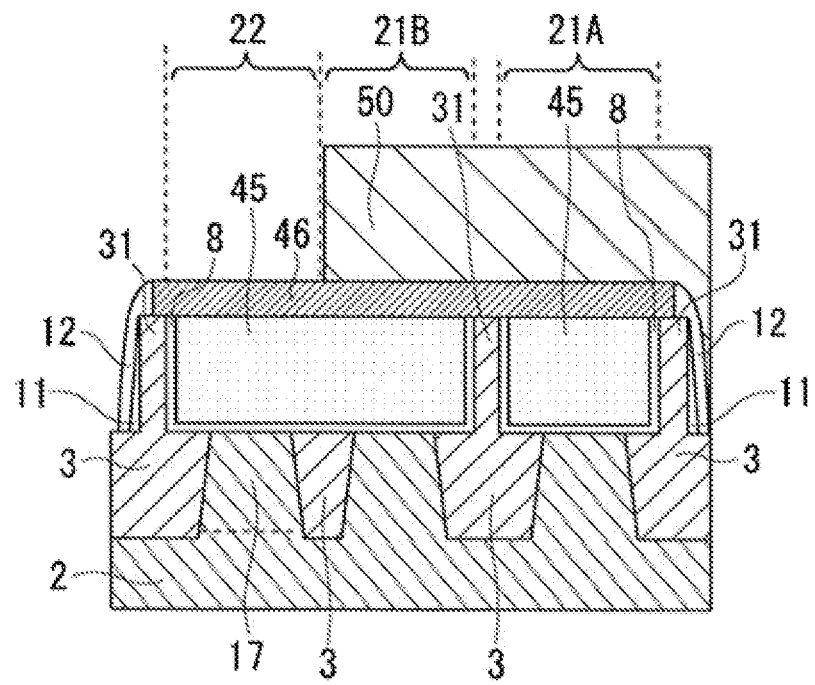
FIG. 16B is a cross-sectional view illustrating the method for manufacturing the semiconductor device according to the first embodiment and illustrates a cross-section taken along alternate long and short dash line A-B in FIG. 16A.
Figure 16C:
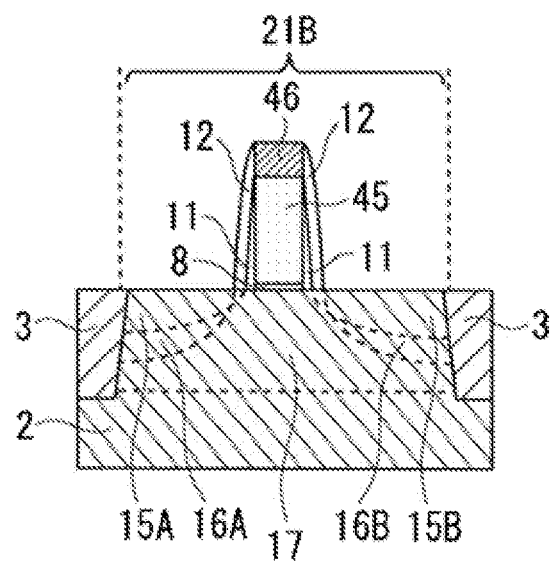
FIG. 16C is a cross-sectional view illustrating the method for manufacturing the semiconductor device according to the first embodiment and illustrates a cross-section taken along alternate long and short dash line G-H in FIG. 16A.

FIG. 16A is a plan view illustrating the method for manufacturing the semiconductor device 1 according to the first embodiment. FIG. 16B is a cross-sectional view illustrating the method for manufacturing the semiconductor device 1 according to the first embodiment and illustrates a cross-section taken along alternate long and short dash line A-B in FIG. 16A. FIG. 16C is a cross-sectional view illustrating the method for manufacturing the semiconductor device 1 according to the first embodiment and illustrates a cross-section taken along alternate long and short dash line G-H in FIG. 16A. In a step illustrated in FIGS. 16A to 16C, a resist pattern 50 which is open in the p-type MOS transistor formation region 22 is formed on the semiconductor substrate 2 by photolithography. Impurities are then ion-implanted using the second sidewall insulating film 12 and the resist pattern 50 as a mask, thereby forming the source-drain regions 16A and 16B in the semiconductor substrate 2 in the p-type MOS transistor formation region 22. In this case, for example, p-type impurities, such as boron, are ion-implanted. Since the hard mask 46 is formed on the dummy gate electrodes 45, the impurities are not implanted into the dummy gate electrodes 45. The source-drain regions 16A and 16B are not illustrated in FIGS. 16A and 16B. After that, the resist pattern 50 is removed by wet treatment using a chemical solution, such as a SPM solution, or ashing. Moreover, heat treatment is performed, thereby activating the impurities implanted in the semiconductor substrate 2.

When the resist pattern 50 is removed by the wet treatment using the chemical solution, the second sidewall insulating film 12 is exposed to the chemical solution. As illustrated in FIGS. 16A to 16C, the protruding portions 31 are provided at the element isolation insulating film 3 so as to cover the side surfaces of the dummy gate electrodes 45 in the gate width direction of the dummy gate electrode 45. For this reason, the side surfaces of the dummy gate electrodes 45 in the gate width direction of the dummy gate electrode 45 and the first sidewall insulating film 11 and second sidewall insulating film 12 are not in contact. This configuration inhibits a chemical solution from infiltrating in the gate width direction of the dummy gate electrode 45 into between the element isolation insulating film 3 and the dummy gate electrode 45 and between the semiconductor substrate 2 and the dummy gate electrode 45. The gate insulating films 8 are thus inhibited from degrading due to the wet treatment using the chemical solution at the time of the removal of the resist pattern 50.

Figure 17A:
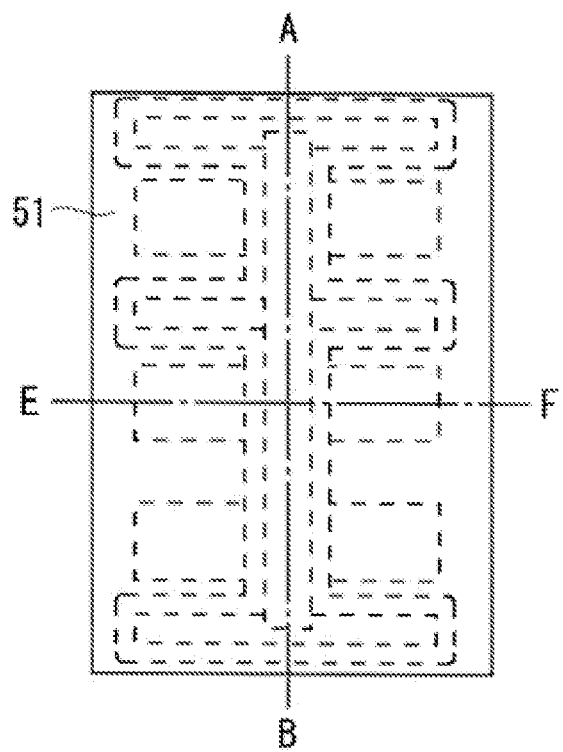
FIG. 17A is a plan view illustrating the method for manufacturing the semiconductor device according to the first embodiment.
Figure 17B:
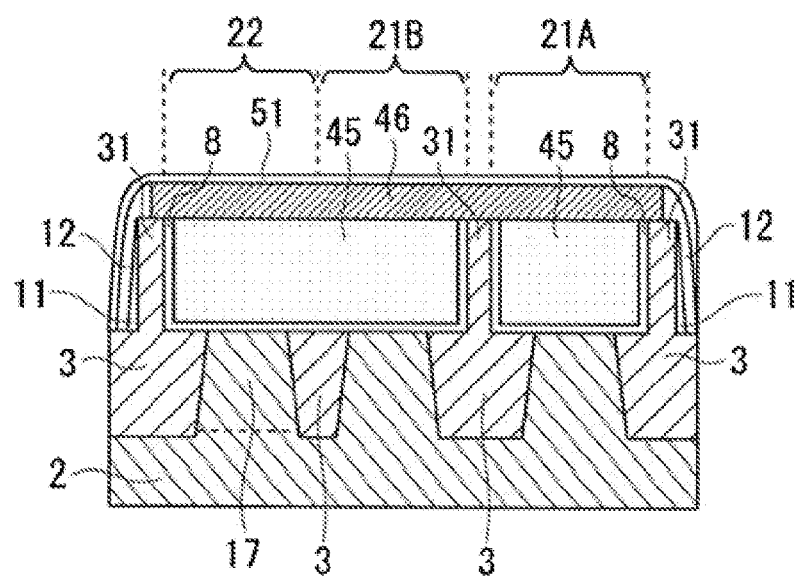
FIG. 17B is a cross-sectional view illustrating the method for manufacturing the semiconductor device according to the first embodiment and illustrates a cross-section taken along alternate long and short dash line A-B in FIG. 17A.
Figure 17C:
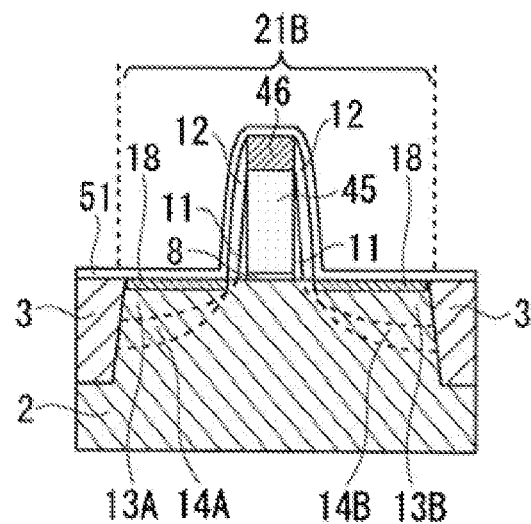
FIG. 17C is a cross-sectional view illustrating the method for manufacturing the semiconductor device according to the first embodiment and illustrates a cross-section taken along alternate long and short dash line E-F in FIG. 17A.

FIG. 17A is a plan view illustrating the method for manufacturing the semiconductor device 1 according to the first embodiment. FIG. 17B is a cross-sectional view illustrating the method for manufacturing the semiconductor device 1 according to the first embodiment and illustrates a cross-section taken along alternate long and short dash line A-B in FIG. 17A. FIG. 17C is a cross-sectional view illustrating the method for manufacturing the semiconductor device 1 according to the first embodiment and illustrates a cross-section taken along alternate long and short dash line E-F in FIG. 17A. In a step illustrated in FIGS. 17A to 17C, the surface of the semiconductor substrate 2 is cleaned by wet treatment using a chemical solution, such as hydrofluoric acid. Since a natural oxide formed on the semiconductor substrate 2 leads to a failure in silicide formation on the surface of the semiconductor substrate 2, the natural oxide formed on the surface of the semiconductor substrate 2 is removed by cleaning the surface of the semiconductor substrate 2. After that, a metal film 51 of, for example, Ni (nickel), Ti (titanium), Co (cobalt), or the like is formed on the semiconductor substrate 2 and is subjected to heat treatment. With the heat treatment, the silicides 18 are formed at the surface of the semiconductor substrate 2 in the n-type MOS transistor formation regions 21A and 21B and the p-type MOS transistor formation region 22.

When the surface of the semiconductor substrate 2 is cleaned by the wet treatment using the chemical solution, the second sidewall insulating film 12 is exposed to the chemical solution. As illustrated in FIGS. 17A to 17C, the protruding portions 31 are provided at the element isolation insulating film 3 so as to cover the side surfaces of the dummy gate electrodes 45 in the gate width direction of the dummy gate electrode 45. For this reason, the side surfaces of the dummy gate electrodes 45 in the gate width direction of the dummy gate electrode 45 and the first sidewall insulating film 11 and second sidewall insulating film 12 are not in contact. This configuration inhibits a chemical solution from infiltrating in the gate width direction of the dummy gate electrode 45 into between the element isolation insulating film 3 and the dummy gate electrode 45 and between the semiconductor substrate 2 and the dummy gate electrode 45. The gate insulating films 8 are thus inhibited from degrading due to the wet treatment using the chemical solution at the time of the cleaning of the surface of the semiconductor substrate 2.

Figure 18A:
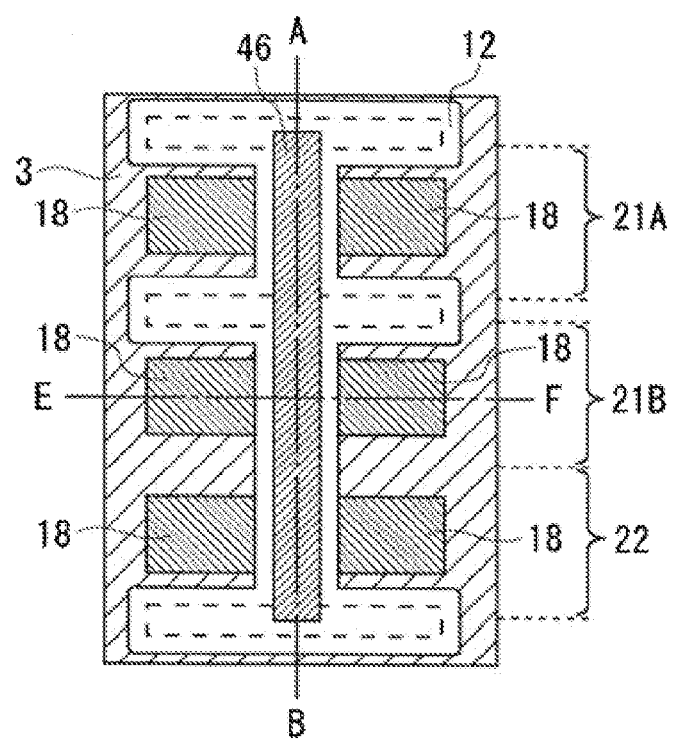
FIG. 18A is a plan view illustrating the method for manufacturing the semiconductor device according to the first embodiment.
Figure 18B:
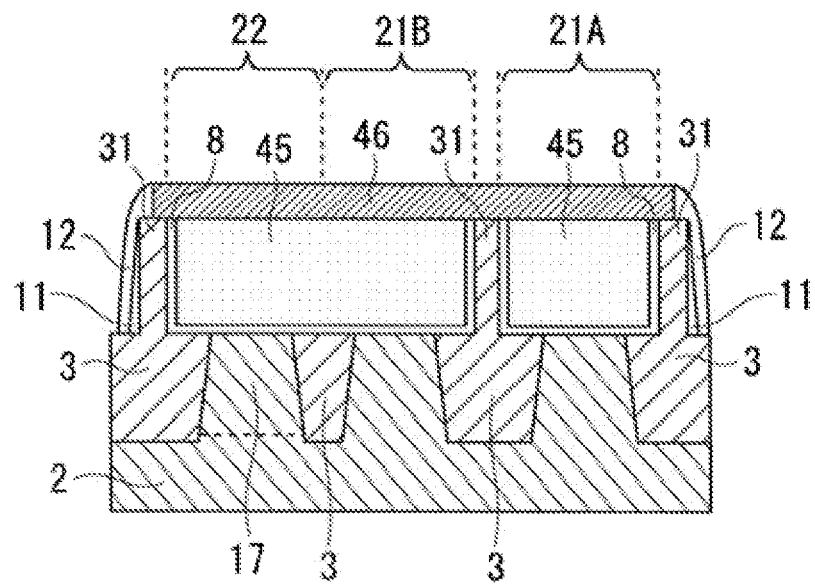
FIG. 18B is a cross-sectional view illustrating the method for manufacturing the semiconductor device according to the first embodiment and illustrates a cross-section taken along alternate long and short dash line A-B in FIG. 18A.
Figure 18C:
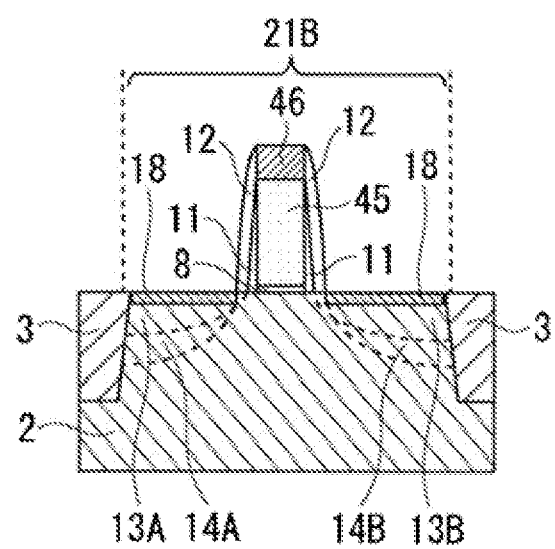
FIG. 18C is a cross-sectional view illustrating the method for manufacturing the semiconductor device according to the first embodiment and illustrates a cross-section taken along alternate long and short dash line E-F in FIG. 18A.

FIG. 18A is a plan view illustrating the method for manufacturing the semiconductor device 1 according to the first embodiment. FIG. 18B is a cross-sectional view illustrating the method for manufacturing the semiconductor device 1 according to the first embodiment and illustrates a cross-section taken along alternate long and short dash line A-B in FIG. 18A. FIG. 18C is a cross-sectional view illustrating the method for manufacturing the semiconductor device 1 according to the first embodiment and illustrates a cross-section taken along alternate long and short dash line E-F in FIG. 18A. In a step illustrated in FIGS. 18A to 18C, the unreacted metal film 51 is selectively removed by wet treatment using a chemical solution, such as a SPM solution.

When the unreacted metal film 51 is removed by the wet treatment using the chemical solution, the second sidewall insulating film 12 is exposed to the chemical solution. As illustrated in FIGS. 18A to 18C, the protruding portions 31 are provided at the element isolation insulating film 3 so as to cover the side surfaces of the dummy gate electrodes 45 in the gate width direction of the dummy gate electrode 45. For this reason, the side surfaces of the dummy gate electrode 45 in the gate width direction of the dummy gate electrode 45 and the first sidewall insulating film 11 and second sidewall insulating film 12 are not in contact. This configuration inhibits a chemical solution from infiltrating in the gate width direction of the dummy gate electrode 45 into between the element isolation insulating film 3 and the dummy gate electrode 45 and between the semiconductor substrate 2 and the dummy gate electrode 45. The gate insulating films 8 are thus inhibited from degrading due to the wet treatment using the chemical solution at the time of the removal of the unreacted metal film 51.

Figure 19A:
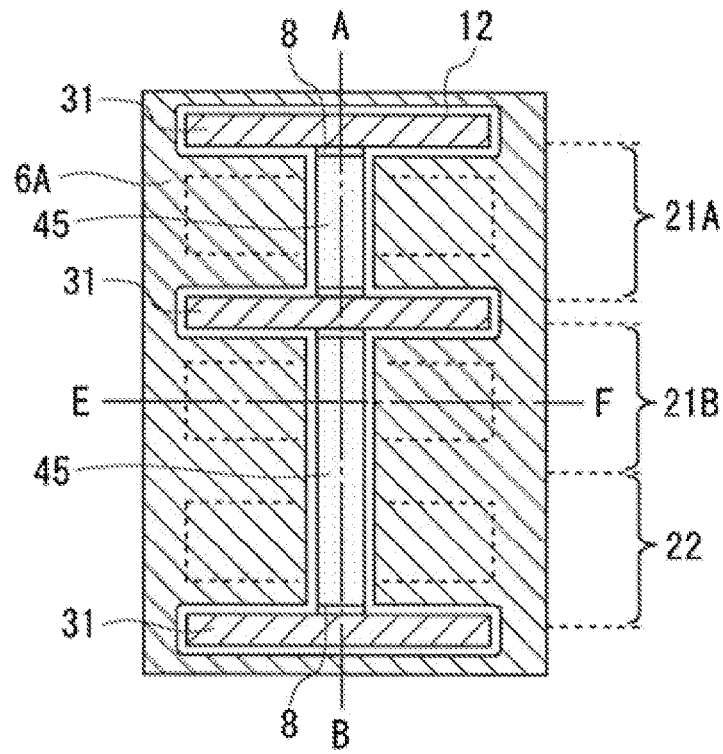
FIG. 19A is a plan view illustrating the method for manufacturing the semiconductor device according to the first embodiment.
Figure 19B:
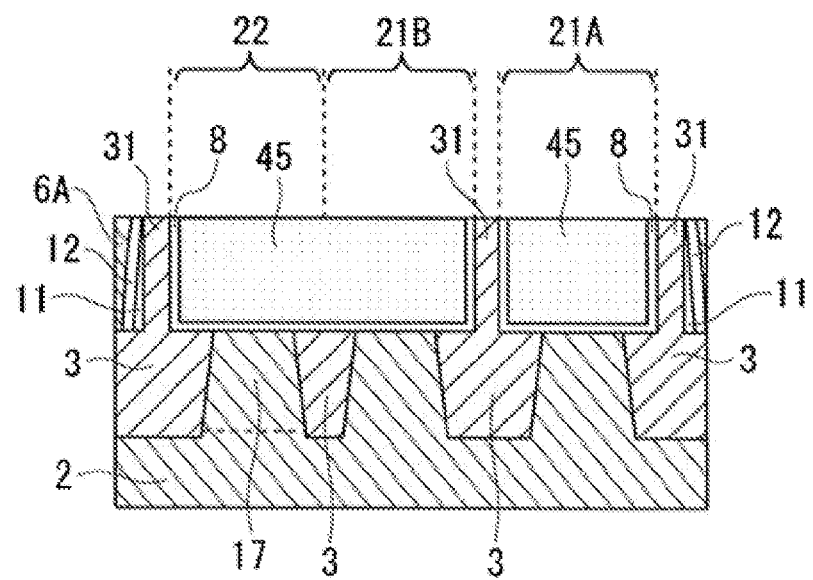
FIG. 19B is a cross-sectional view illustrating the method for manufacturing the semiconductor device according to the first embodiment and illustrates a cross-section taken along alternate long and short dash line A-B in FIG. 19A.
Figure 19C:
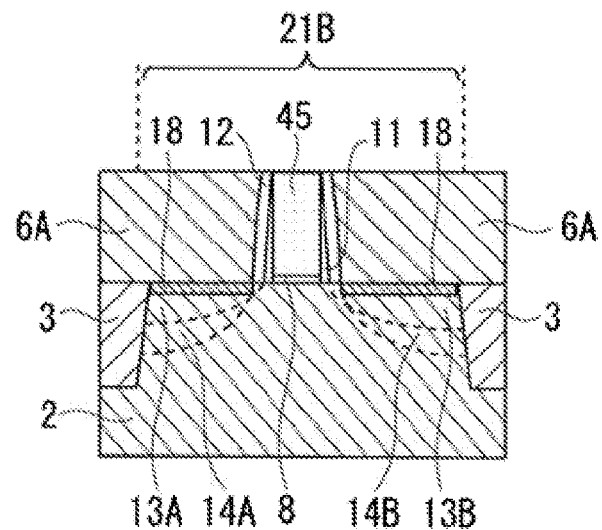
FIG. 19C is a cross-sectional view illustrating the method for manufacturing the semiconductor device according to the first embodiment and illustrates a cross-section taken along alternate long and short dash line E-F in FIG. 19A.

FIG. 19A is a plan view illustrating the method for manufacturing the semiconductor device 1 according to the first embodiment. FIG. 19B is a cross-sectional view illustrating the method for manufacturing the semiconductor device 1 according to the first embodiment and illustrates a cross-section taken along alternate long and short dash line A-B in FIG. 19A. FIG. 19C is a cross-sectional view illustrating the method for manufacturing the semiconductor device 1 according to the first embodiment and illustrates a cross-section taken along alternate long and short dash line E-F in FIG. 19A. In a step illustrated in FIGS. 19A to 19C, the interlayer insulating film 6A is formed on the semiconductor substrate 2 by, for example, CVD method. The interlayer insulating film 6A is an example of a first insulating film. The interlayer insulating film 6A is formed on the semiconductor substrate 2 so as to surround the dummy gate electrodes 45. The interlayer insulating film 6A is, for example, a $SiO_2$ film. After that, the interlayer insulating film 6A is polished by CMP, and the hard mask 46 is removed, thereby exposing the protruding portions 31 of the element isolation insulating film 3 and the dummy gate electrodes 45 from the interlayer insulating film 6A.

Figure 20A:
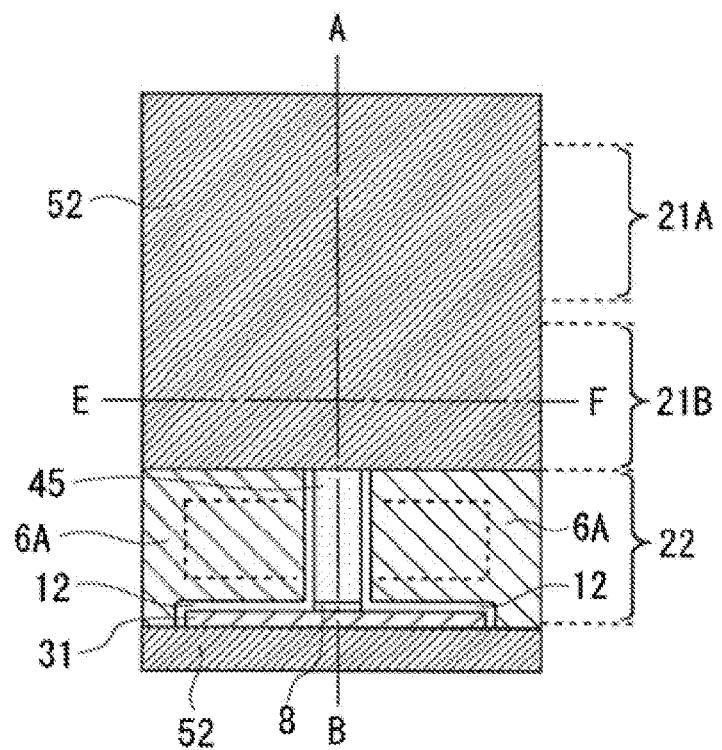
FIG. 20A is a plan view illustrating the method for manufacturing the semiconductor device according to the first embodiment.
Figure 20B:
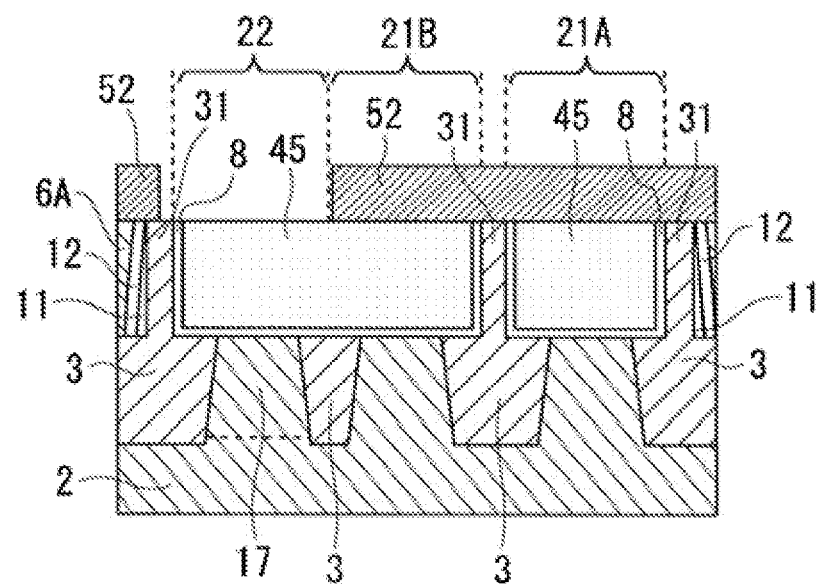
FIG. 20B is a cross-sectional view illustrating the method for manufacturing the semiconductor device according to the first embodiment and illustrates a cross-section taken along alternate long and short dash line A-B in FIG. 20A.
Figure 20C:
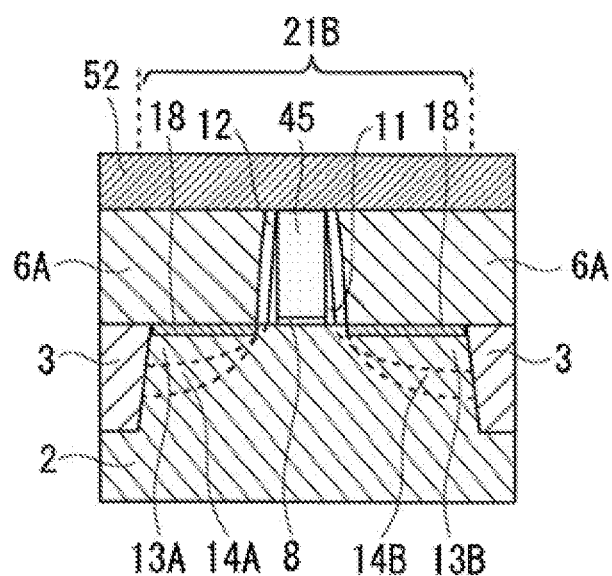
FIG. 20C is a cross-sectional view illustrating the method for manufacturing the semiconductor device according to the first embodiment and illustrates a cross-section taken along alternate long and short dash line E-F in FIG. 20A.

FIG. 20A is a plan view illustrating the method for manufacturing the semiconductor device 1 according to the first embodiment. FIG. 20B is a cross-sectional view illustrating the method for manufacturing the semiconductor device 1 according to the first embodiment and illustrates a cross-section taken along alternate long and short dash line A-B in FIG. 20A. FIG. 20C is a cross-sectional view illustrating the method for manufacturing the semiconductor device 1 according to the first embodiment and illustrates a cross-section taken along alternate long and short dash line E-F in FIG. 20A. In a step illustrated in FIGS. 20A to 20C, a hard mask 52 is formed on the interlayer insulating film 6A. The hard mask 52 is, for example, a SiN film or a laminated film of a SiN film and a $SiO_2$ film. A resist pattern is then formed on the hard mask 52 by photolithography. After that, the hard mask 52 is patterned by performing anisotropic dry etching, such as RIE, using the resist pattern on the hard mask 52 as a mask. With the patterning, the hard mask 52 that is open in the p-type MOS transistor formation region 22 is formed on the interlayer insulating film 6A. The hard mask 52 covers the dummy gate electrodes 45 in the n-type MOS transistor formation regions 21A and 21B. For example, $CF_4$ gas, $C_4F_8$ gas, $CHF_3$ gas, or the like is used as an etching gas.

Figure 21A:
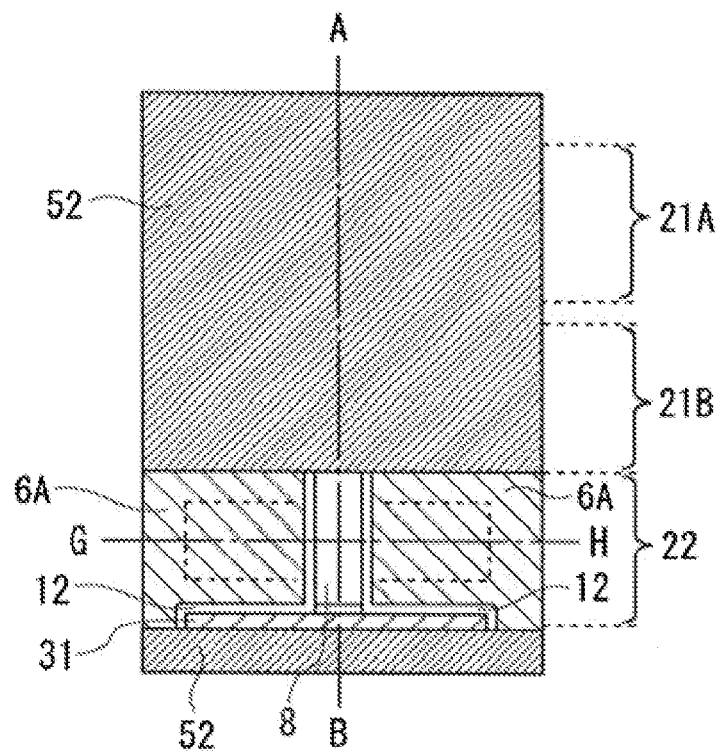
FIG. 21A is a plan view illustrating the method for manufacturing the semiconductor device according to the first embodiment.
Figure 21B:
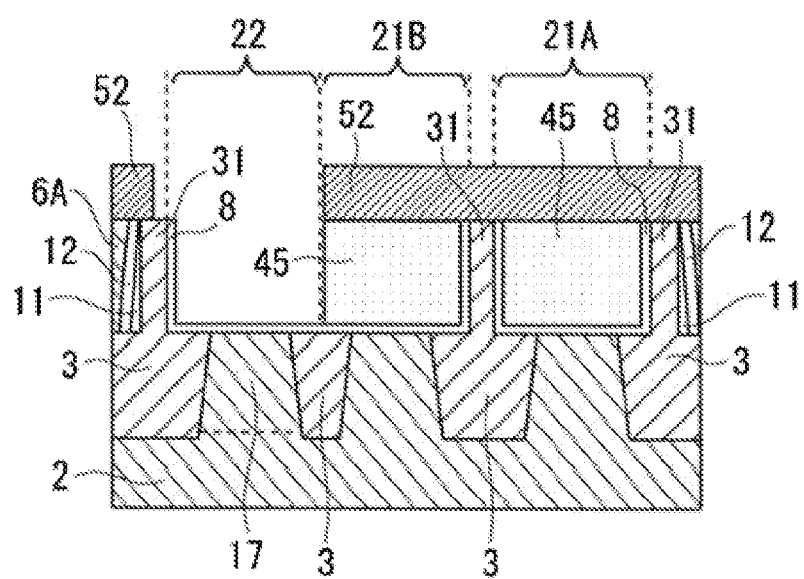
FIG. 21B is a cross-sectional view illustrating the method for manufacturing the semiconductor device according to the first embodiment and illustrates a cross-section taken along alternate long and short dash line A-B in FIG. 21A.
Figure 21C:
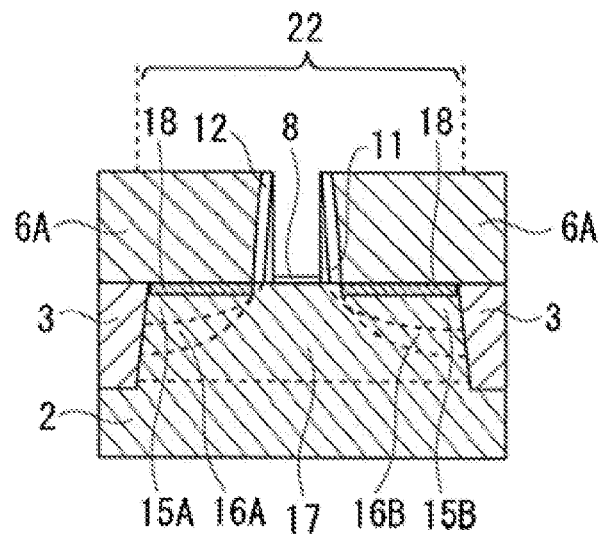
FIG. 21C is a cross-sectional view illustrating the method for manufacturing the semiconductor device according to the first embodiment and illustrates a cross-section taken along alternate long and short dash line G-H in FIG. 21A.

FIG. 21A is a plan view illustrating the method for manufacturing the semiconductor device 1 according to the first embodiment. FIG. 21B is a cross-sectional view illustrating the method for manufacturing the semiconductor device 1 according to the first embodiment and illustrates a cross-section taken along alternate long and short dash line A-B in FIG. 21A. FIG. 21C is a cross-sectional view illustrating the method for manufacturing the semiconductor device 1 according to the first embodiment and illustrates a cross-section taken along alternate long and short dash line G-H in FIG. 21A. In a step illustrated in FIGS. 21A to 21C, a portion of the dummy gate electrode 45 which is exposed from the hard mask 52 is removed by performing anisotropic dry etching, such as RIE, using the hard mask 52 as a mask. That is, the dummy gate electrode 45 in the p-type MOS transistor formation region 22 is removed. In this case, the dummy gate electrode 45 alone is selectively removed due to a difference in etch selectivity (etching rates) between the gate insulating film 8 and the dummy gate electrode 45. For example, $Cl_2$ gas, $Br_2$ gas, HBr gas, or the like is used as an etching gas. Wet etching using TMAH (Tetra Methyl Ammonium Hydroxide) may be performed together with the anisotropic dry etching.

Since the etch selectivity of the gate insulating film 8 is different from the etch selectivity of the dummy gate electrode 45, the gate insulating film 8 is not removed by the anisotropic etching performed at the time of the removal of the dummy gate electrode 45. However, when the gate insulating film 8 has been damaged by wet treatment using a chemical solution, the anisotropic dry etching may cause the gate insulating film 8 in the p-type MOS transistor formation region 22 to be penetrated. When the anisotropic dry etching causes the gate insulating film 8 to be penetrated, the semiconductor substrate 2 in the p-type MOS transistor formation region 22 is shaved off, which degrades the characteristics of the p-type MOS transistor 5. In the first embodiment, the gate insulating films 8 are inhibited from degrading due to wet treatment using a chemical solution. For this reason, when the dummy gate electrode 45 is removed, the anisotropic dry etching is inhibited from causing the gate insulating film 8 in the p-type MOS transistor formation region 22 to be penetrated.

Figure 22A:
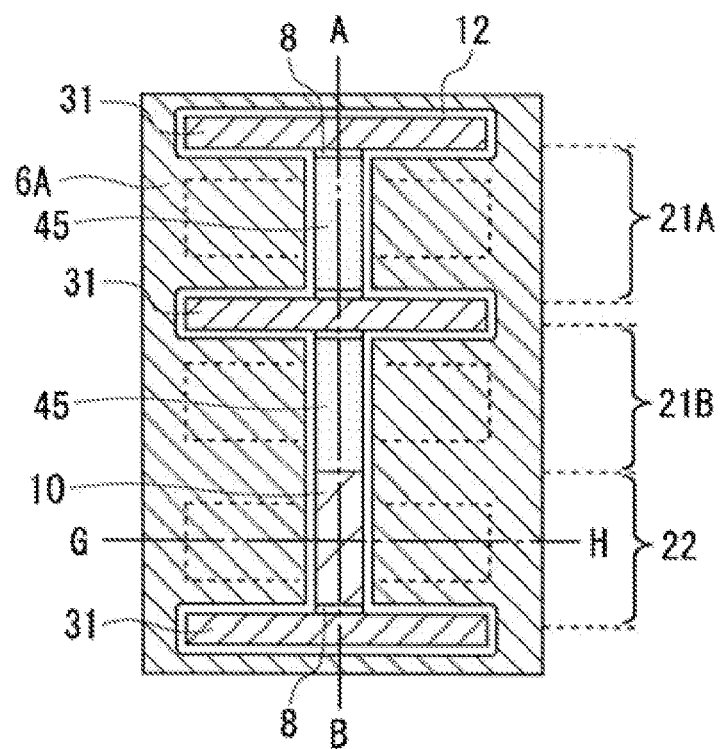
FIG. 22A is a plan view illustrating the method for manufacturing the semiconductor device according to the first embodiment.
Figure 22B:
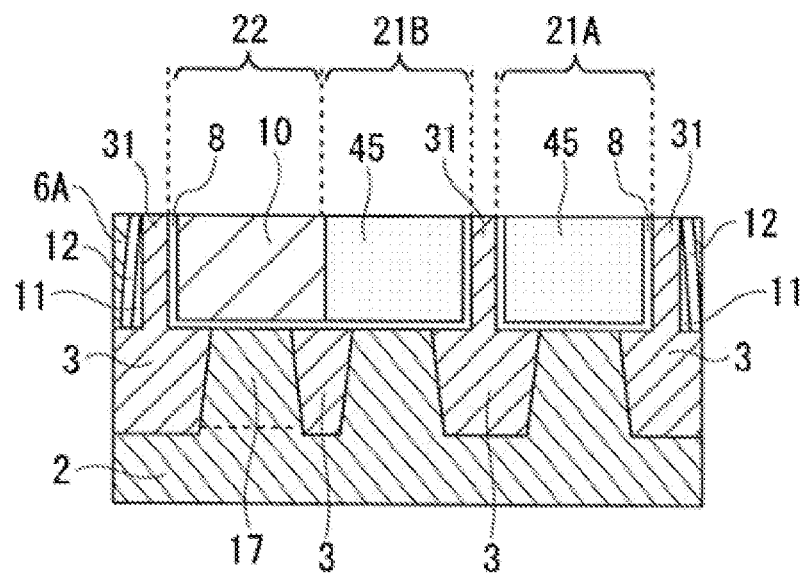
FIG. 22B is a cross-sectional view illustrating the method for manufacturing the semiconductor device according to the first embodiment and illustrates a cross-section taken along alternate long and short dash line A-B in FIG. 22A.
Figure 22C:
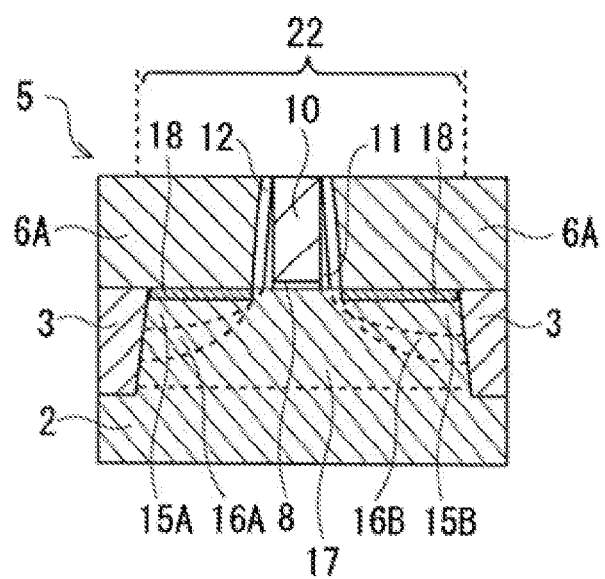
FIG. 22C is a cross-sectional view illustrating the method for manufacturing the semiconductor device according to the first embodiment and illustrates a cross-section taken along alternate long and short dash line G-H in FIG. 22A.

FIG. 22A is a plan view illustrating the method for manufacturing the semiconductor device 1 according to the first embodiment. FIG. 22B is a cross-sectional view illustrating the method for manufacturing the semiconductor device 1 according to the first embodiment and illustrates a cross-section taken along alternate long and short dash line A-B in FIG. 22A. FIG. 22C is a cross-sectional view illustrating the method for manufacturing the semiconductor device 1 according to the first embodiment and illustrates a cross-section taken along alternate long and short dash line G-H in FIG. 22A. In a step illustrated in FIGS. 22A to 22C, a metal film of, e.g., TiN (titanium nitride), TaN (tantalum nitride), W (tungsten), or the like is formed on the interlayer insulating film 6A and the hard mask 52 by, for example, sputtering method. In this case, a portion, from which the dummy gate electrode 45 has been removed, in the p-type MOS transistor formation region 22 is filled up with the metal film. After that, the metal film is planarized by CMP, and the hard mask 52 is removed. With the operation, the gate electrode 10 is formed on the gate insulating film 8 in the p-type MOS transistor formation region 22. When a metal film is used as the material for the gate electrode 10, the gate electrode 10 is also referred to as a metal gate electrode.

Figure 23A:
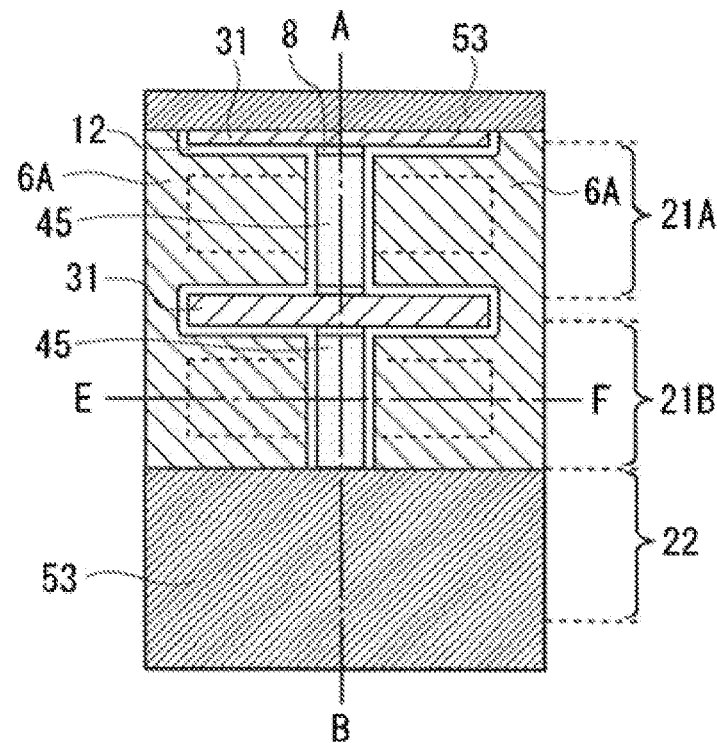
FIG. 23A is a plan view illustrating the method for manufacturing the semiconductor device according to the first embodiment.
Figure 23B:
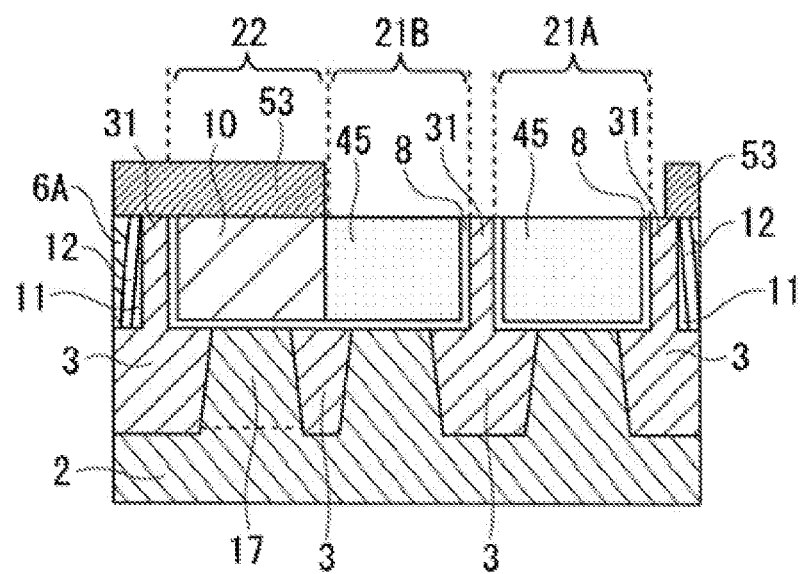
FIG. 23B is a cross-sectional view illustrating the method for manufacturing the semiconductor device according to the first embodiment and illustrates a cross-section taken along alternate long and short dash line A-B in FIG. 23A.
Figure 23C:
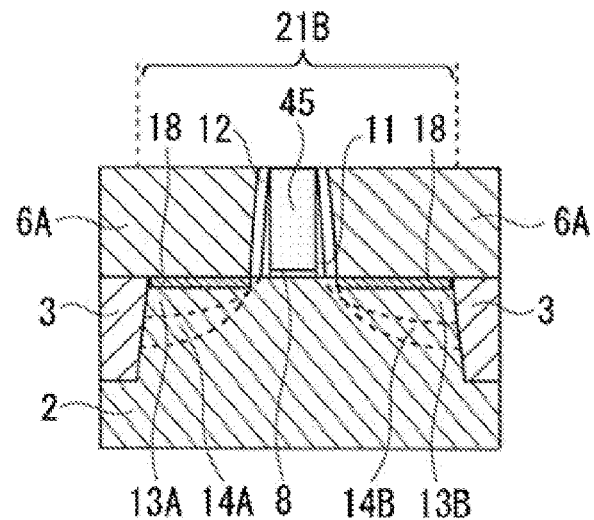
FIG. 23C is a cross-sectional view illustrating the method for manufacturing the semiconductor device according to the first embodiment and illustrates a cross-section taken along alternate long and short dash line E-F in FIG. 23A.

FIG. 23A is a plan view illustrating the method for manufacturing the semiconductor device 1 according to the first embodiment. FIG. 23B is a cross-sectional view illustrating the method for manufacturing the semiconductor device 1 according to the first embodiment and illustrates a cross-section taken along alternate long and short dash line A-B in FIG. 23A. FIG. 23C is a cross-sectional view illustrating the method for manufacturing the semiconductor device 1 according to the first embodiment and illustrates a cross-section taken along alternate long and short dash line E-F in FIG. 23A. In a step illustrated in FIGS. 23A to 23C, a hard mask 53 is formed on the interlayer insulating film 6A. The hard mask 53 is, for example, a SiN film or a laminated film of a SiN film and a $SiO_2$ film. A resist pattern is then formed on the hard mask 53 by photolithography. After that, the hard mask 53 is patterned by performing anisotropic dry etching, such as RIE, using the resist pattern on the hard mask 53 as a mask. With the patterning, the hard mask 53 that is open in the n-type MOS transistor formation regions 21A and 21B is formed on the interlayer insulating film 6A. The hard mask 53 covers the gate electrode 10 in the p-type MOS transistor formation region 22. For example, $CF_4$ gas, $C_4F_8$ gas, $CHF_2$ gas, or the like is used as an etching gas.

Figure 24A:
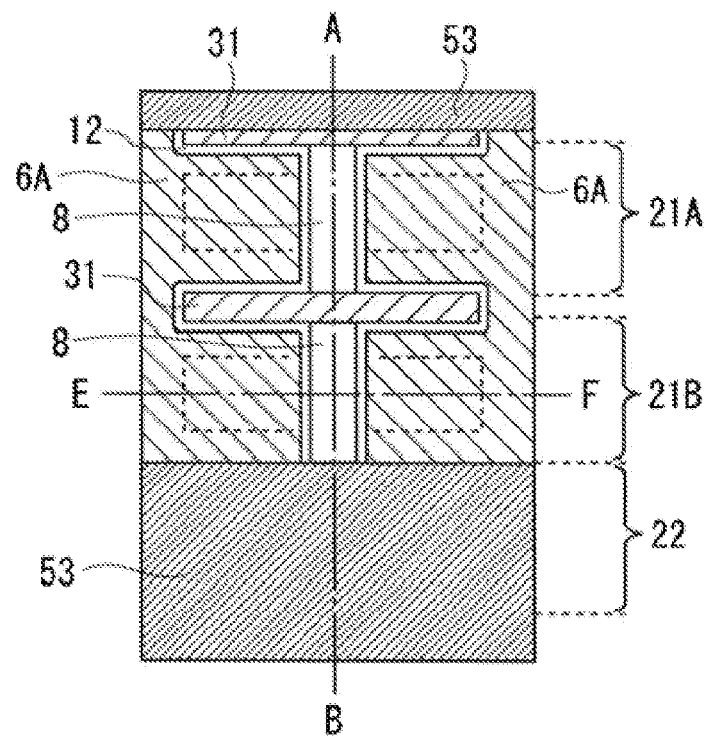
FIG. 24A is a plan view illustrating the method for manufacturing the semiconductor device according to the first embodiment.
Figure 24B:
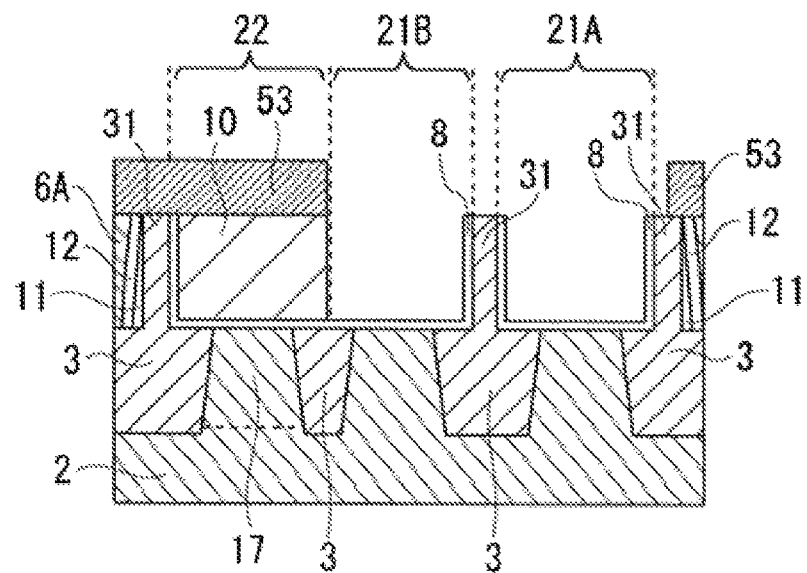
FIG. 24B is a cross-sectional view illustrating the method for manufacturing the semiconductor device according to the first embodiment and illustrates a cross-section taken along alternate long and short dash line A-B in FIG. 24A.
Figure 24C:
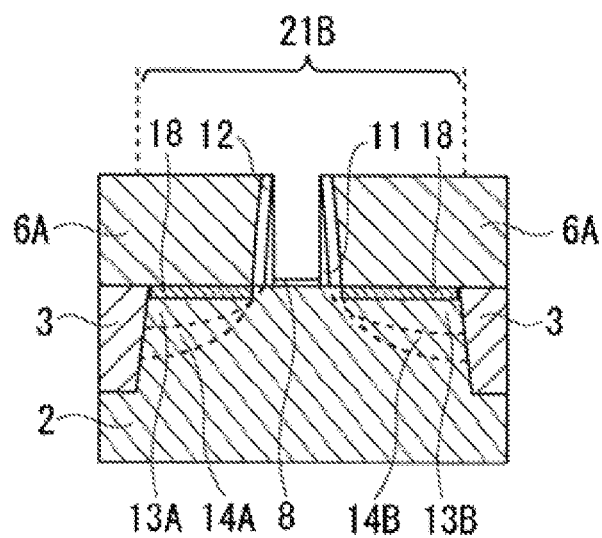
FIG. 24C is a cross-sectional view illustrating the method for manufacturing the semiconductor device according to the first embodiment and illustrates a cross-section taken along alternate long and short dash line E-F in FIG. 24A.

FIG. 24A is a plan view illustrating the method for manufacturing the semiconductor device 1 according to the first embodiment. FIG. 24B is a cross-sectional view illustrating the method for manufacturing the semiconductor device 1 according to the first embodiment and illustrates a cross-section taken along alternate long and short dash line A-B in FIG. 24A. FIG. 24C is a cross-sectional view illustrating the method for manufacturing the semiconductor device 1 according to the first embodiment and illustrates a cross-section taken along alternate long and short dash line E-F in FIG. 24A. In a step illustrated in FIGS. 24A to 24C, the dummy gate electrodes 45 that are exposed from the hard mask 53 are removed by performing anisotropic dry etching, such as RIE, using the hard mask 53 as a mask. That is, the dummy gate electrodes 45 in the n-type MOS transistor formation regions 21A and 21B are removed. In this case, the dummy gate electrodes 45 alone are selectively removed due to a difference in etch selectivity between the gate insulating film 8 and the dummy gate electrodes 45. For example, $Cl_2$ gas, $Br_2$ gas, HBr gas, or the like is used as an etching gas. Wet etching using TMAH may be performed together with the anisotropic dry etching.

Since the etch selectivity of the gate insulating film 8 is different from the etch selectivity of the dummy gate electrode 45, the gate insulating films 8 are not removed by the anisotropic etching performed at the time of the removal of the dummy gate electrodes 45. However, when the gate insulating films 8 have been damaged by wet treatment using a chemical solution, the anisotropic dry etching may cause the gate insulating films 8 in the n-type MOS transistor formation regions 21A and 21B to be penetrated. When the anisotropic dry etching causes the gate insulating films 8 to be penetrated, the semiconductor substrate 2 in the n-type MOS transistor formation regions 21A and 21B is shaved off, which degrades the characteristics of the n-type MOS transistors 4A and 4B. In the first embodiment, the gate insulating films 8 are inhibited from degrading due to wet treatment using a chemical solution. For this reason, when the dummy gate electrodes 45 are removed, the anisotropic dry etching is inhibited from causing the gate insulating films 8 in the n-type MOS transistor formation regions 21A and 21B to be penetrated.

Figure 25A:
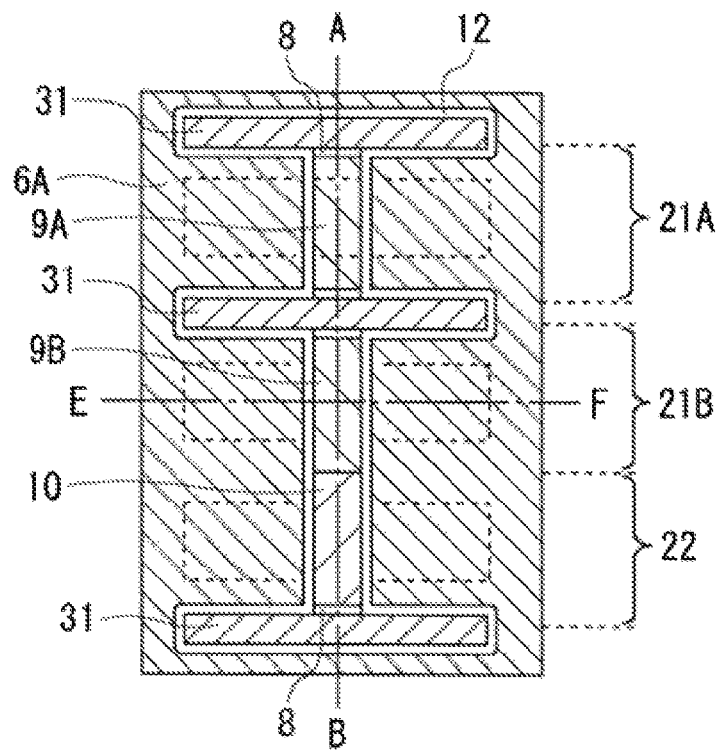
FIG. 25A is a plan view illustrating the method for manufacturing the semiconductor device according to the first embodiment.
Figure 25B:
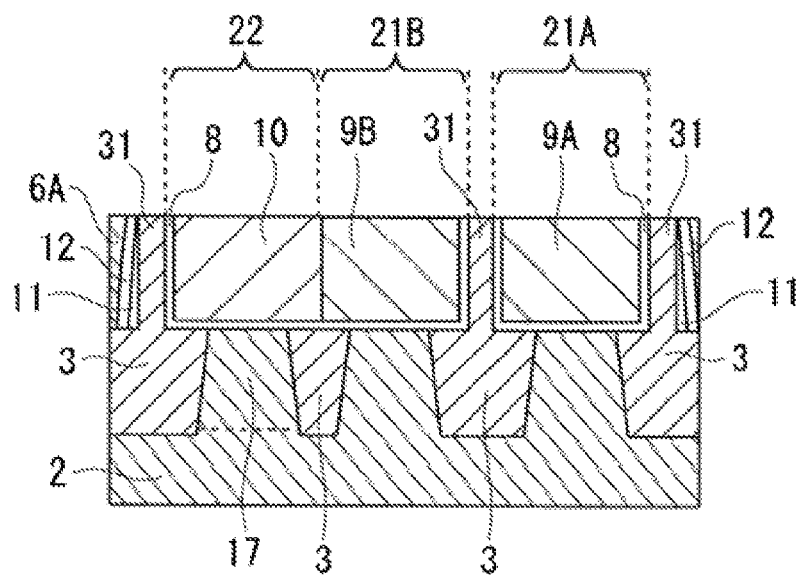
FIG. 25B is a cross-sectional view illustrating the method for manufacturing the semiconductor device according to the first embodiment and illustrates a cross-section taken along alternate long and short dash line A-B in FIG. 25A.
Figure 25C:
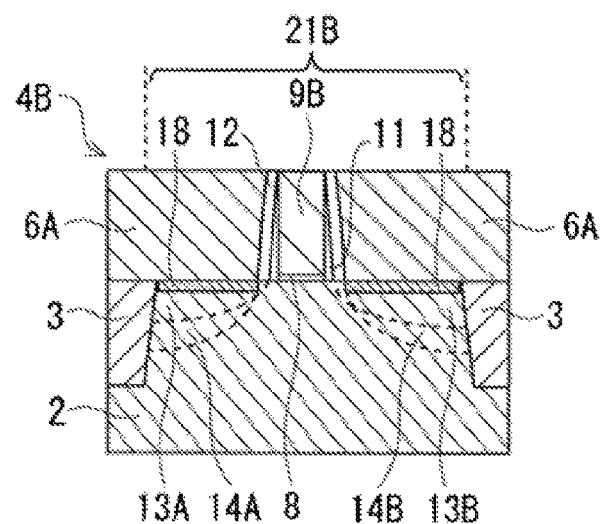
FIG. 25C is a cross-sectional view illustrating the method for manufacturing the semiconductor device according to the first embodiment and illustrates a cross-section taken along alternate long and short dash line E-F in FIG. 25A.

FIG. 25A is a plan view illustrating the method for manufacturing the semiconductor device 1 according to the first embodiment. FIG. 25B is a cross-sectional view illustrating the method for manufacturing the semiconductor device 1 according to the first embodiment and illustrates a cross-section taken along alternate long and short dash line A-B in FIG. 25A. FIG. 25C is a cross-sectional view illustrating the method for manufacturing the semiconductor device 1 according to the first embodiment and illustrates a cross-section taken along alternate long and short dash line E-F in FIG. 25A. In a step illustrated in FIGS. 25A to 25C, a metal film of, e.g., TiN, TaN, W, or the like is formed on the interlayer insulating film 6A and the hard mask 53 by, for example, sputtering method. In this case, portions, from which the dummy gate electrodes 45 have been removed, in the n-type MOS transistor formation regions 21A and 21B are filled up with the metal film. After that, the metal film is planarized by CMP, and the hard mask 53 is removed. With the operation, the gate electrode 9A is formed on the gate insulating film 8 in the n-type MOS transistor formation region 21A, and the gate electrode 9B is formed on the gate insulating film 8 in the n-type MOS transistor formation region 21B. When a metal film is used as the materials for the gate electrodes 9A and 9B, the gate electrodes 9A and 9B are also referred to as metal gate electrodes.

When the protruding portions 31 are not provided at the element isolation insulating film 3, portions of the first sidewall insulating film 11 and the second sidewall insulating film 12 may disappear at the time of wet treatment using a chemical solution. In this case, side surfaces of the dummy gate electrodes 45 in the gate width direction of the dummy gate electrode 45 may be exposed, and the side surfaces of the dummy gate electrodes 45 in the gate width direction of the dummy gate electrode 45 may be silicided at the time of the silicide formation at the surface of the semiconductor substrate 2. For this reason, silicided portions of the dummy gate electrodes 45 survive in the steps of removing the dummy gate electrodes 45. The survival of the silicided portions of the dummy gate electrodes 45 causes a failure in filling up with the metal films at the time of the formation of the gate electrodes 9A, 9B, and 10. Additionally, the survival of the silicided portions of the dummy gate electrodes 45 disables formation of the gate electrodes 9A, 9B, and 10 with desired work functions. Since the protruding portions 31 are provided at the element isolation insulating film 3 in the first embodiment, side surfaces of the dummy gate electrodes 45 in the gate width direction of the dummy gate electrode 45 are inhibited from being exposed in wet treatment using a chemical solution. This inhibits the side surfaces of the dummy gate electrodes 45 from being silicided at the time of the silicide formation at the surface of the semiconductor substrate 2.

Figure 26A:
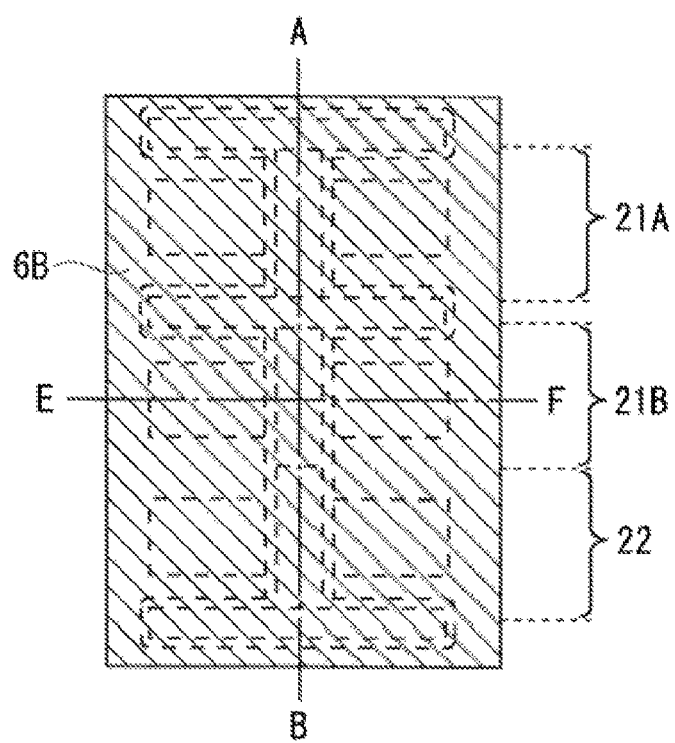
FIG. 26A is a plan view illustrating the method for manufacturing the semiconductor device according to the first embodiment.
Figure 26B:
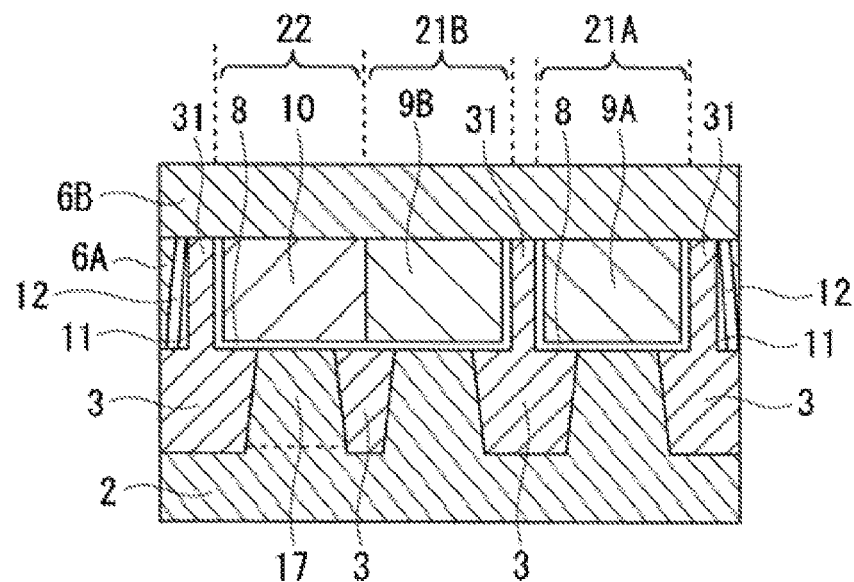
FIG. 26B is a cross-sectional view illustrating the method for manufacturing the semiconductor device according to the first embodiment and illustrates a cross-section taken along alternate long and short dash line A-B in FIG. 26A.
Figure 26C:
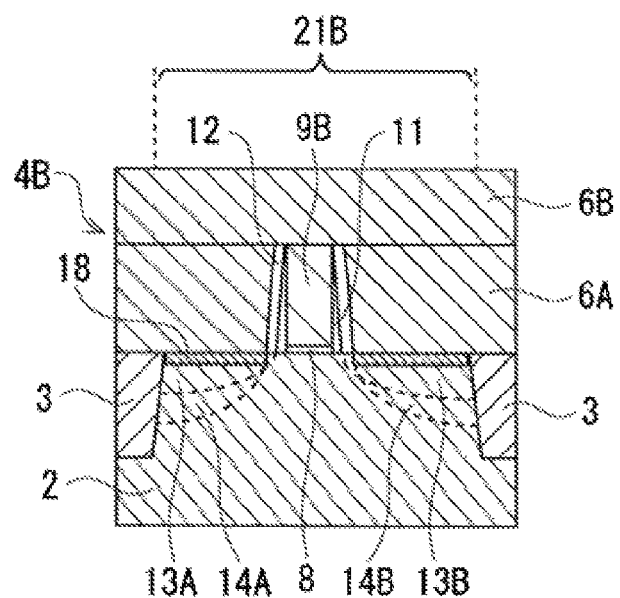
FIG. 26C is a cross-sectional view illustrating the method for manufacturing the semiconductor device according to the first embodiment and illustrates a cross-section taken along alternate long and short dash line E-F in FIG. 26A.

FIG. 26A is a plan view illustrating the method for manufacturing the semiconductor device 1 according to the first embodiment. FIG. 26B is a cross-sectional view illustrating the method for manufacturing the semiconductor device 1 according to the first embodiment and illustrates a cross-section taken along alternate long and short dash line A-B in FIG. 26A. FIG. 26C is a cross-sectional view illustrating the method for manufacturing the semiconductor device 1 according to the first embodiment and illustrates a cross-section taken along alternate long and short dash line E-F in FIG. 26A. In a step illustrated in FIGS. 26A to 26C, the interlayer insulating film 6B is formed on the interlayer insulating film 6A by, for example, CVD method. The interlayer insulating film 6B is, for example, a $SiO_2$ film. The interlayer insulating film 6B is then planarized by CMP.

Figure 27A:
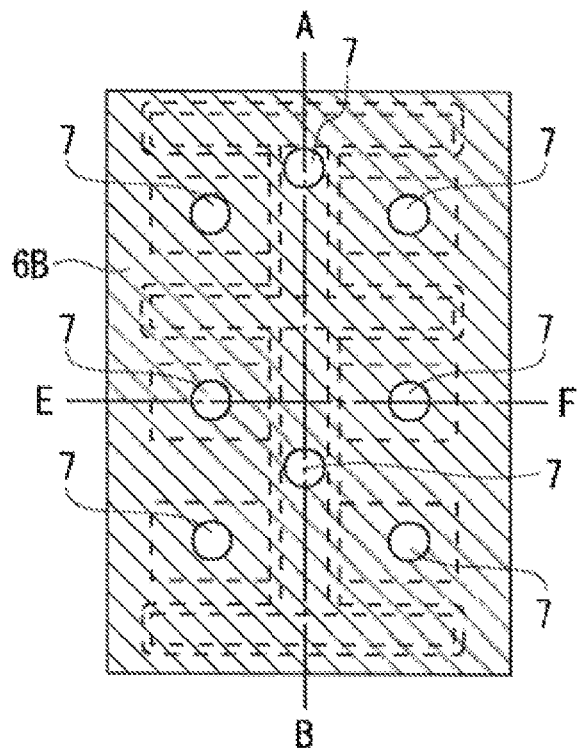
FIG. 27A is a plan view illustrating the method for manufacturing the semiconductor device according to the first embodiment.
Figure 27B:
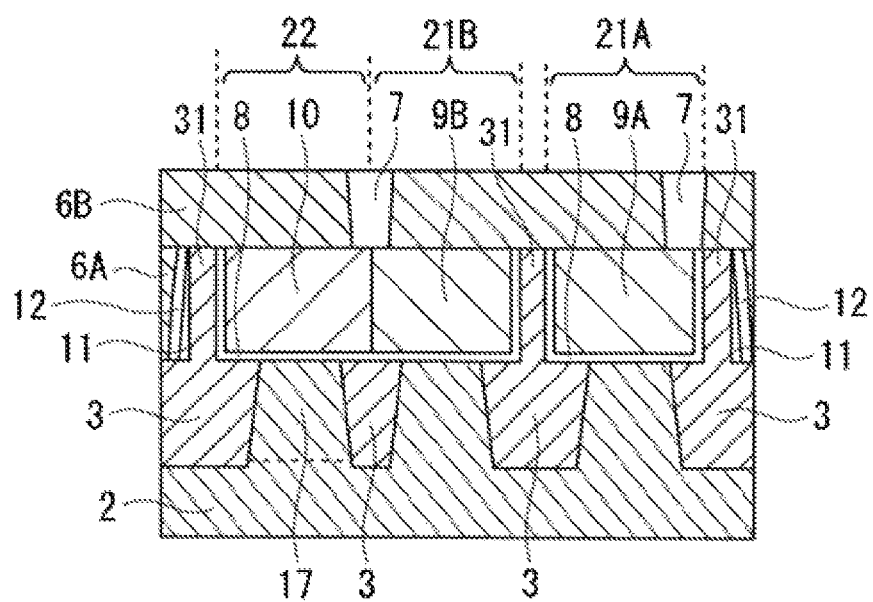
FIG. 27B is a cross-sectional view illustrating the method for manufacturing the semiconductor device according to the first embodiment and illustrates a cross-section taken along alternate long and short dash line A-B in FIG. 27A.
Figure 27C:
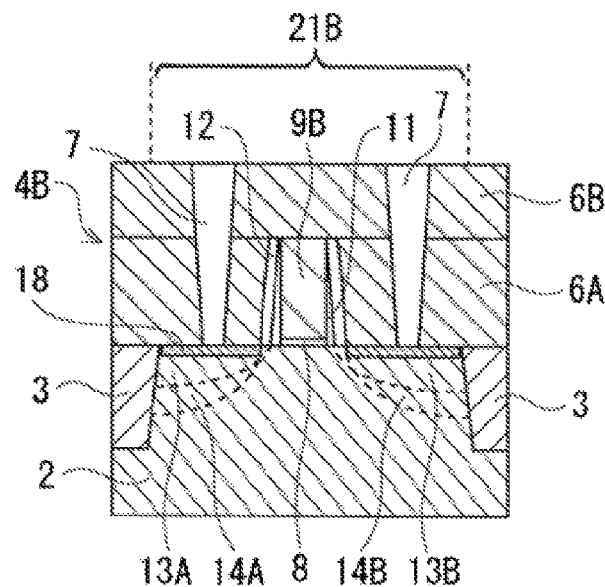
FIG. 27C is a cross-sectional view illustrating the method for manufacturing the semiconductor device according to the first embodiment and illustrates a cross-section taken along alternate long and short dash line E-F in FIG. 27A.

FIG. 27A is a plan view illustrating the method for manufacturing the semiconductor device 1 according to the first embodiment. FIG. 27B is a cross-sectional view illustrating the method for manufacturing the semiconductor device 1 according to the first embodiment and illustrates a cross-section taken along alternate long and short dash line A-B in FIG. 27A. FIG. 27C is a cross-sectional view illustrating the method for manufacturing the semiconductor device 1 according to the first embodiment and illustrates a cross-section taken along alternate long and short dash line E-F in FIG. 27A. In a step illustrated in FIGS. 27A to 27C, a resist pattern is formed on the interlayer insulating film 6B by photolithography using a photoresist mask having a pattern of openings in contact regions. Contact holes are then formed in the interlayer insulating film 6B by performing anisotropic etching, such as RIE, using the resist pattern on the interlayer insulating film 6B as a mask. After that, the resist pattern on the interlayer insulating film 6B is removed by wet treatment using a chemical solution or ashing. Moreover, a metal film of, e.g., TiN, TaN, W, or the like is formed in the contact holes formed in the interlayer insulating film 6B by, for example, CVD method. Furthermore, an excess metal film on the interlayer insulating film 6B is removed by CMP, thereby forming the contact plugs 7 in the interlayer insulating film 6B.

Second Embodiment

A method for manufacturing a semiconductor device 1 and the semiconductor device 1 according to a second embodiment will be described with reference to FIGS. 28A to 54C. The second embodiment will be described in the context of the semiconductor device 1 including a MOS transistor with a fin-type structure. The same components as those in the first embodiment are denoted by the same reference numerals, and a description thereof will be omitted.

Figure 28A:
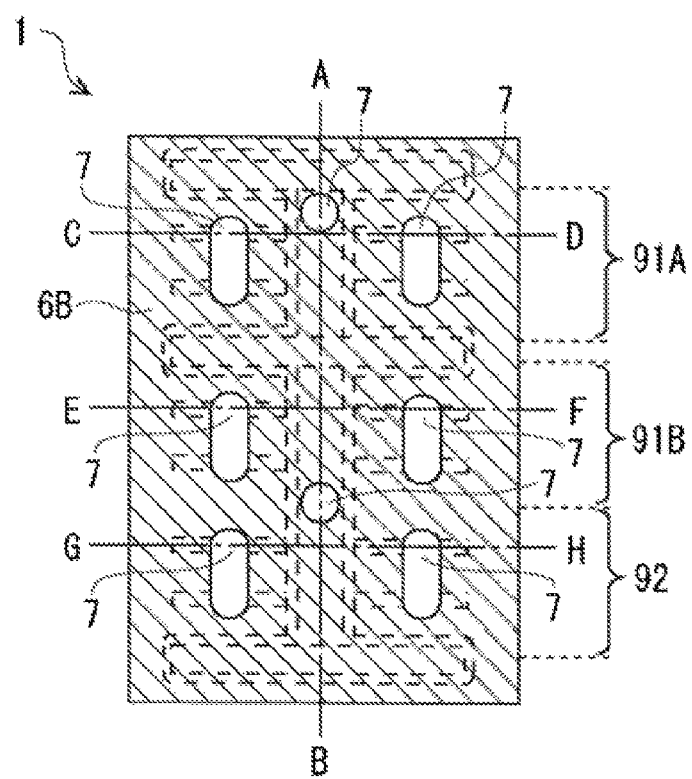
FIG. 28A is a plan view illustrating a semiconductor device according to a second embodiment.
Figure 28B:
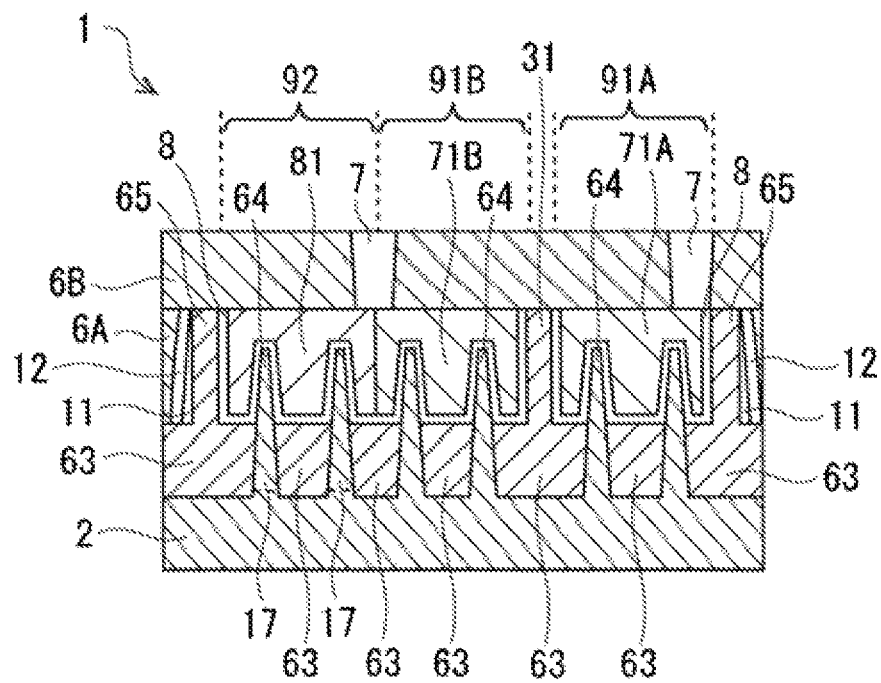
FIG. 28B is a cross-sectional view of the semiconductor device according to the second embodiment and illustrates a cross-section taken along alternate long and short dash line A-B in FIG. 28A.
Figure 28C:
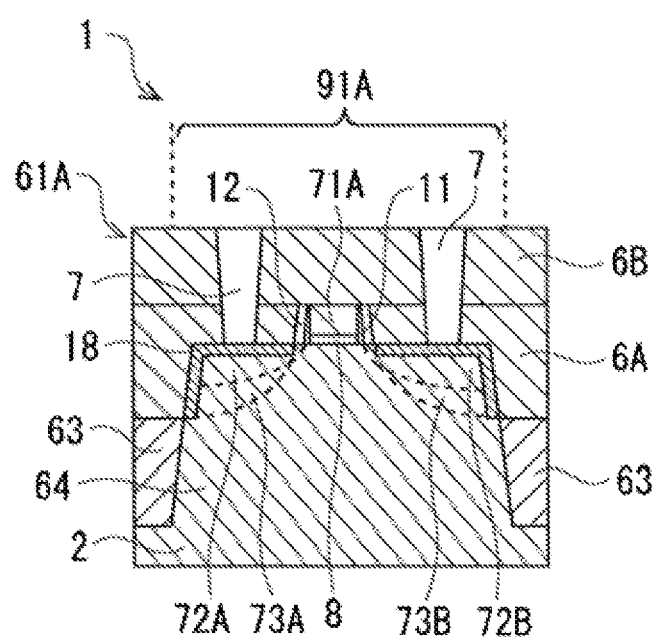
FIG. 28C is a cross-sectional view of the semiconductor device according to the second embodiment and illustrates a cross-section taken along alternate long and short dash line C-D in FIG. 28A.
Figure 28D:
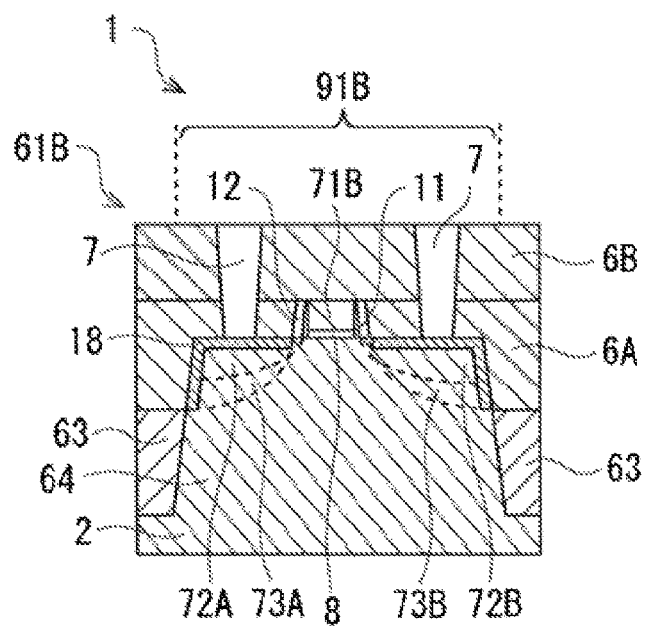
FIG. 28D is a cross-sectional view of the semiconductor device according to the second embodiment and illustrates a cross-section taken along alternate long and short dash line E-F in FIG. 28A.
Figure 28E:
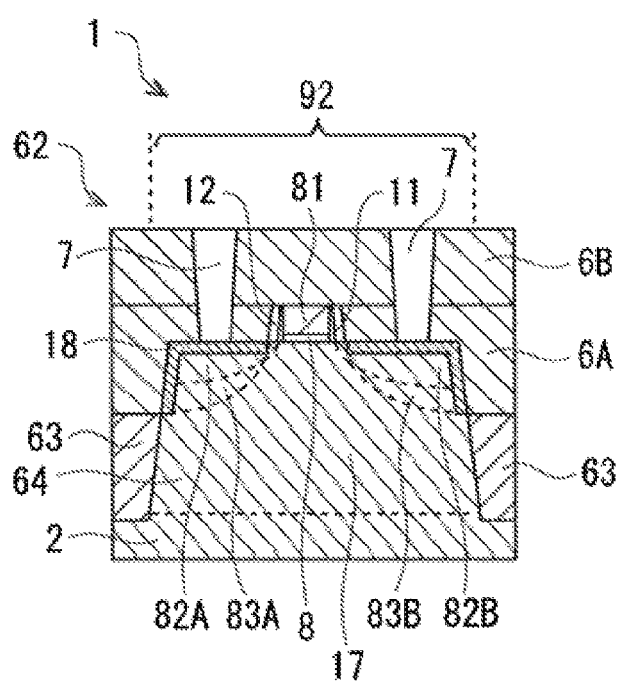
FIG. 28E is a cross-sectional view of the semiconductor device according to the second embodiment and illustrates a cross-section taken along alternate long and short dash line G-H in FIG. 28A.

FIG. 28A is a plan view illustrating the semiconductor device 1 according to the second embodiment. FIG. 28B is a cross-sectional view of the semiconductor device 1 according to the second embodiment and illustrates a cross-section taken along alternate long and short dash line A-B in FIG. 28A. FIG. 28C is a cross-sectional view of the semiconductor device 1 according to the second embodiment and illustrates a cross-section taken along alternate long and short dash line C-D in FIG. 28A. FIG. 28D is a cross-sectional view of the semiconductor device 1 according to the second embodiment and illustrates a cross-section taken along alternate long and short dash line E-F in FIG. 28A. FIG. 28E is a cross-sectional view of the semiconductor device 1 according to the second embodiment and illustrates a cross-section taken along alternate long and short dash line G-H in FIG. 28A.

The semiconductor device 1 includes a semiconductor substrate 2, n-type MOS transistors 61A and 61B, a p-type MOS transistor 62, an element isolation insulating film 63, interlayer insulating films 6A and 6B, and contact plugs 7. The interlayer insulating film 6A is formed on the semiconductor substrate 2 and the element isolation insulating film 63.

The n-type MOS transistor 61A is provided in an n-type MOS transistor formation region 91A which is demarcated by the element isolation insulating film 63. The n-type MOS transistor 61A includes a gate insulating film 8, a gate electrode 71A, a first sidewall insulating film 11, a second sidewall insulating film 12, LDD regions 72A and 72B, and source-drain regions 73A and 73B.

The n-type MOS transistor 61B is provided in an n-type MOS transistor formation region 91B which is demarcated by the element isolation insulating film 63. The n-type MOS transistor 61B includes the gate insulating film 8, a gate electrode 71B, the first sidewall insulating film 11, the second sidewall insulating film 12, the LDD regions 72A and 72B, and the source-drain regions 73A and 73B.

The p-type MOS transistor 62 is provided in a p-type MOS transistor formation region 92 which is demarcated by the element isolation insulating film 63. The p-type MOS transistor 62 includes the gate insulating film 8, a gate electrode 81, the first sidewall insulating film 11, the second sidewall insulating film 12, LDD regions 82A and 82B, and source-drain regions 83A and 83B. A well region 17 is formed in the semiconductor substrate 2 in the p-type MOS transistor formation region 92.

The semiconductor substrate 2 includes vertical fin-like (wall-like) projecting portions 64. The projecting portions 64 project upward from bottoms of trenches in the semiconductor substrate 2. In the n-type MOS transistor formation region 91A, the gate electrode 71A is formed so as to straddle the projecting portions 64 of the semiconductor substrate 2. An outer peripheral portion of each projecting portion 64 surrounded by the gate electrode 71A serves as a channel region. This configuration allows expansion of a channel width and suppression of a short channel effect. The projecting portions 64 and the gate electrode 71A are provided on and above the semiconductor substrate 2 such that the projecting portions 64 and the gate electrode 71A cross. The gate insulating film 8 is provided between the projecting portions 64 and the gate electrode 71A. The gate insulating film 8 is formed on the element isolation insulating film 63. The gate insulating film 8 is formed at upper surfaces and side surfaces of the projecting portions 64 so as to straddle the projecting portions 64.

The LDD regions 72A and 72B and the source-drain regions 73A and 73B are formed in an active region of the semiconductor substrate 2 in the n-type MOS transistor formation region 91A. The first sidewall insulating film 11 and the second sidewall insulating film 12 are formed at side surfaces in a gate length direction of the gate electrode 71A. The gate length direction of the gate electrode 71A refers to a direction from the source-drain region 73A toward the source-drain region 73B and a direction from the source-drain region 73B toward the source-drain region 73A. In FIG. 28B, the LDD regions 72A and 72B and the source-drain regions 73A and 73B are not illustrated.

In the n-type MOS transistor formation region 91B, the gate electrode 71B is formed so as to straddle the projecting portions 64 of the semiconductor substrate 2. An outer peripheral portion of each projecting portion 64 surrounded by the gate electrode 71B serves as a channel region. This configuration allows expansion of a channel width and suppression of a short channel effect. The projecting portions 64 and the gate electrode 71B are provided on and above the semiconductor substrate 2 such that the projecting portions 64 and the gate electrode 71B cross. The gate insulating film 8 is provided between the projecting portions 64 and the gate electrode 71B. The gate insulating film 8 is formed on the element isolation insulating film 63. The gate insulating film 8 is formed at upper surfaces and side surfaces of the projecting portions 64 so as to straddle the projecting portions 64.

The LDD regions 72A and 72B and the source-drain regions 73A and 73B are formed in an active region of the semiconductor substrate 2 in the n-type MOS transistor formation region 91B. The first sidewall insulating film 11 and the second sidewall insulating film 12 are formed at side surfaces of the gate electrode 71B in a gate length direction of the gate electrode 71B. The gate length direction of the gate electrode 71B refers to a direction from the source-drain region 73A toward the source-drain region 73B and a direction from the source-drain region 73B toward the source-drain region 73A. In FIG. 28B, the LDD regions 72A and 72B and the source-drain regions 73A and 73B are not illustrated.

In the p-type MOS transistor formation region 92, the gate electrode 81 is formed so as to straddle the projecting portions 64 of the semiconductor substrate 2. An outer peripheral portion of each projecting portion 64 surrounded by the gate electrode 81 serves as a channel region. This configuration allows expansion of a channel width and suppression of a short channel effect. The projecting portions 64 and the gate electrode 81 are provided on and above the semiconductor substrate 2 such that the projecting portions 64 and the gate electrode 81 cross. The gate insulating film 8 is provided between the projecting portions 64 and the gate electrode 81. The gate insulating film 8 is formed on the element isolation insulating film 63. The gate insulating film 8 is formed at upper surfaces and side surfaces of the projecting portions 64 so as to straddle the projecting portions 64.

The LDD regions 82A and 82B and the source-drain regions 83A and 83B are formed in an active region of the semiconductor substrate 2 in the p-type MOS transistor formation region 92B. The first sidewall insulating film 11 and the second sidewall insulating film 12 are formed at side surfaces of the gate electrode 81B in a gate length direction of the gate electrode 81B. The gate length direction of the gate electrode 81 refers to a direction from the source-drain region 83A toward the source-drain region 83B and a direction from the source-drain region 83B toward the source-drain region 83A. In FIG. 28B, the LDD regions 82A and 82B and the source-drain regions 83A and 83B are not illustrated.

Silicides 18 are formed at a surface of the semiconductor substrate 2 in the n-type MOS transistor formation regions 91A and 91B and the p-type MOS transistor formation region 92. The contact plugs 7 are formed on the gate electrodes 71A, 71B, and 81 and on the silicides 18. The element isolation insulating film 63 includes protruding portions 65 which protrude above the level of the surface of the semiconductor substrate 2. A peak of each protruding portion 65 of the element isolation insulating film 63 is located higher than a peak of each projecting portion 64 of the semiconductor substrate 2. Thus, the gate electrodes 71A, 71B, and 81 are also formed above the element isolation insulating film 63.

The gate electrode 71A extends in a gate width direction of the gate electrode 71A, and ends of the gate electrode 71A is located above the element isolation insulating film 63. The gate width direction of the gate electrode 71A is a direction crossing the gate length direction of the gate electrode 71A.

Since the ends of the gate electrode 71A are located above the element isolation insulating film 63, a gate width of the gate electrode 71A increases. The protruding portions 65 are provided at the element isolation insulating film 63 so as to cover side surfaces of the gate electrode 71A in the gate width direction of the gate electrode 71A.

The gate electrode 71B extends in a gate width direction of the gate electrode 71B, and ends of the gate electrode 71B are located above the element isolation insulating film 63. The gate width direction of the gate electrode 71B is a direction crossing the gate length direction of the gate electrode 71B. Since the ends of the gate electrode 71B are located above the element isolation insulating film 63, a gate width of the gate electrode 71B increases. The protruding portion 65 is provided at the element isolation insulating film 63 so as to cover a first side surface of the gate electrode 71B in the gate width direction of the gate electrode 71B.

The gate electrode 81 extends in a gate width direction of the gate electrode 81, and ends of the gate electrode 81 are located above the element isolation insulating film 63. The gate width direction of the gate electrode 81 is a direction crossing the gate length direction of the gate electrode 81. Since the ends of the gate electrode 81 are located above the element isolation insulating film 63, a gate width of the gate electrode 81 increases. The protruding portion 65 is provided at the element isolation insulating film 63 so as to cover a first side surface of the gate electrode 81 in the gate width direction of the gate electrode 81.

A second surface of the gate electrode 71B in the gate width direction of the gate electrode 71B and a second surface of the gate electrode 81 in the gate width direction of the gate electrode 81 are connected. That is, the gate electrode 71B and the gate electrode 81 are integrally formed. Since the gate electrode 71 and the gate electrode 81 are integrally formed, the common contact plug 7 is connected to the gate electrode 71B and the gate electrode 81. Note that the gate electrode 71B and the gate electrode 81 may be separated. When the gate electrode 71B and the gate electrode 81 are separated, the protruding portion 65 is provided at the element isolation insulating film 63 between the gate electrode 71B and the gate electrode 81.

Figure 29A:
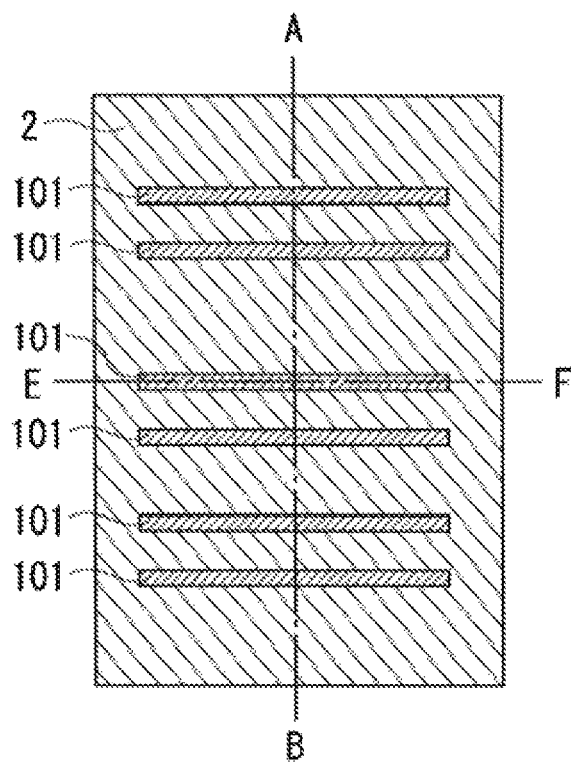
FIG. 29A is a plan view illustrating a method for manufacturing the semiconductor device according to the second embodiment.
Figure 29B:
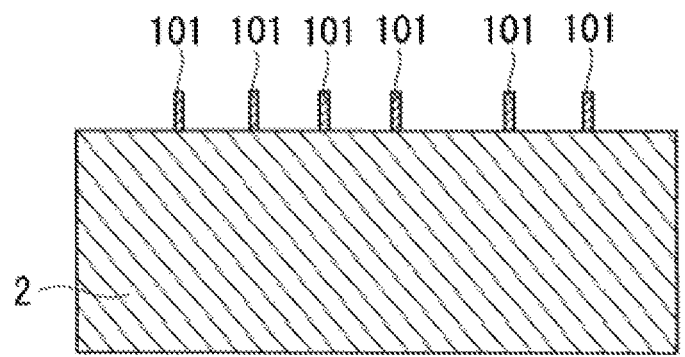
FIG. 29B is a cross-sectional view illustrating the method for manufacturing the semiconductor device according to the second embodiment and illustrates a cross-section taken along alternate long and short dash line A-B in FIG. 29A.
Figure 29C:
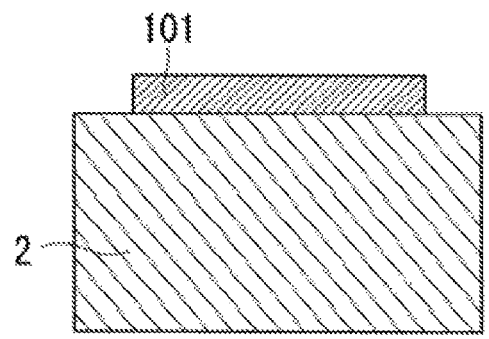
FIG. 29C is a cross-sectional view illustrating the method for manufacturing the semiconductor device according to the second embodiment and illustrates a cross-section taken along alternate long and short dash line E-F in FIG. 29A.

The method for manufacturing the semiconductor device 1 according to the second embodiment will be described. FIG. 29A is a plan view illustrating the method for manufacturing the semiconductor device 1 according to the second embodiment. FIG. 29B is a cross-sectional view illustrating the method for manufacturing the semiconductor device 1 according to the second embodiment and illustrates a cross-section taken along alternate long and short dash line A-B in FIG. 29A. FIG. 29C is a cross-sectional view illustrating the method for manufacturing the semiconductor device 1 according to the second embodiment and illustrates a cross-section taken along alternate long and short dash line E-F in FIG. 29A.

In a step illustrated in FIGS. 29A to 29C, a hard mask 101 is formed on the semiconductor substrate 2 by, for example, CVD method. The hard mask 101 is, for example, a SiN film. The thickness (height) of the hard mask 101 is, for example, not less than 30 nm and not more than 100 nm. A resist pattern is then formed on the hard mask 101 by photolithography. After that, the hard mask 101 is patterned by performing anisotropic dry etching, such as RIE, using the resist pattern on the hard mask 101 as a mask. Moreover, the resist pattern on the hard mask 101 is removed by wet treatment using, e.g., a SPM solution or ashing.

Figure 30A:
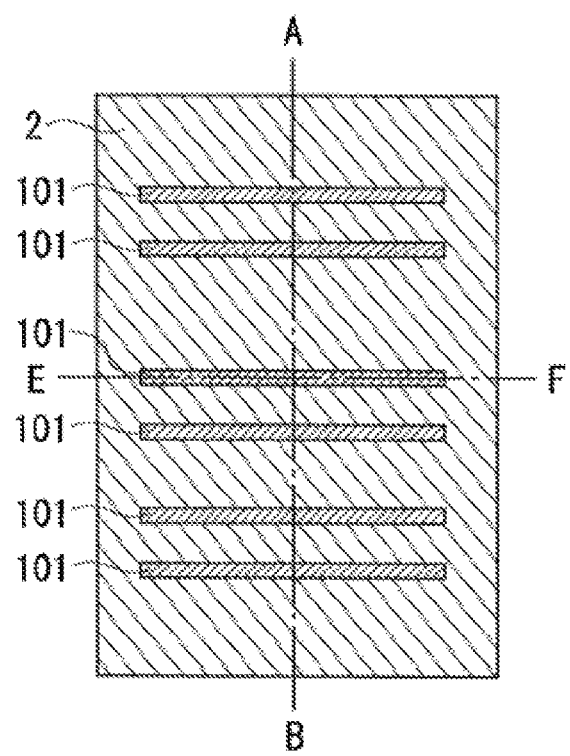
FIG. 30A is a plan view illustrating the method for manufacturing the semiconductor device according to the second embodiment.
Figure 30B:
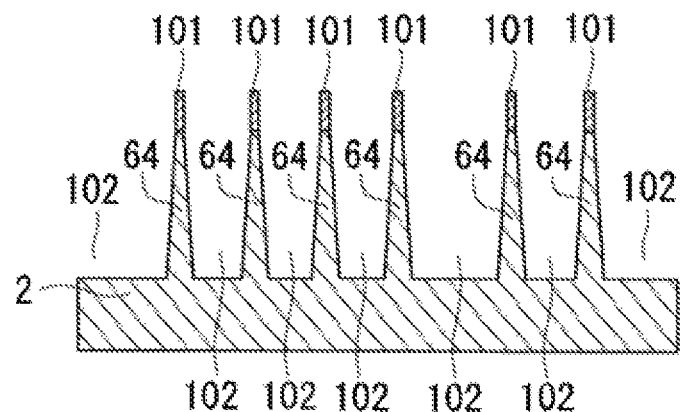
FIG. 30B is a cross-sectional view illustrating the method for manufacturing the semiconductor device according to the second embodiment and illustrates a cross-section taken along alternate long and short dash line A-B in FIG. 30A.
Figure 30C:
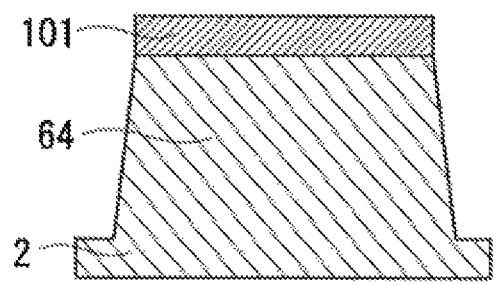
FIG. 30C is a cross-sectional view illustrating the method for manufacturing the semiconductor device according to the second embodiment and illustrates a cross-section taken along alternate long and short dash line E-F in FIG. 30A.

FIG. 30A is a plan view illustrating the method for manufacturing the semiconductor device 1 according to the second embodiment. FIG. 30B is a cross-sectional view illustrating the method for manufacturing the semiconductor device 1 according to the second embodiment and illustrates a cross-section taken along alternate long and short dash line A-B in FIG. 30A. FIG. 30C is a cross-sectional view illustrating the method for manufacturing the semiconductor device 1 according to the second embodiment and illustrates a cross-section taken along alternate long and short dash line E-F in FIG. 30A. In a step illustrated in FIGS. 30A to 30C, trenches 102 are formed in the semiconductor substrate 2 by performing anisotropic etching, such as RIE, using the hard masks 101 formed on the semiconductor substrate 2 as a mask. The trenches 102 are formed in the semiconductor substrate 2, thereby forming the projecting portions 64 at the semiconductor substrate 2.

Figure 31A:
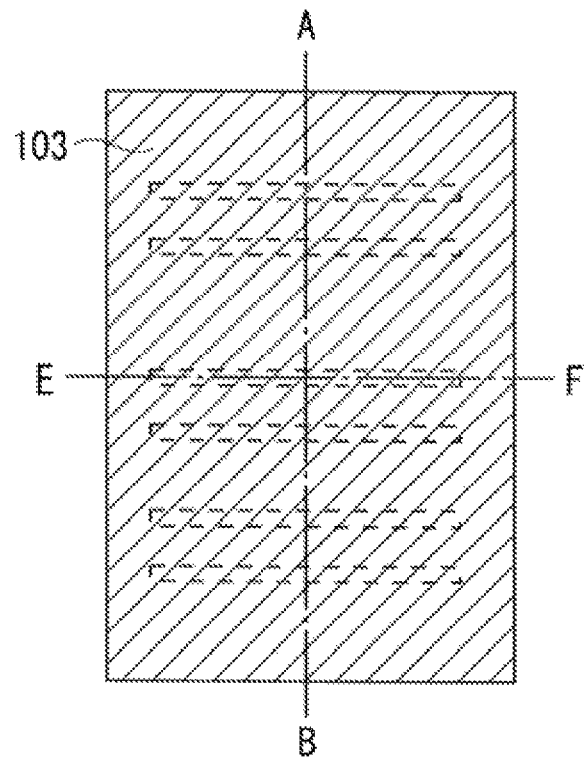
FIG. 31A is a plan view illustrating the method for manufacturing the semiconductor device according to the second embodiment.
Figure 31B:
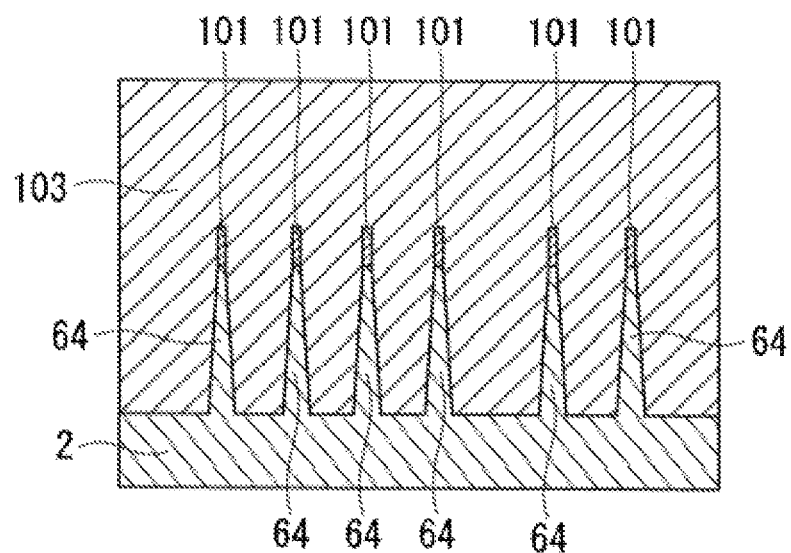
FIG. 31B is a cross-sectional view illustrating the method for manufacturing the semiconductor device according to the second embodiment and illustrates a cross-section taken along alternate long and short dash line A-B in FIG. 31A.
Figure 31C:
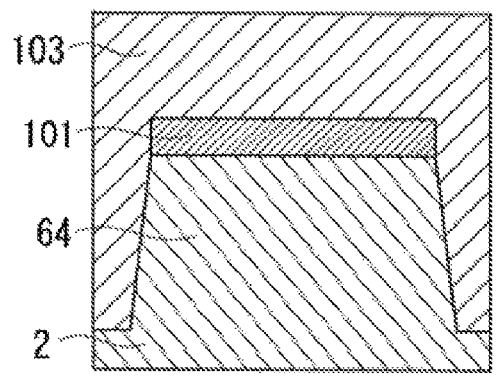
FIG. 31C is a cross-sectional view illustrating the method for manufacturing the semiconductor device according to the second embodiment and illustrates a cross-section taken along alternate long and short dash line E-F in FIG. 31A.

FIG. 31A is a plan view illustrating the method for manufacturing the semiconductor device 1 according to the second embodiment. FIG. 31B is a cross-sectional view illustrating the method for manufacturing the semiconductor device 1 according to the second embodiment and illustrates a cross-section taken along alternate long and short dash line A-B in FIG. 31A. FIG. 31C is a cross-sectional view illustrating the method for manufacturing the semiconductor device 1 according to the second embodiment and illustrates a cross-section taken along alternate long and short dash line E-F in FIG. 31A. In a step illustrated in FIGS. 31A to 31C, an oxide film ($SiO_2$) 103 is formed over the entire surface of the semiconductor substrate 2 by, for example, CVD method. Since the oxide film 103 is formed over the entire surface of the semiconductor substrate 2, the trenches 102 in the semiconductor substrate 2 are filled up with the oxide film 103. The oxide film 103 is an example of a second insulating film.

Figure 32A:
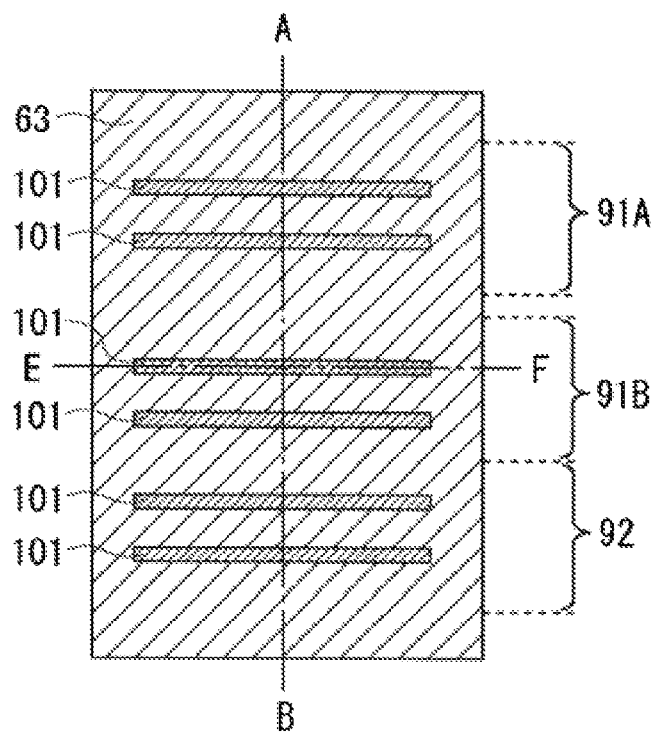
FIG. 32A is a plan view illustrating the method for manufacturing the semiconductor device according to the second embodiment.
Figure 32B:
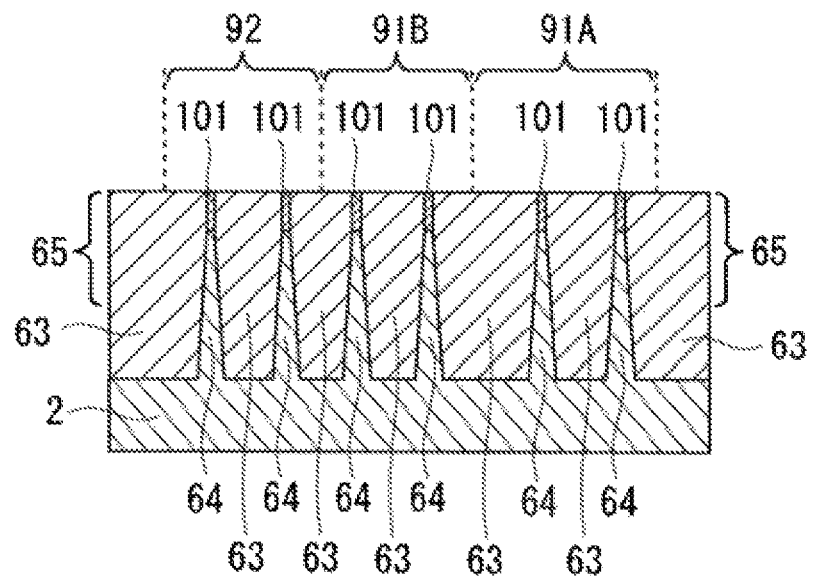
FIG. 32B is a cross-sectional view illustrating the method for manufacturing the semiconductor device according to the second embodiment and illustrates a cross-section taken along alternate long and short dash line A-B in FIG. 32A.
Figure 32C:
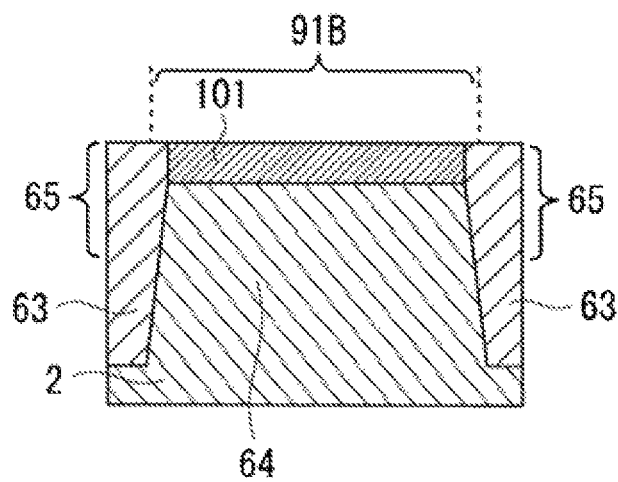
FIG. 32C is a cross-sectional view illustrating the method for manufacturing the semiconductor device according to the second embodiment and illustrates a cross-section taken along alternate long and short dash line E-F in FIG. 32A.

FIG. 32A is a plan view illustrating the method for manufacturing the semiconductor device 1 according to the second embodiment. FIG. 32B is a cross-sectional view illustrating the method for manufacturing the semiconductor device 1 according to the second embodiment and illustrates a cross-section taken along alternate long and short dash line A-B in FIG. 32A. FIG. 32C is a cross-sectional view illustrating the method for manufacturing the semiconductor device 1 according to the second embodiment and illustrates a cross-section taken along alternate long and short dash line E-F in FIG. 32A. In a step illustrated in FIGS. 32A to 32C, an upper portion of the oxide film 103 is removed by polishing the oxide film 103 by CMP, thereby forming, on the semiconductor substrate 2, the element isolation insulating film 63 that includes the protruding portion 65 protruding above the level of the surface of the semiconductor substrate 2 (an upper surface of each projecting portion 64 of the semiconductor substrate 2). The element isolation insulating film 63 is an example of the second insulating film. The formation of the element isolation insulating film 63 on the semiconductor substrate 2 demarcates the n-type MOS transistor formation regions 91A and 91B and the p-type MOS transistor formation region 92 in the semiconductor substrate 2.

Figure 33A:
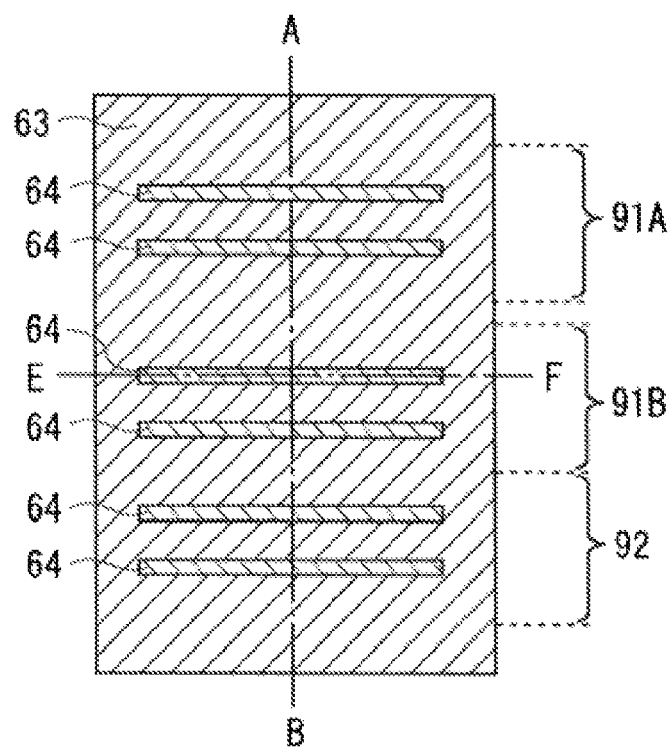
FIG. 33A is a plan view illustrating the method for manufacturing the semiconductor device according to the second embodiment.
Figure 33B:
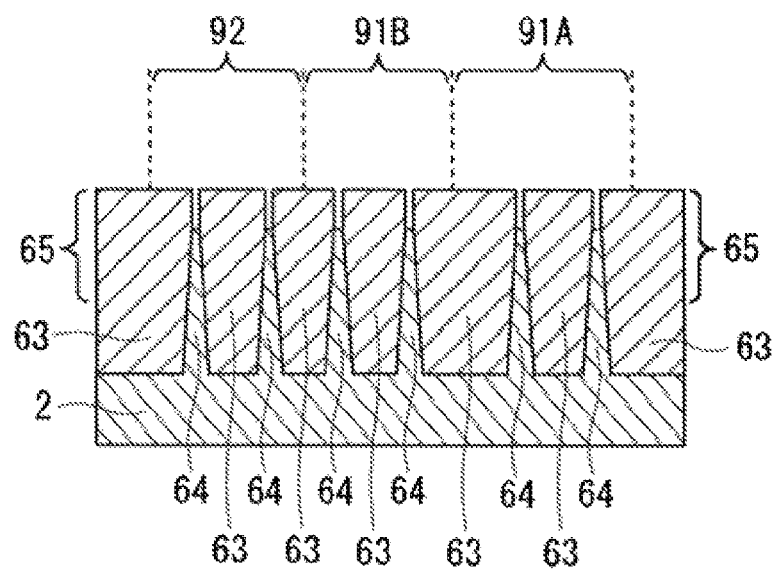
FIG. 33B is a cross-sectional view illustrating the method for manufacturing the semiconductor device according to the second embodiment and illustrates a cross-section taken along alternate long and short dash line A-B in FIG. 33A.
Figure 33C:
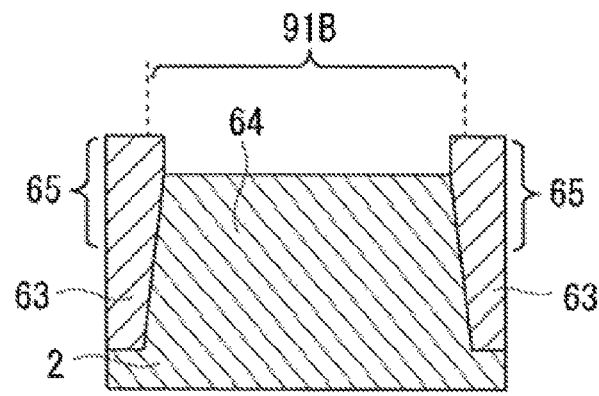
FIG. 33C is a cross-sectional view illustrating the method for manufacturing the semiconductor device according to the second embodiment and illustrates a cross-section taken along alternate long and short dash line E-F in FIG. 33A.

FIG. 33A is a plan view illustrating the method for manufacturing the semiconductor device 1 according to the second embodiment. FIG. 33B is a cross-sectional view illustrating the method for manufacturing the semiconductor device 1 according to the second embodiment and illustrates a cross-section taken along alternate long and short dash line A-B in FIG. 33A. FIG. 33C is a cross-sectional view illustrating the method for manufacturing the semiconductor device 1 according to the second embodiment and illustrates a cross-section taken along alternate long and short dash line E-F in FIG. 33A. In a step illustrated in FIGS. 33A to 33C, the hard masks 101 that are exposed from the element isolation insulating film 63 are removed by, for example, wet treatment using hot phosphoric acid.

Figure 34A:
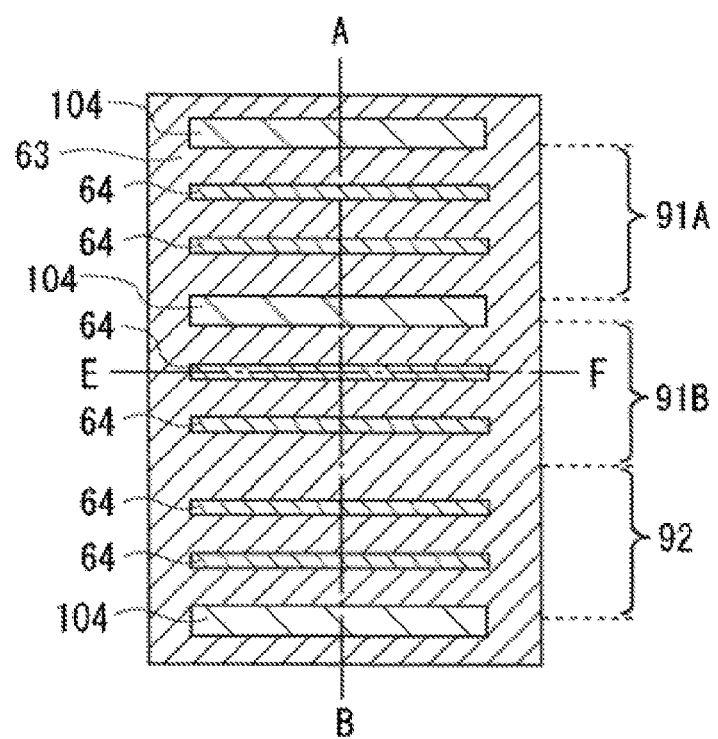
FIG. 34A is a plan view illustrating the method for manufacturing the semiconductor device according to the second embodiment.
Figure 34B:
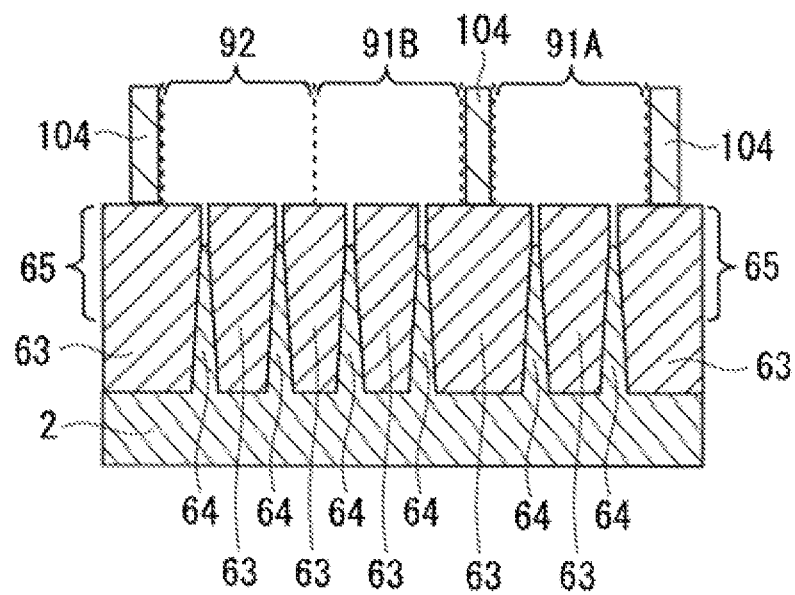
FIG. 34B is a cross-sectional view illustrating the method for manufacturing the semiconductor device according to the second embodiment and illustrates a cross-section taken along alternate long and short dash line A-B in FIG. 34A.
Figure 34C:
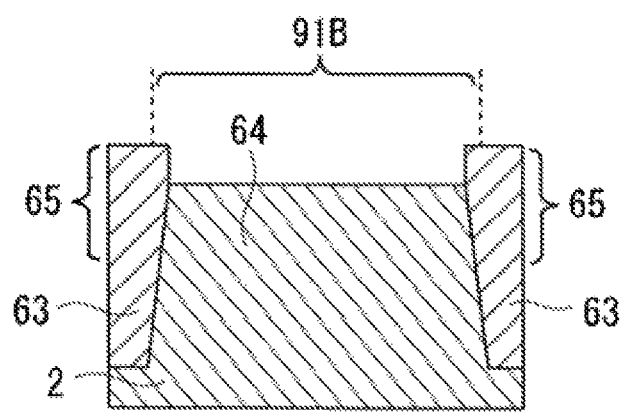
FIG. 34C is a cross-sectional view illustrating the method for manufacturing the semiconductor device according to the second embodiment and illustrates a cross-section taken along alternate long and short dash line E-F in FIG. 34A.

FIG. 34A is a plan view illustrating the method for manufacturing the semiconductor device 1 according to the second embodiment. FIG. 34B is a cross-sectional view illustrating the method for manufacturing the semiconductor device 1 according to the second embodiment and illustrates a cross-section taken along alternate long and short dash line A-B in FIG. 34A. FIG. 34C is a cross-sectional view illustrating the method for manufacturing the semiconductor device 1 according to the second embodiment and illustrates a cross-section taken along alternate long and short dash line E-F in FIG. 34A. In a step illustrated in FIGS. 34A to 34C, resist patterns 104 are formed at predetermined sites on the element isolation insulating film 63 by photolithography.

Figure 35A:
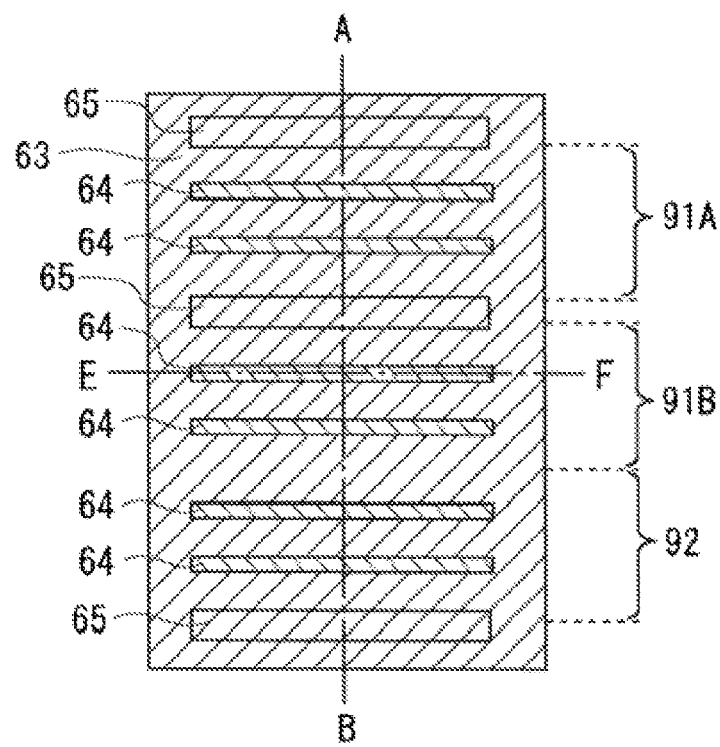
FIG. 35A is a plan view illustrating the method for manufacturing the semiconductor device according to the second embodiment.
Figure 35B:
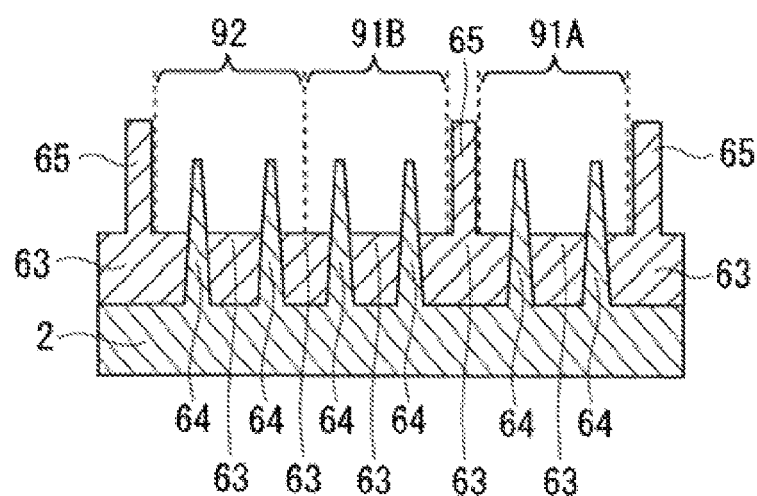
FIG. 35B is a cross-sectional view illustrating the method for manufacturing the semiconductor device according to the second embodiment and illustrates a cross-section taken along alternate long and short dash line A-B in FIG. 35A.
Figure 35C:
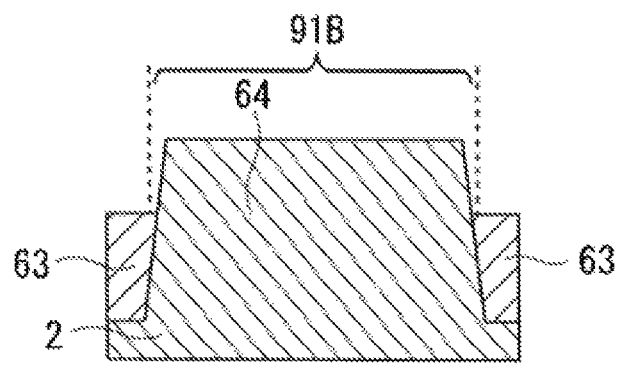
FIG. 35C is a cross-sectional view illustrating the method for manufacturing the semiconductor device according to the second embodiment and illustrates a cross-section taken along alternate long and short dash line E-F in FIG. 35A.

FIG. 35A is a plan view illustrating the method for manufacturing the semiconductor device 1 according to the second embodiment. FIG. 35B is a cross-sectional view illustrating the method for manufacturing the semiconductor device 1 according to the second embodiment and illustrates a cross-section taken along alternate long and short dash line A-B in FIG. 35A. FIG. 35C is a cross-sectional view illustrating the method for manufacturing the semiconductor device 1 according to the second embodiment and illustrates a cross-section taken along alternate long and short dash line E-F in FIG. 35A. In a step illustrated in FIGS. 35A to 35C, the protruding portion 65 of the element isolation insulating film 63 is partially shaved off by performing anisotropic etching, such as RIE, using the resist patterns 104 as a mask. The resist patterns 104 are then removed by wet treatment using a chemical solution, such as a SPM solution, or ashing.

The resist pattern 104 is not formed on the protruding portion 65 of the element isolation insulating film 63 in the n-type MOS transistor formation regions 91A and 91B and the p-type MOS transistor formation region 92. For this reason, the protruding portion 65 of the element isolation insulating film 63 in the n-type MOS transistor formation regions 91A and 91B and the p-type MOS transistor formation region 92 is removed. Since the protruding portion 65 of the element isolation insulating film 63 is removed, the projecting portions 64 of the semiconductor substrate 2 protrude upward from the element isolation insulating film 63. That is, an upper surface of the element isolation insulating film 63 in a region not covered with the resist patterns 104 is lower than the surface of the semiconductor substrate 2 (the upper surface of each projecting portion 64 of the semiconductor substrate 2). The projecting portion 64 of the semiconductor substrate 2 protrudes upward from the element isolation insulating film 63 by, for example, a magnitude ranging from 30 nm to 50 nm. That is, the surface of the semiconductor substrate 2 (the upper surface of each projecting portion 64 of the semiconductor substrate 2) is higher than the upper surface of the element isolation insulating film 63 in the n-type MOS transistor formation regions 91A and 91B and p-type MOS transistor formation region 92 by the magnitude ranging from 30 nm to 50 nm. The protruding portion 65 of the element isolation insulating film 63 is partially shaved off to obtain the protruding portions 65 of the element isolation insulating film 63 that are thinner than portions below the protruding portions 65 of the element isolation insulating film 63. Although an example where the protruding portion 65 of the element isolation insulating film 63 is partially shaved off has been illustrated, the second embodiment is not limited to the example. The step of partially shaving off the protruding portion 65 of the element isolation insulating film 63 may be omitted. In this case, each protruding portion 65 of the element isolation insulating film 63 and a portion below the protruding portion 65 of the element isolation insulating film 63 are the same in thickness.

Figure 36A:
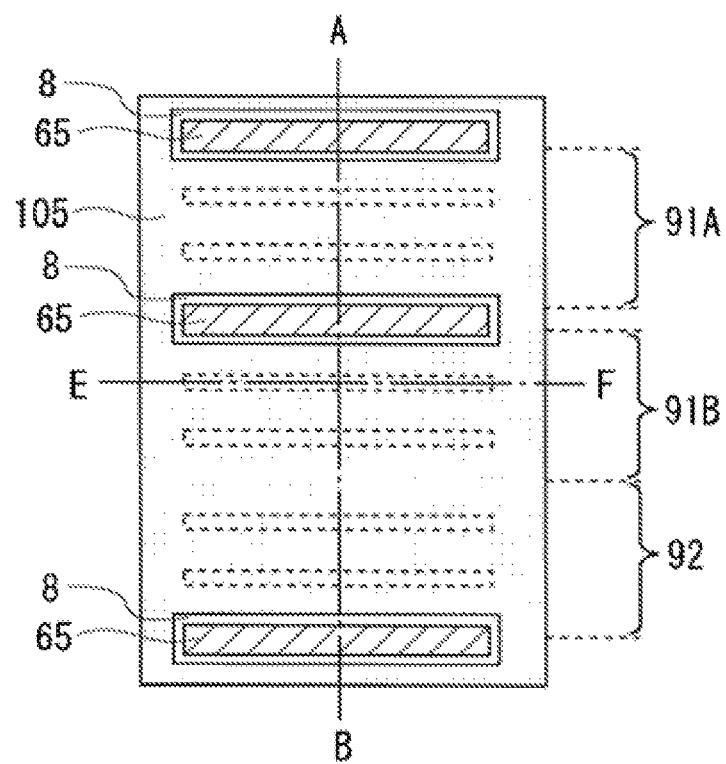
FIG. 36A is a plan view illustrating the method for manufacturing the semiconductor device according to the second embodiment.
Figure 36B:
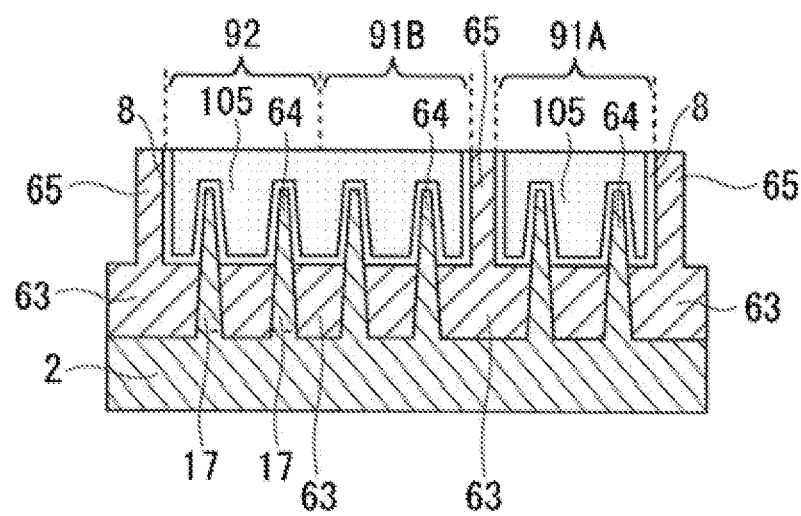
FIG. 36B is a cross-sectional view illustrating the method for manufacturing the semiconductor device according to the second embodiment and illustrates a cross-section taken along alternate long and short dash line A-B in FIG. 36A.
Figure 36C:
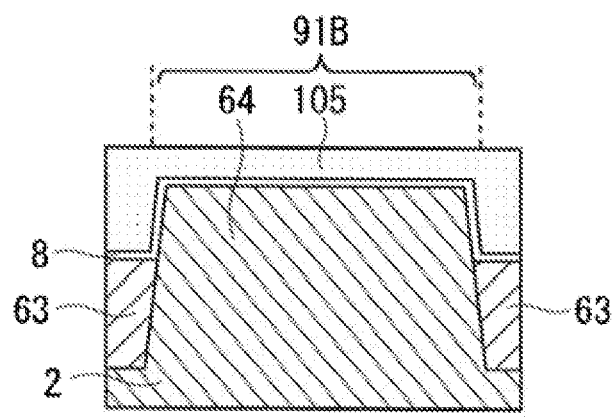
FIG. 36C is a cross-sectional view illustrating the method for manufacturing the semiconductor device according to the second embodiment and illustrates a cross-section taken along alternate long and short dash line E-F in FIG. 36A.

FIG. 36A is a plan view illustrating the method for manufacturing the semiconductor device 1 according to the second embodiment. FIG. 36B is a cross-sectional view illustrating the method for manufacturing the semiconductor device 1 according to the second embodiment and illustrates a cross-section taken along alternate long and short dash line A-B in FIG. 36A. FIG. 36C is a cross-sectional view illustrating the method for manufacturing the semiconductor device 1 according to the second embodiment and illustrates a cross-section taken along alternate long and short dash line E-F in FIG. 36A. In a step illustrated in FIGS. 36A to 36C, impurities are ion-implanted, thereby forming the well region 17 and channel regions (not illustrated) in the semiconductor substrate 2. For example, when the conductivity type of the semiconductor substrate 2 is the p-type, n-type impurities are ion-implanted, thereby forming the n-type well region 17 in the semiconductor substrate 2 in the p-type MOS transistor formation region 92. The impurities implanted in the semiconductor substrate 2 are then activated by heat treatment. After that, the gate insulating film 8 is formed on the element isolation insulating film 63 and is formed at upper surfaces and side surfaces of the projecting portions 64 so as to straddle the projecting portions 64 of the semiconductor substrate 2 by, for example, CVD method. Moreover, a dummy gate electrode 105 is formed on the gate insulating film 8 so as to straddle the projecting portions 64 of the semiconductor substrate 2 by, for example, CVD method. The dummy gate electrode 105 is made of, for example, polysilicon. Furthermore, the gate insulating film 8 and the dummy gate electrode 105 are polished by CMP, thereby exposing the protruding portions 65 of the element isolation insulating film 63 from the gate insulating film 8 and the dummy gate electrode 105.

Since the protruding portions 65 of the element isolation insulating film 63 and the dummy gate electrode 105 are planarized by CMP, the height of each protruding portion 65 of the element isolation insulating film 63 is nearly equal to the thickness (height) of each dummy gate electrode 105 above the element isolation insulating film 63. The thickness of each dummy gate electrode 105 above the projecting portions 64 of the semiconductor substrate 2 after the CMP is, for example, about not less than 20 nm and not more than 70 nm. Note that the thickness of the dummy gate electrode 105 above the projecting portions 64 of the semiconductor substrate 2 after the CMP is set to be smaller than the thickness (height) of the hard mask 101.

Figure 37A:
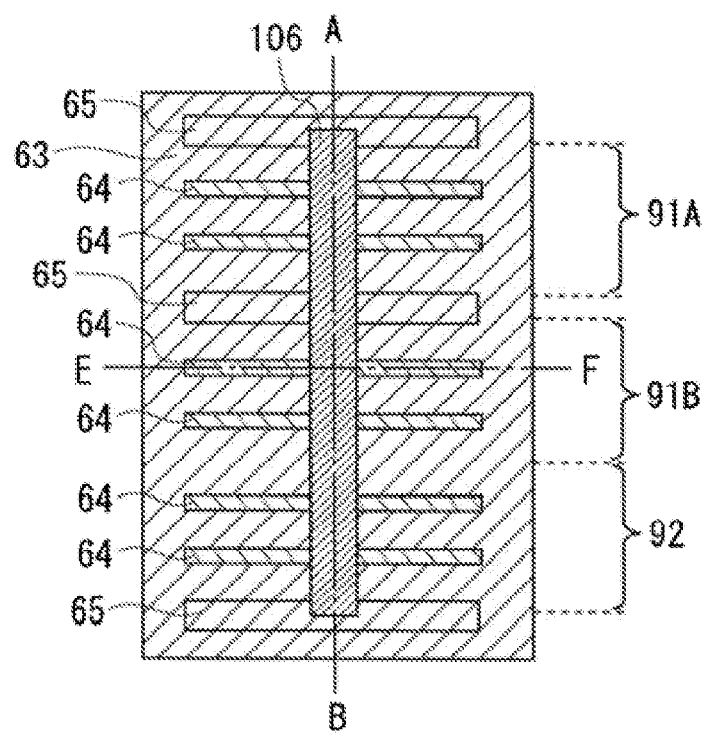
FIG. 37A is a plan view illustrating the method for manufacturing the semiconductor device according to the second embodiment.
Figure 37B:
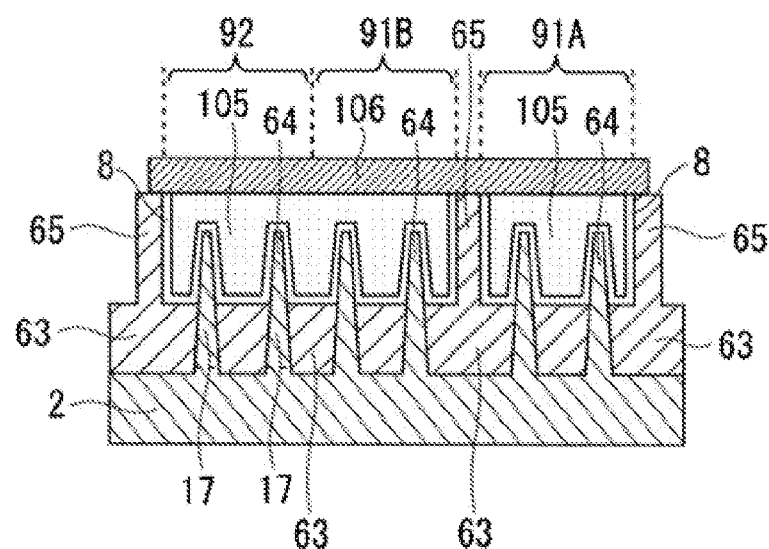
FIG. 37B is a cross-sectional view illustrating the method for manufacturing the semiconductor device according to the second embodiment and illustrates a cross-section taken along alternate long and short dash line A-B in FIG. 37A.
Figure 37C:
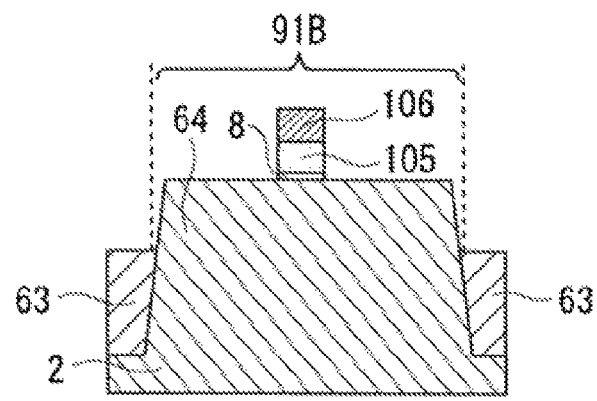
FIG. 37C is a cross-sectional view illustrating the method for manufacturing the semiconductor device according to the second embodiment and illustrates a cross-section taken along alternate long and short dash line E-F in FIG. 37A.

FIG. 37A is a plan view illustrating the method for manufacturing the semiconductor device 1 according to the second embodiment. FIG. 37B is a cross-sectional view illustrating the method for manufacturing the semiconductor device 1 according to the second embodiment and illustrates a cross-section taken along alternate long and short dash line A-B in FIG. 37A. FIG. 37C is a cross-sectional view illustrating the method for manufacturing the semiconductor device 1 according to the second embodiment and illustrates a cross-section taken along alternate long and short dash line E-F in FIG. 37A. In a step illustrated in FIGS. 37A to 37C, a hard mask 106 is formed on the dummy gate electrodes 105 by, for example, CVD method. The hard mask 106 is, for example, a SiN film or a laminated film of a SiN film and a $SiO_2$ film. A resist pattern is then formed on the hard mask 106 by photolithography. After that, the hard mask 106 is patterned by performing anisotropic dry etching, such as RIE, using the resist pattern on the hard mask 106 as a mask. Moreover, the resist pattern on the hard mask 106 is removed by wet treatment using a chemical solution, such as a SPM solution, or ashing. Furthermore, the gate insulating films 8 and the dummy gate electrodes 105 are patterned by performing anisotropic dry etching, such as RIE, using the hard mask 106 as a mask.

Figure 38A:
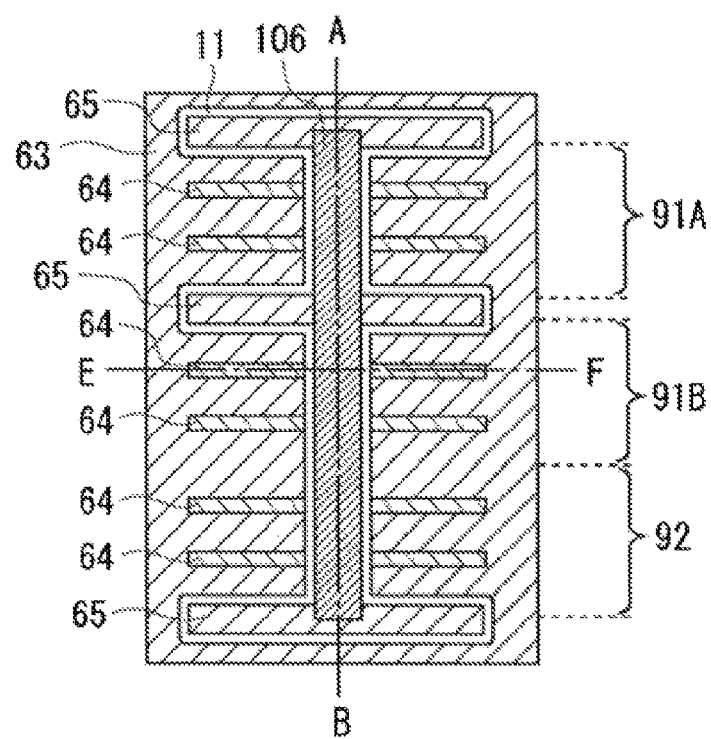
FIG. 38A is a plan view illustrating the method for manufacturing the semiconductor device according to the second embodiment.
Figure 38B:
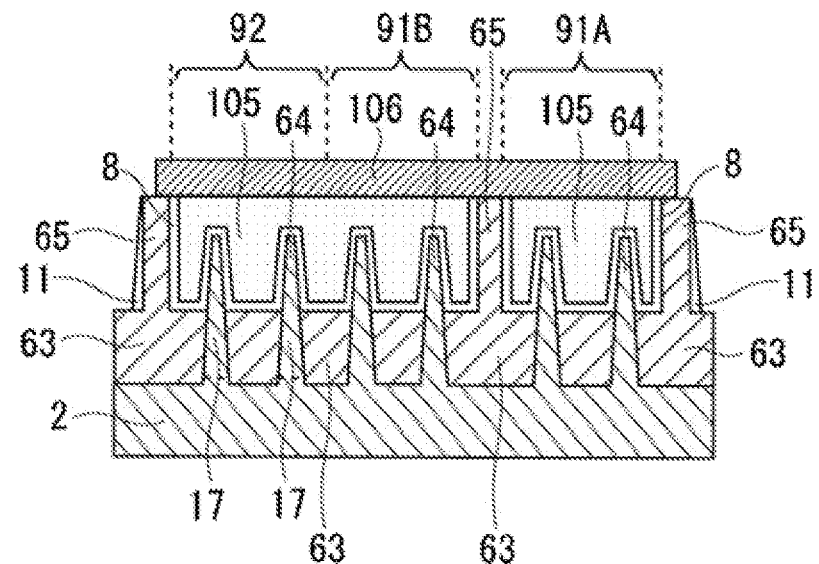
FIG. 38B is a cross-sectional view illustrating the method for manufacturing the semiconductor device according to the second embodiment and illustrates a cross-section taken along alternate long and short dash line A-B in FIG. 38A.
Figure 38C:
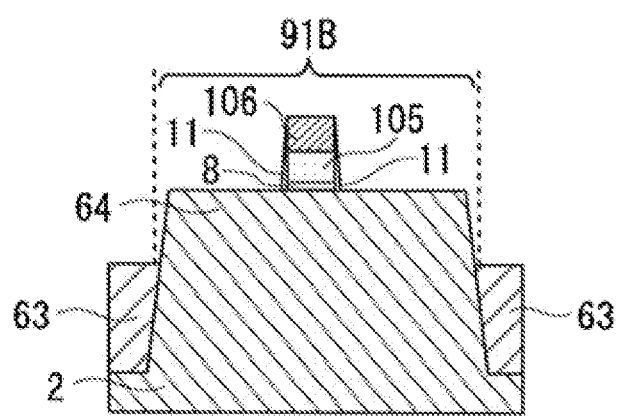
FIG. 38C is a cross-sectional view illustrating the method for manufacturing the semiconductor device according to the second embodiment and illustrates a cross-section taken along alternate long and short dash line E-F in FIG. 38A.

FIG. 38A is a plan view illustrating the method for manufacturing the semiconductor device 1 according to the second embodiment. FIG. 38B is a cross-sectional view illustrating the method for manufacturing the semiconductor device 1 according to the second embodiment and illustrates a cross-section taken along alternate long and short dash line A-B in FIG. 38A. FIG. 38C is a cross-sectional view illustrating the method for manufacturing the semiconductor device 1 according to the second embodiment and illustrates a cross-section taken along alternate long and short dash line E-F in FIG. 38A. In a step illustrated in FIGS. 38A to 38C, a SiO$_2$ film is formed on the semiconductor substrate 2 by, for example, CVD method. A SiN film may be formed instead of the SiO$_2$ film. Etchback is then performed by anisotropic dry etching, such as RIE, and the first sidewall insulating film 11 is formed at side surfaces of the dummy gate electrodes 105 in a lateral direction of the dummy gate electrode 105. The protruding portions 65 are provided at the element isolation insulating film 63 so as to cover side surfaces of the dummy gate electrodes 105 in a longitudinal direction of the dummy gate electrode 105. For this reason, the first sidewall insulating film 11 is not formed at the side surfaces of the dummy gate electrodes 105 in the longitudinal direction of the dummy gate electrode 105. The first sidewall insulating film 11 is formed at side surfaces of the protruding portions 65 of the element isolation insulating film 63.

Figure 39A:
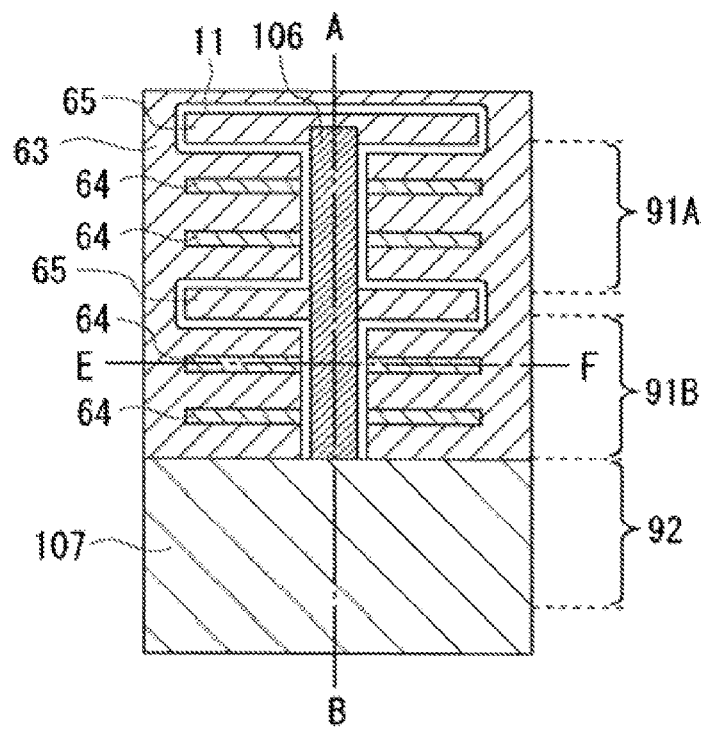
FIG. 39A is a plan view illustrating the method for manufacturing the semiconductor device according to the second embodiment.
Figure 39B:
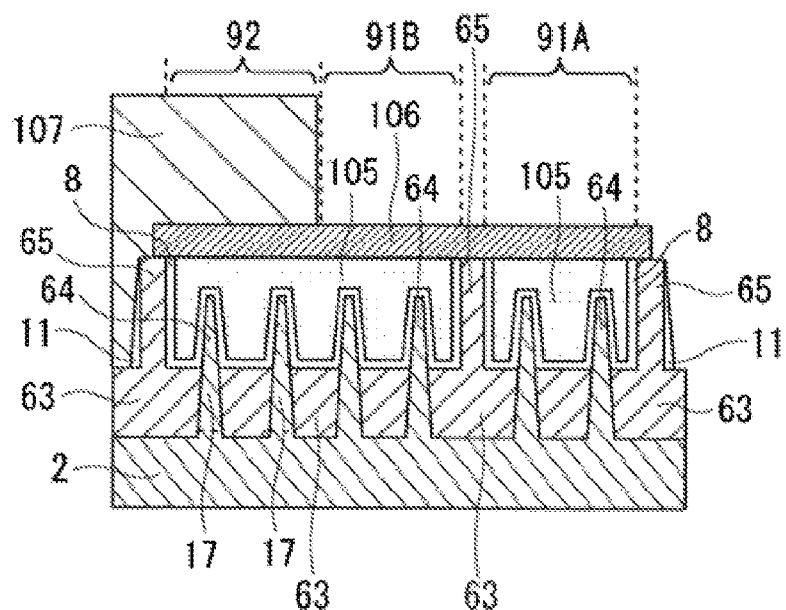
Figure 39C:
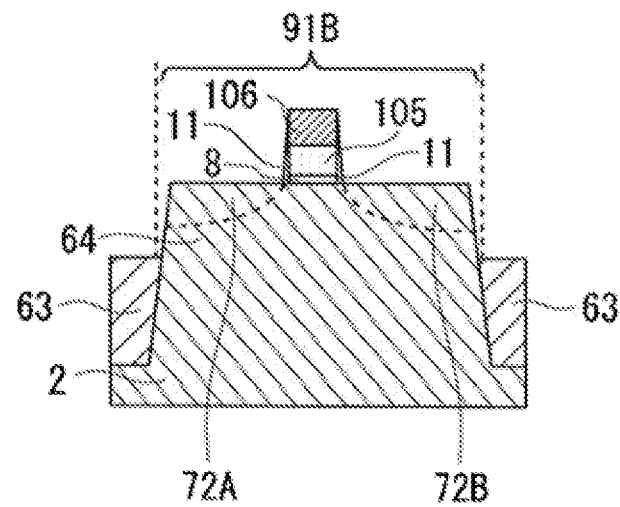

FIG. 39A is a plan view illustrating the method for manufacturing the semiconductor device 1 according to the second embodiment. FIG. 39B is a cross-sectional view illustrating the method for manufacturing the semiconductor device 1 according to the second embodiment and illustrates a cross-section taken along alternate long and short dash line A-B in FIG. 39A. FIG. 39C is a cross-sectional view illustrating the method for manufacturing the semiconductor device 1 according to the second embodiment and illustrates a cross-section taken along alternate long and short dash line E-F in FIG. 39A. In a step illustrated in FIGS. 39A to 39C, a resist pattern 107 which is open in the n-type MOS transistor formation regions 91A and 91B is formed on the semiconductor substrate 2 by photolithography. Impurities are then ion-implanted using the first sidewall insulating film 11 and the resist pattern 107 as a mask, thereby forming the LDD regions 72A and 72B in the semiconductor substrate 2 in the n-type MOS transistor formation regions 91A and 91B. In this case, for example, n-type impurities, such as phosphorus (P), are ion-implanted. Since the hard mask 106 is formed on the dummy gate electrodes 105, the impurities are not implanted into the dummy gate electrodes 105. The LDD regions 72A and 72B are not illustrated in FIGS. 39A and 39B. After that, the resist pattern 107 is removed by wet treatment using a chemical solution, such as a SPM solution, or ashing.

As illustrated in FIGS. 39A to 39C, the protruding portions 65 are provided at the element isolation insulating film 63 so as to cover side surfaces of the dummy gate electrodes 105 in a gate width direction of the dummy gate electrode 105. The gate width direction of the dummy gate electrode 105 refers to a direction crossing a gate length direction of the dummy gate electrode 105. The gate length direction of the dummy gate electrode 105 refers to a direction from the LDD region 72A toward the LDD region 72B and a direction from the LDD region 72B toward the LDD region 72A. The gate width direction of the dummy gate electrode 105 coincides with the longitudinal direction of the dummy gate electrode 105, and the gate length direction of the dummy gate electrode 105 coincides with the lateral direction of the dummy gate electrode 105. The side surfaces of the dummy gate electrode 105 in the gate width direction of the dummy gate electrode 105 and the first sidewall insulating film 11 are not in contact. This configuration inhibits a chemical solution from infiltrating in the gate width direction of the dummy gate electrode 105 into between the element isolation insulating film 63 and the dummy gate electrode 105 and between the projecting portion 64 of the semiconductor substrate 2 and the dummy gate electrode 105. The gate insulating films 8 are thus inhibited from degrading due to the wet treatment using the chemical solution at the time of the removal of the resist pattern 107. Note that the thickness, in the gate length direction of the dummy gate electrode 105, of the first sidewall insulating film 11 formed at side surfaces of the dummy gate electrode 105 is not reduced. Thus, a chemical solution does not infiltrate in the gate length direction of the dummy gate electrode 105 into between the element isolation insulating film 63 and the dummy gate electrode 105 and between the projecting portion 64 of the semiconductor substrate 2 and the dummy gate electrode 105.

Figure 40A:
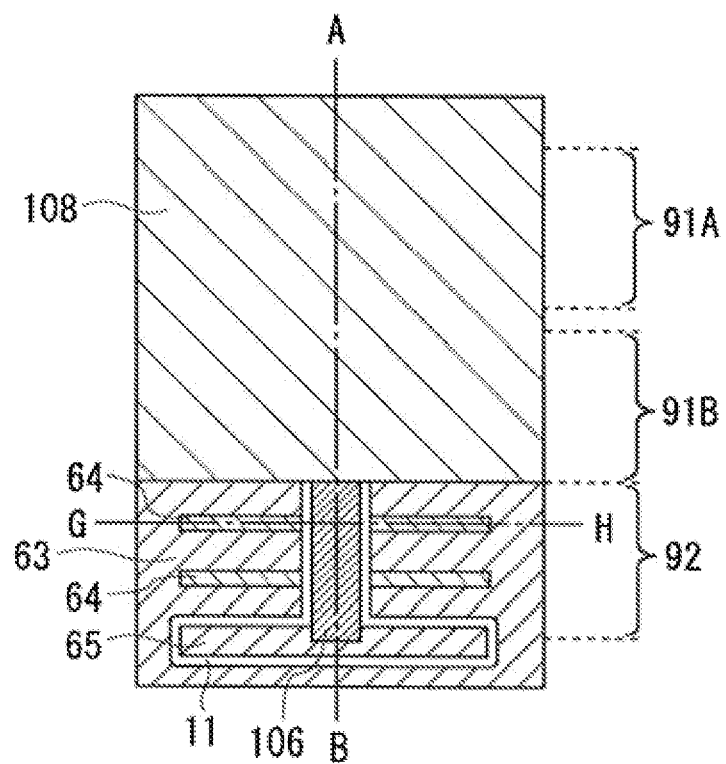
Figure 40B:
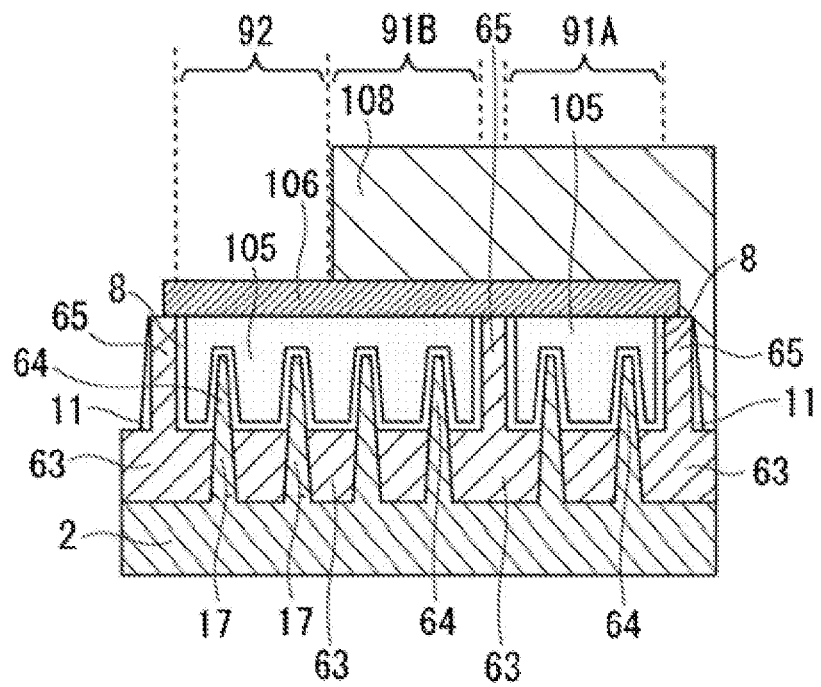
Figure 40C:
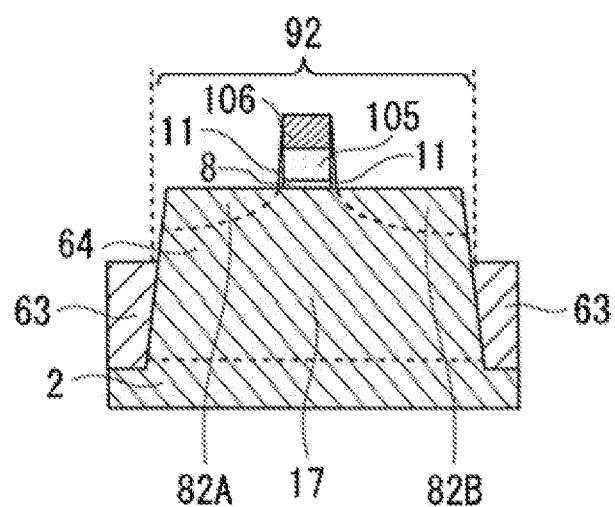

FIG. 40A is a plan view illustrating the method for manufacturing the semiconductor device 1 according to the second embodiment. FIG. 40B is a cross-sectional view illustrating the method for manufacturing the semiconductor device 1 according to the second embodiment and illustrates a cross-section taken along alternate long and short dash line A-B in FIG. 40A. FIG. 40C is a cross-sectional view illustrating the method for manufacturing the semiconductor device 1 according to the second embodiment and illustrates a cross-section taken along alternate long and short dash line G-H in FIG. 40A. In a step illustrated in FIGS. 40A to 40C, a resist pattern 108 which is open in the p-type MOS transistor formation region 92 is formed on the semiconductor substrate 2 by photolithography. Impurities are then ion-implanted using the first sidewall insulating film 11 and the resist pattern 108 as a mask, thereby forming the LDD regions 82A and 82B in the semiconductor substrate 2 in the p-type MOS transistor formation region 92. In this case, for example, p-type impurities, such as boron (B), are ion-implanted. Since the hard mask 106 is formed on the dummy gate electrodes 105, the impurities are not implanted into the dummy gate electrodes 105. The LDD regions 82A and 82B are not illustrated in FIGS. 40A and 40B. After that, the resist pattern 108 is removed by wet treatment using a chemical solution, such as a SPM solution, or ashing.

When the resist pattern 108 is removed by the wet treatment using the chemical solution, the first sidewall insulating film 11 is exposed to the chemical solution. As illustrated in FIGS. 40A to 40C, the protruding portions 65 of the element isolation insulating film 63 are provided so as to cover the side surfaces at ends of the dummy gate electrodes 105 in the gate width direction of the dummy gate electrode 105. For this reason, the side surfaces at ends of the dummy gate electrodes 105 in the gate width direction of the dummy gate electrode 105 and the first sidewall insulating film 11 are not in contact. This configuration inhibits a chemical solution from infiltrating in the gate width direction of the dummy gate electrode 105 into between the element isolation insulating film 63 and the dummy gate electrode 105 and between the projecting portion 64 of the semiconductor substrate 2 and the dummy gate electrode 105. The gate insulating films 8 are thus inhibited from degrading due to the wet treatment using the chemical solution at the time of the removal of the resist pattern 108.

Figure 41A:
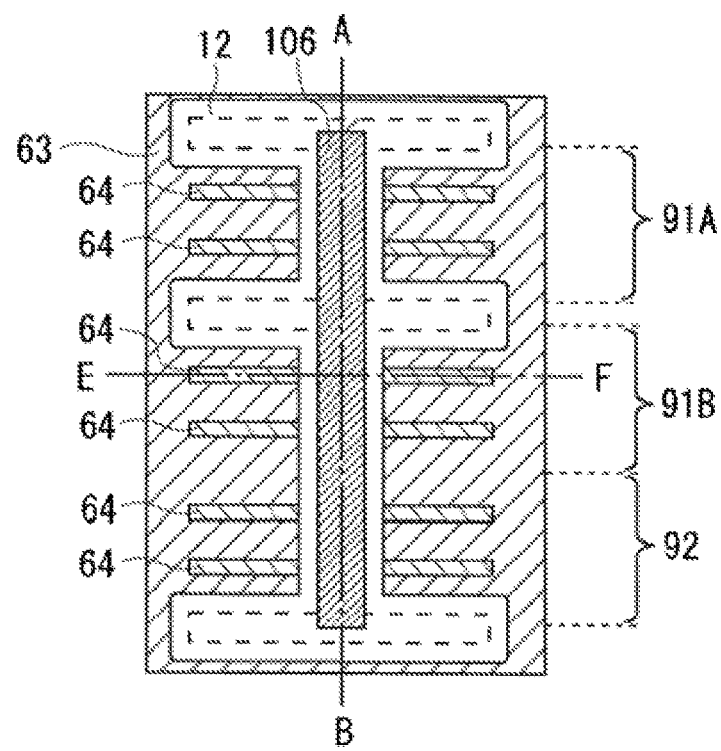
Figure 41B:
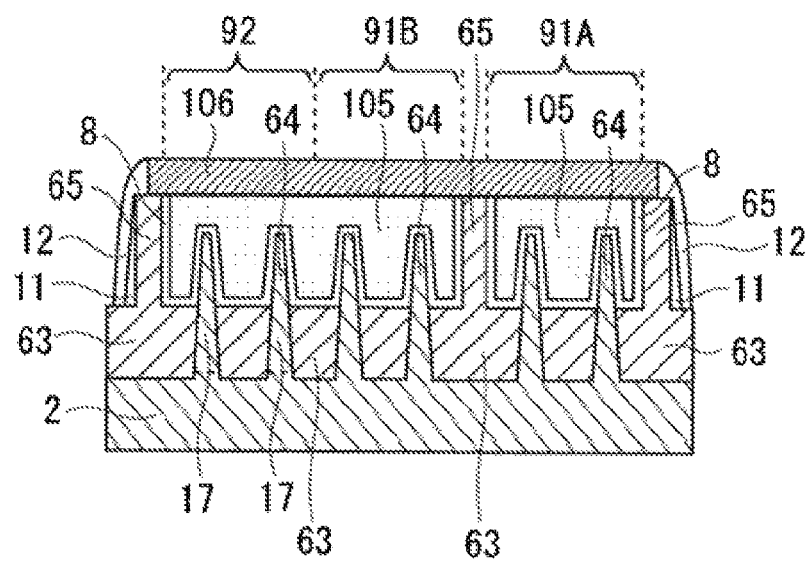
Figure 41C:
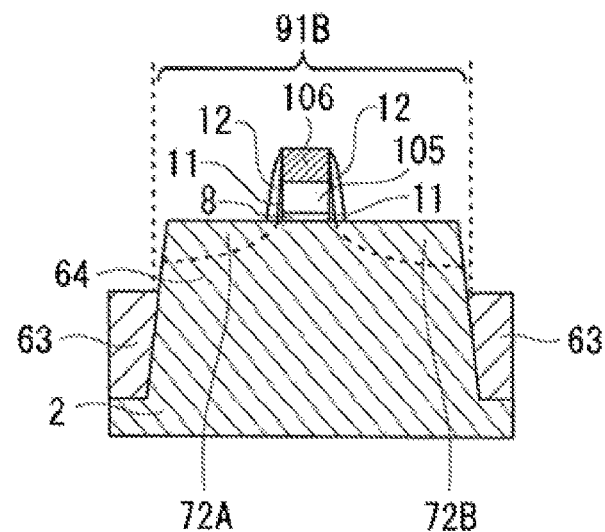

FIG. 41A is a plan view illustrating the method for manufacturing the semiconductor device 1 according to the second embodiment. FIG. 41B is a cross-sectional view illustrating the method for manufacturing the semiconductor device 1 according to the second embodiment and illustrates a cross-section taken along alternate long and short dash line A-B in FIG. 41A. FIG. 41C is a cross-sectional view illustrating the method for manufacturing the semiconductor device 1 according to the second embodiment and illustrates a cross-section taken along alternate long and short dash line E-F in FIG. 41A. In a step illustrated in FIGS. 41A to 41C, a $SiO_2$ film is formed on the semiconductor substrate 2 by, for example, CVD method. A SiN film may be formed instead of the $SiO_2$ film. Etchback is then performed by anisotropic dry etching, such as RIE, thereby forming the second sidewall insulating film 12 at the side surfaces of the dummy gate electrodes 105 in the gate length direction of the dummy gate electrode 105. The second sidewall insulating film 12 is formed at the side surfaces of the dummy gate electrodes 105 in the gate length direction of the dummy gate electrode 105 so as to cover the first sidewall insulating film 11. The second sidewall insulating film 12 is formed at side surfaces of the protruding portions 65 of the element isolation insulating film 63.

Figure 42A:
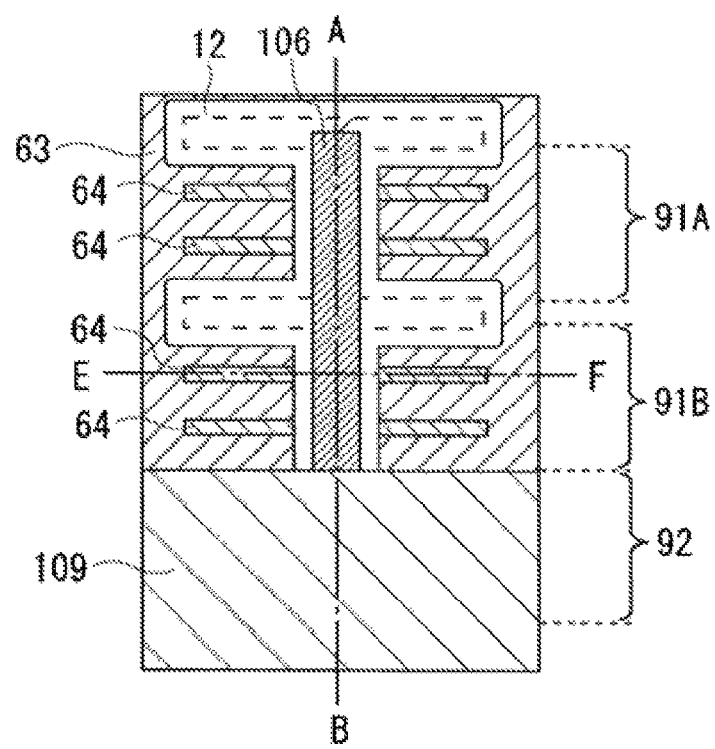
Figure 42B:
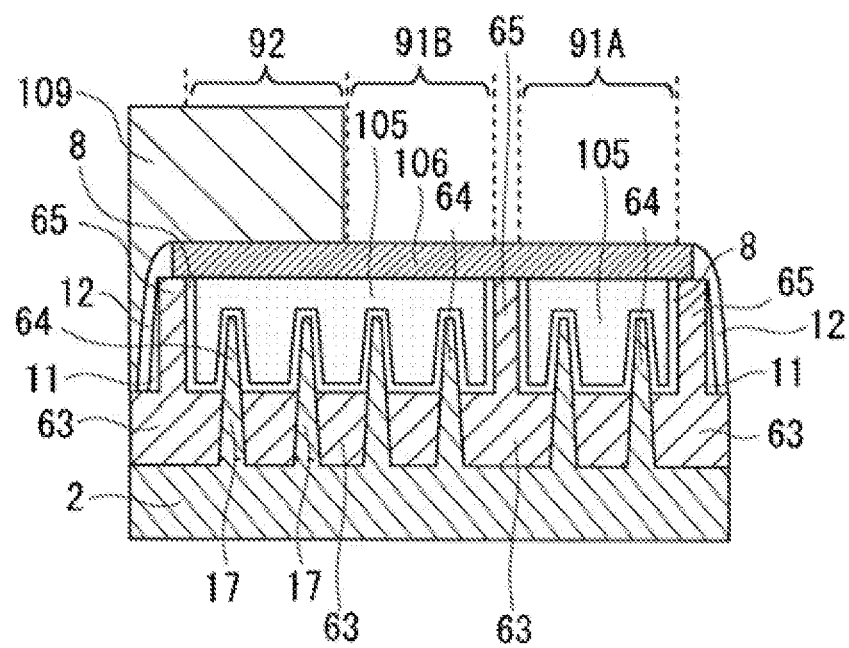
Figure 42C:
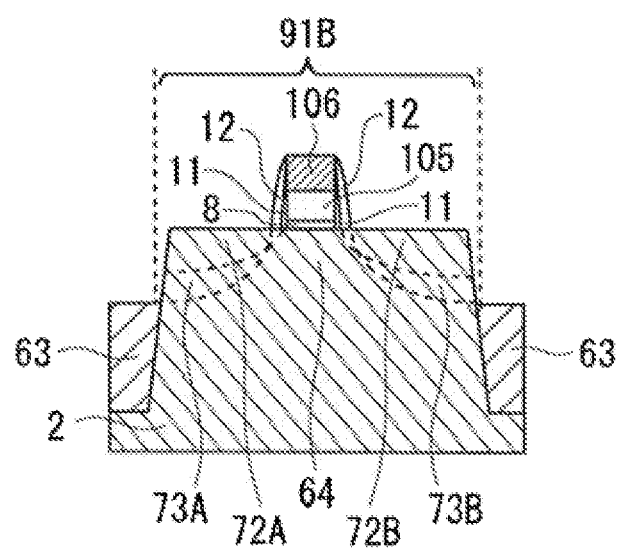

FIG. 42A is a plan view illustrating the method for manufacturing the semiconductor device 1 according to the second embodiment. FIG. 42B is a cross-sectional view illustrating the method for manufacturing the semiconductor device 1 according to the second embodiment and illustrates a cross-section taken along alternate long and short dash line A-B in FIG. 42A. FIG. 42C is a cross-sectional view illustrating the method for manufacturing the semiconductor device 1 according to the second embodiment and illustrates a cross-section taken along alternate long and short dash line E-F in FIG. 42A. In a step illustrated in FIGS. 42A to 42C, a resist pattern 109 which is open in the n-type MOS transistor formation regions 91A and 91B is formed on the semiconductor substrate 2 by photolithography. Impurities are then ion-implanted using the second sidewall insulating film 12 and the resist pattern 109 as a mask, thereby forming the source-drain regions 73A and 73B in the semiconductor substrate 2 in the n-type MOS transistor formation regions 91A and 91B. In this case, for example, n-type impurities, such as phosphorus, are ion-implanted. Since the hard mask 106 is formed on the dummy gate electrodes 105, the impurities are not implanted into the dummy gate electrodes 105. The source-drain regions 73A and 73B are not illustrated in FIGS. 42A and 42B. After that, the resist pattern 109 is removed by wet treatment using a chemical solution, such as a SPM solution, or ashing.

FIG. 43A is a plan view illustrating the method for manufacturing the semiconductor device 1 according to the second embodiment. FIG. 43B is a cross-sectional view illustrating the method for manufacturing the semiconductor device 1 according to the second embodiment and illustrates a cross-section taken along alternate long and short dash line A-B in FIG. 43A. FIG. 43C is a cross-sectional view illustrating the method for manufacturing the semiconductor device 1 according to the second embodiment and illustrates a cross-section taken along alternate long and short dash line G-H in FIG. 43A. In a step illustrated in FIGS. 43A to 43C, a resist pattern 110 which is open in the p-type MOS transistor formation region 92 is formed on the semiconductor substrate 2 by photolithography. Impurities are then ion-implanted using the second sidewall insulating film 12 and the resist pattern 110 as a mask, thereby forming the source-drain regions 83A and 83B in the semiconductor substrate 2 in the p-type MOS transistor formation region 92. In this case, for example, p-type impurities, such as boron, are ion-implanted. Since the hard mask 106 is formed on the dummy gate electrodes 105, the impurities are not implanted into the dummy gate electrodes 105. The source-drain regions 83A and 83B are not illustrated in FIGS. 43A and 43B. After that, the resist pattern 110 is removed by wet treatment using a chemical solution, such as a SPM solution, or ashing. Moreover, heat treatment is performed, thereby activating the impurities implanted in the semiconductor substrate 2.

When the resist pattern 110 is removed by the wet treatment using the chemical solution, the second sidewall insulating film 12 is exposed to the chemical solution. As illustrated in FIGS. 43A to 43C, the protruding portions 65 are provided at the element isolation insulating film 63 so as to cover the side surfaces of the dummy gate electrodes 105 in the gate width direction of the dummy gate electrode 105. For this reason, the side surfaces of the dummy gate electrodes 105 in the gate width direction of the dummy gate electrode 105 and the first sidewall insulating film 11 and second sidewall insulating film 12 are not in contact. This configuration inhibits a chemical solution from infiltrating in the gate width direction of the dummy gate electrode 105 into between the element isolation insulating film 63 and the dummy gate electrode 105 and between the projecting portion 64 of the semiconductor substrate 2 and the dummy gate electrode 105. The gate insulating films 8 are thus inhibited from degrading due to the wet treatment using the chemical solution at the time of the removal of the resist pattern 110.

FIG. 44A is a plan view illustrating the method for manufacturing the semiconductor device 1 according to the second embodiment. FIG. 44B is a cross-sectional view illustrating the method for manufacturing the semiconductor device 1 according to the second embodiment and illustrates a cross-section taken along alternate long and short dash line A-B in FIG. 44A. FIG. 44C is a cross-sectional view illustrating the method for manufacturing the semiconductor device 1 according to the second embodiment and illustrates a cross-section taken along alternate long and short dash line E-F in FIG. 44A. In a step illustrated in FIGS. 44A to 44C, the surface of the semiconductor substrate 2 is cleaned by wet treatment using a chemical solution, such as hydrofluoric acid. A natural oxide formed on the surface of the semiconductor substrate 2 is removed by cleaning the surface of the semiconductor substrate 2. After that, a metal film 111 of, for example, Ni, Ti, Co, or the like is formed on the semiconductor substrate 2 and is subjected to heat treatment. With the heat treatment, the silicides 18 are formed at the surface of the projecting portion 64 of the semiconductor substrate 2 in the n-type MOS transistor formation regions 91A and 91B and the p-type MOS transistor formation region 92.

When the surface of the semiconductor substrate 2 is cleaned by the wet treatment using the chemical solution, the second sidewall insulating film 12 is exposed to the chemical solution. As illustrated in FIGS. 44A to 44C, the protruding portions 65 are provided at the element isolation insulating film 63 so as to cover the side surfaces of the dummy gate electrodes 105 in the gate width direction of the dummy gate electrode 105. For this reason, the side surfaces of the dummy gate electrodes 105 in the gate width direction of the dummy gate electrode 105 and the first sidewall insulating film 11 and second sidewall insulating film 12 are not in contact. This configuration inhibits a chemical solution from infiltrating in the gate width direction of the dummy gate electrode 105 into between the element isolation insulating film 63 and the dummy gate electrode 105 and between the projecting portion 64 of the semiconductor substrate 2 and the dummy gate electrode 105. The gate insulating films 8 are thus inhibited from degrading due to the wet treatment using the chemical solution at the time of the cleaning of the surface of the semiconductor substrate 2.

FIG. 45A is a plan view illustrating the method for manufacturing the semiconductor device 1 according to the second embodiment. FIG. 45B is a cross-sectional view illustrating the method for manufacturing the semiconductor device 1 according to the second embodiment and illustrates a cross-section taken along alternate long and short dash line A-B in FIG. 45A. FIG. 45C is a cross-sectional view illustrating the method for manufacturing the semiconductor device 1 according to the second embodiment and illustrates a cross-section taken along alternate long and short dash line E-F in FIG. 45A. In a step illustrated in FIGS. 45A to 45C, the unreacted metal film 111 is selectively removed by wet treatment using a chemical solution, such as a SPM solution.

When the unreacted metal film 111 is removed by the wet treatment using the chemical solution, the second sidewall insulating film 12 is exposed to the chemical solution. As illustrated in FIGS. 45A to 45C, the protruding portions 65 are provided at the element isolation insulating film 63 so as to cover the side surfaces of the dummy gate electrodes 105 in the gate width direction of the dummy gate electrode 105. For this reason, the side surfaces of the dummy gate electrode 105 in the gate width direction of the dummy gate electrode 105 and the first sidewall insulating film 11 and second sidewall insulating film 12 are not in contact. This configuration inhibits a chemical solution from infiltrating in the gate width direction of the dummy gate electrode 105 into between the element isolation insulating film 63 and the dummy gate electrode 105 and between the projecting portion 64 of the semiconductor substrate 2 and the dummy gate electrode 105. The gate insulating films 8 are thus inhibited from degrading due to the wet treatment using the chemical solution at the time of the removal of the unreacted metal film 111.

FIG. 46A is a plan view illustrating the method for manufacturing the semiconductor device 1 according to the second embodiment. FIG. 46B is a cross-sectional view illustrating the method for manufacturing the semiconductor device 1 according to the second embodiment and illustrates a cross-section taken along alternate long and short dash line A-B in FIG. 46A. FIG. 46C is a cross-sectional view illustrating the method for manufacturing the semiconductor device 1 according to the second embodiment and illustrates a cross-section taken along alternate long and short dash line E-F in FIG. 46A. In a step illustrated in FIGS. 46A to 46C, the interlayer insulating film 6A is formed on the semiconductor substrate 2 by, for example, CVD method. The interlayer insulating film 6A is formed on the semiconductor substrate 2 so as to surround the dummy gate electrodes 105. After that, the interlayer insulating film 6A is polished by CMP, and the hard mask 106 is removed, thereby exposing the protruding portions 65 of the element isolation insulating film 63 and the dummy gate electrodes 105 from the interlayer insulating film 6A.

FIG. 47A is a plan view illustrating the method for manufacturing the semiconductor device 1 according to the second embodiment. FIG. 47B is a cross-sectional view illustrating the method for manufacturing the semiconductor device 1 according to the second embodiment and illustrates a cross-section taken along alternate long and short dash line A-B in FIG. 47A. FIG. 47C is a cross-sectional view illustrating the method for manufacturing the semiconductor device 1 according to the second embodiment and illustrates a cross-section taken along alternate long and short dash line E-F in FIG. 47A. In a step illustrated in FIGS. 47A to 47C, a hard mask 112 is formed on the interlayer insulating film 6A. The hard mask 112 is, for example, a SiN film or a laminated film of a SiN film and a $SiO_2$ film. A resist pattern is then formed on the hard mask 112 by photolithography. After that, the hard mask 112 is patterned by performing anisotropic dry etching, such as RIE, using the resist pattern on the hard mask 112 as a mask. With the patterning, the hard mask 112 that is open in the p-type MOS transistor formation region 92 is formed on the interlayer insulating film 6A. The hard mask 112 covers the dummy gate electrodes 105 in the n-type MOS transistor formation regions 91A and 91B. For example, $CF_4$ gas, $C_4F_8$ gas, $CHF_3$ gas, or the like is used as an etching gas.

FIG. 48A is a plan view illustrating the method for manufacturing the semiconductor device 1 according to the second embodiment. FIG. 48B is a cross-sectional view illustrating the method for manufacturing the semiconductor device 1 according to the second embodiment and illustrates a cross-section taken along alternate long and short dash line A-B in FIG. 48A. FIG. 48C is a cross-sectional view illustrating the method for manufacturing the semiconductor device 1 according to the second embodiment and illustrates a cross-section taken along alternate long and short dash line G-H in FIG. 48A. In a step illustrated in FIGS. 48A to 48C, a portion of the dummy gate electrode 105 which is exposed from the hard mask 112 is removed by performing anisotropic dry etching, such as RIE, using the hard mask 112 as a mask. That is, the dummy gate electrode 105 in the p-type MOS transistor formation region 92 is removed. In this case, the dummy gate electrode 105 alone is selectively removed due to a difference in etch selectivity (etching rates) between the gate insulating film 8 and the dummy gate electrode 105. For example, $Cl_2$ gas, $Br_2$ gas, HBr gas, or the like is used as an etching gas. Wet etching using TMAH may be performed together with the anisotropic dry etching.

Since the etch selectivity of the gate insulating film 8 is different from the etch selectivity of the dummy gate electrode 105, the gate insulating film 8 is not removed by the anisotropic etching performed at the time of the removal of the dummy gate electrode 105. However, when the gate insulating film 8 formed on the projecting portions 64 has been damaged by wet treatment using a chemical solution, the anisotropic dry etching may cause the gate insulating film 8 in the p-type MOS transistor formation region 92 to be penetrated. When the anisotropic dry etching causes the gate insulating film 8 to be penetrated, the projecting portion 64 of the semiconductor substrate 2 in the p-type MOS transistor formation region 92 is shaved off, which degrades characteristics of the p-type MOS transistor 62. In the second embodiment, the gate insulating films 8 are inhibited from degrading due to wet treatment using a chemical solution. For this reason, when the dummy gate electrode 105 is removed, the anisotropic dry etching is inhibited from causing the gate insulating film 8 in the p-type MOS transistor formation region 92 to be penetrated.

FIG. 49A is a plan view illustrating the method for manufacturing the semiconductor device 1 according to the second embodiment. FIG. 49B is a cross-sectional view illustrating the method for manufacturing the semiconductor device 1 according to the second embodiment and illustrates a cross-section taken along alternate long and short dash line A-B in FIG. 49A. FIG. 49C is a cross-sectional view illustrating the method for manufacturing the semiconductor device 1 according to the second embodiment and illustrates a cross-section taken along alternate long and short dash line G-H in FIG. 49A. In a step illustrated in FIGS. 49A to 49C, a metal film of, e.g., TiN, TaN, W, or the like is formed on the interlayer insulating film 6A and the hard mask 112 by, for example, sputtering method. In this case, a portion, from which the dummy gate electrode 105 has been removed, in the p-type MOS transistor formation region 92 is filled up with the metal film. After that, the metal film is planarized by CMP, and the hard mask 112 is removed. With the operation, the gate electrode 81 is formed on the gate insulating film 8 in the p-type MOS transistor formation region 92. The gate electrode 81 is formed on the gate insulating film 8 so as to straddle the projecting portions 64 of the semiconductor substrate 2. When a metal film is used as the material for the gate electrode 81, the gate electrode 81 is also referred to as a metal gate electrode.

FIG. 50A is a plan view illustrating the method for manufacturing the semiconductor device 1 according to the second embodiment. FIG. 50B is a cross-sectional view illustrating the method for manufacturing the semiconductor device 1 according to the second embodiment and illustrates a cross-section taken along alternate long and short dash line A-B in FIG. 50A. FIG. 50C is a cross-sectional view illustrating the method for manufacturing the semiconductor device 1 according to the second embodiment and illustrates a cross-section taken along alternate long and short dash line E-F in FIG. 50A. In a step illustrated in FIGS. 50A to 50C, a hard mask 113 is formed on the interlayer insulating film 6A. The hard mask 113 is, for example, a SiN film or a laminated film of a SiN film and a SiO$_2$ film. A resist pattern is then formed on the hard mask 113 by photolithography. After that, the hard mask 113 is patterned by performing anisotropic dry etching, such as RIE, using the resist pattern on the hard mask 113 as a mask. With the patterning, the hard mask 113 that is open in the n-type MOS transistor formation regions 91A and 91B is formed on the interlayer insulating film 6A. The hard mask 113 covers the gate electrode 81 in the p-type MOS transistor formation region 92. For example, CF$_4$ gas, C$_4$F$_8$ gas, CHF$_3$ gas, or the like is used as an etching gas.

FIG. 51A is a plan view illustrating the method for manufacturing the semiconductor device 1 according to the second embodiment. FIG. 51B is a cross-sectional view illustrating the method for manufacturing the semiconductor device 1 according to the second embodiment and illustrates a cross-section taken along alternate long and short dash line A-B in FIG. 51A. FIG. 51C is a cross-sectional view illustrating the method for manufacturing the semiconductor device 1 according to the second embodiment and illustrates a cross-section taken along alternate long and short dash line E-F in FIG. 51A. In a step illustrated in FIGS. 51A to 51C, the dummy gate electrodes 105 that are exposed from the hard mask 113 are removed by performing anisotropic dry etching, such as RIE, using the hard mask 113 as a mask. That is, the dummy gate electrodes 105 in the n-type MOS transistor formation regions 91A and 91B are removed. In this case, the dummy gate electrodes 105 alone are selectively removed due to a difference in etch selectivity between the gate insulating film 8 and the dummy gate electrodes 105. For example, Cl$_2$ ga$_s$, Br$_2$ gas, HBr gas, or the like is used as an etching gas. Wet etching using TMAH may be performed together with the anisotropic dry etching.

Since the etch selectivity of the gate insulating film 8 is different from the etch selectivity of the dummy gate electrode 105, the gate insulating films 8 are not removed by the anisotropic etching performed at the time of the removal of the dummy gate electrodes 105. However, when the gate insulating films 8 on the projecting portions 64 have been damaged by wet treatment using a chemical solution, the anisotropic dry etching may cause the gate insulating films 8 in the n-type MOS transistor formation regions 91A and 91B to be penetrated. When the etching causes the gate insulating films 8 to be penetrated, the projecting portions 64 of the semiconductor substrate 2 in the n-type MOS transistor formation regions 91A and 91B are shaved off, which degrades characteristics of the n-type MOS transistors 61A and 61B. In the second embodiment, the gate insulating films 8 are inhibited from degrading due to wet treatment using a chemical solution. For this reason, when the dummy gate electrodes 105 are removed, the anisotropic dry etching is inhibited from causing the gate insulating films 8 in the n-type MOS transistor formation regions 91A and 91B to be penetrated.

FIG. 52A is a plan view illustrating the method for manufacturing the semiconductor device 1 according to the second embodiment. FIG. 52B is a cross-sectional view illustrating the method for manufacturing the semiconductor device 1 according to the second embodiment and illustrates a cross-section taken along alternate long and short dash line A-B in FIG. 52A. FIG. 52C is a cross-sectional view illustrating the method for manufacturing the semiconductor device 1 according to the second embodiment and illustrates a cross-section taken along alternate long and short dash line G-H in FIG. 52A. In a step illustrated in FIGS. 52A to 52C, a metal film of, e.g., TiN, TaN, W, or the like is formed on the interlayer insulating film 6A and the hard mask 113 by, for example, sputtering method. In this case, portions, from which the dummy gate electrodes 105 have been removed, in the n-type MOS transistor formation regions 91A and 91B are filled up with the metal film. After that, the metal film is planarized by CMP, and the hard mask 113 is removed. With the operation, the gate electrode 71A is formed on the gate insulating film 8 in the n-type MOS transistor formation region 91A, and the gate electrode 71B is formed on the gate insulating film 8 in the n-type MOS transistor formation region 91B. The gate electrodes 71A and 71B are formed on the gate insulating films 8 so as to straddle the projecting portions 64 of the semiconductor substrate 2. When a metal film is used as the materials for the gate electrodes 71A and 71B, the gate electrodes 71A and 71B are also referred to as metal gate electrodes.

When the protruding portions 65 are not provided at the element isolation insulating film 63, portions of the first sidewall insulating film 11 and the second sidewall insulating film 12 may disappear at the time of the wet treatment using a chemical solution. In this case, side surfaces of the dummy gate electrodes 105 in the gate width direction of the dummy gate electrode 105 may be exposed, and the side surfaces of the dummy gate electrodes 105 in the gate width direction of the dummy gate electrode 105 may be silicided at the time of the silicide formation at the surface of the semiconductor substrate 2. For this reason, silicided portions of the dummy gate electrode 105 survive in the steps of removing the dummy gate electrodes 105. The survival of the silicided portions of the dummy gate electrodes 105 causes a failure in filling up with the metal films at the time of the formation of the gate electrodes 71A, 71B, and 81. Additionally, the survival of the silicided portions of the dummy gate electrodes 105 disables formation of the gate electrodes 71A, 71B, and 81 with desired work functions. Since the protruding portions 65 are provided at the element isolation insulating film 63 in the second embodiment, side surfaces of the dummy gate electrodes 105 in the gate width direction of the dummy gate electrode 105 are inhibited from being exposed in wet treatment using a chemical solution. This inhibits the side surfaces of the dummy gate electrodes 105 from being silicided at the time of the silicide formation at the surface of the semiconductor substrate 2.

FIG. 53A is a plan view illustrating the method for manufacturing the semiconductor device 1 according to the second embodiment. FIG. 53B is a cross-sectional view illustrating the method for manufacturing the semiconductor device 1 according to the second embodiment and illustrates a cross-section taken along alternate long and short dash line A-B in FIG. 53A. FIG. 53C is a cross-sectional view illustrating the method for manufacturing the semiconductor device 1 according to the second embodiment and illustrates a cross-section taken along alternate long and short dash line E-F in FIG. 53A. In a step illustrated in FIGS. 53A to 53C, the interlayer insulating film 6B is formed on the interlayer insulating film 6A by, for example, CVD method. The interlayer insulating film 6B is then planarized by CMP.

FIG. 54A is a plan view illustrating the method for manufacturing the semiconductor device 1 according to the second embodiment. FIG. 54B is a cross-sectional view illustrating the method for manufacturing the semiconductor device 1 according to the second embodiment and illustrates a cross-section taken along alternate long and short dash line A-B in FIG. 54A. FIG. 54C is a cross-sectional view illustrating the method for manufacturing the semiconductor device 1 according to the second embodiment and illustrates a cross-section taken along alternate long and short dash line E-F in FIG. 54A. In a step illustrated in FIGS. 54A to 54C, a resist pattern is formed on the interlayer insulating film 6B by photolithography using a photoresist mask having a pattern of openings in contact regions. Contact holes are then formed in the interlayer insulating film 6B by performing anisotropic etching, such as RIE, using the resist pattern on the interlayer insulating film 6B as a mask. After that, the resist pattern on the interlayer insulating film 6B is removed by wet treatment using a chemical solution or ashing. Moreover, a metal film of, e.g., TiN, TaN, W, or the like is formed in the contact holes formed in the interlayer insulating film 6B by, for example, CVD method. Furthermore, an excess metal film on the interlayer insulating film 6B is removed by CMP, thereby forming the contact plugs 7 in the interlayer insulating film 6B.

<First Modification>

The first embodiment has illustrated an example where the gate electrodes 9A, 9B, and 10 are formed on the gate insulating films 8. The first embodiment is not limited to this example. In the first embodiment, after the gate insulating films 8 are removed by etching, the gate insulating films 8 may be formed again, and the gate electrodes 9A, 9B, and 10 may be formed on the gate insulating films 8 formed again. The second embodiment has illustrated an example where the gate electrodes 71A, 71B, and 81 are formed on the gate insulating films 8. The second embodiment is not limited to this example. In the second embodiment, after the gate insulating films 8 are removed by etching, the gate insulating films 8 may be formed again, and the gate electrodes 71A, 71B, and 81 may be formed on the gate insulating films 8 formed again.

<Second Modification>

The first embodiment has illustrated an example where metal films are used as the materials for the gate electrodes 9A, 9B, and 10. The first embodiment is not limited to this example. Polysilicon may be used as the materials for the gate electrodes 9A, 9B, and 10, and the steps illustrated in the first embodiment may be modified in the manner below. In the step illustrated in FIGS. 10A to 10C, after the gate insulating films 8 and the dummy gate electrodes 45 are patterned, the hard mask 46 is removed. Both in the step illustrated in FIGS. 12A to 12C and in the step illustrated in FIGS. 15A to 15C, impurities are ion-implanted into the dummy gate electrodes 45 in the n-type MOS transistor formation regions 21A and 21B. The dummy gate electrode 45 in the n-type MOS transistor formation region 21A is used as the gate electrode 9A, and the dummy gate electrode 45 in the n-type MOS transistor formation region 21B is used as the gate electrode 9B. Both in the step illustrated in FIGS. 13A to 13C and in the step illustrated in FIGS. 16A to 16C, impurities are ion-implanted into the dummy gate electrode 45 in the p-type MOS transistor formation region 22. The dummy gate electrode 45 in the p-type MOS transistor formation region 22 is used as the gate electrode 10. Since the dummy gate electrodes 45 are used as the gate electrodes 9A, 9B, and 10, the steps illustrated in FIGS. 20A to 25C are not performed.

The second embodiment has illustrated an example where metal films are used as the materials for the gate electrodes 71A, 71B, and 81. The second embodiment is not limited to this example. Polysilicon may be used as the materials for the gate electrodes 71A, 71B, and 81, and the steps illustrated in the second embodiment may be modified in the manner below. In the step illustrated in FIGS. 37A to 37C, after the gate insulating films 8 and the dummy gate electrodes 105 are patterned, the hard mask 106 is removed. Both in the step illustrated in FIGS. 39A to 39C and in the step illustrated in FIGS. 42A to 42C, impurities are ion-implanted into the dummy gate electrodes 105 in the n-type MOS transistor formation regions 91A and 91B. The dummy gate electrode 105 in the n-type MOS transistor formation region 91A is used as the gate electrode 71A, and the dummy gate electrode 105 in the n-type MOS transistor formation region 91B is used as the gate electrode 71B. Both in the step illustrated in FIGS. 40A to 40C and in the step illustrated in FIGS. 43A to 43C, impurities are ion-implanted into the dummy gate electrode 105 in the p-type MOS transistor formation region 92. The dummy gate electrode 105 in the p-type MOS transistor formation region 92 is used as the gate electrode 81. Since the dummy gate electrodes 105 are used as the gate electrodes 71A, 71B, and 81, the steps illustrated in FIGS. 47A to 52C are not performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A method for manufacturing a semiconductor device, comprising:
   forming, on a substrate, an element isolation insulating film which includes a protruding portion protruding above a level of a surface of the substrate;
   forming a first film on the substrate and on the element isolation insulating film;
   polishing the first film to expose the protruding portion;
   forming a first resist pattern which straddles the first film and the protruding portion after polishing the first film;
   patterning the first film using the first resist pattern as a mask to form a first pattern; and
   forming a sidewall film at side surfaces of the first pattern.

2. The method for manufacturing the semiconductor device according to claim 1, comprising:
   forming a second resist pattern on the substrate after forming the sidewall film;
   implanting impurities into the substrate using the first pattern, the sidewall film, and the second resist pattern as a mask; and removing the second resist pattern by chemical solution treatment.

3. The method for manufacturing the semiconductor device according to claim 2, comprising:
   forming a metal film on the substrate after removing the second resist pattern;
   performing heat treatment to form a silicide in the substrate; and
   removing the unreacted metal film on the substrate by chemical solution treatment.

4. The method for manufacturing the semiconductor device according to claim 3, comprising
   cleaning the substrate before forming the metal film on the substrate.

5. The method for manufacturing the semiconductor device according to claim 2, comprising:
   forming a first insulating film on the substrate after implanting the impurities;
   polishing the first insulating film to expose the first pattern;
   removing the first pattern after polishing the first insulating film;
   forming a metal film on the first insulating film after removing the first pattern; and
   polishing the metal film to expose the first insulating film.

6. The method for manufacturing the semiconductor device according to claim 1, wherein
   the forming the element isolation insulating film including the protruding portion comprises:
   forming a trench in the substrate;
   forming a second insulating film in the trench;
   polishing the second insulating film;
   forming a third resist pattern on the second insulating film after polishing the second insulating film; and
   etching the second insulating film using the third resist pattern as a mask to make an upper surface of the second insulating film in a region not covered with the third resist pattern lower than the surface of the substrate.

* * * * *